(12) United States Patent
Ochi et al.

(10) Patent No.: US 9,601,210 B2
(45) Date of Patent: Mar. 21, 2017

(54) SEMICONDUCTOR MEMORY DEVICE AND MEMORY SYSTEM

(71) Applicant: KABUSHIKI KAISHA TOSHIBA, Tokyo (JP)

(72) Inventors: Yusuke Ochi, Yokohama Kanagawa (JP); Masanobu Shirakawa, Chigasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/053,939

(22) Filed: Feb. 25, 2016

(65) Prior Publication Data

US 2016/0254059 A1 Sep. 1, 2016

(30) Foreign Application Priority Data

Feb. 26, 2015 (JP) .................. 2015-037230

(51) Int. Cl.

| | |
|---|---|
| *G11C 16/04* | (2006.01) |
| *G11C 16/26* | (2006.01) |
| *G11C 16/34* | (2006.01) |
| *G11C 8/14* | (2006.01) |
| *G06F 11/10* | (2006.01) |
| *G11C 29/52* | (2006.01) |
| *G11C 29/04* | (2006.01) |

(52) U.S. Cl.
CPC .......... *G11C 16/26* (2013.01); *G06F 11/1048* (2013.01); *G11C 8/14* (2013.01); *G11C 16/3459* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 5,963,488 A | 10/1999 | Inoue | |
| 2003/0041299 A1 | 2/2003 | Kanazawa et al. | |
| 2014/0056055 A1* | 2/2014 | Ikeda ..................... | G11C 13/00 365/148 |
| 2015/0003157 A1* | 1/2015 | Aritome ............. | G11C 16/0408 365/185.11 |
| 2016/0019969 A1* | 1/2016 | Lim ....................... | G11C 16/20 365/185.12 |

FOREIGN PATENT DOCUMENTS

JP 2014006951 A 1/2014

* cited by examiner

*Primary Examiner* — Son Dinh
*Assistant Examiner* — Uyen B Tran
(74) *Attorney, Agent, or Firm* — Patterson & Sheridan, LLP

(57) ABSTRACT

A semiconductor memory device includes a first stack of memory cells above a substrate, the first stack including a first memory cell and a second memory cell above the first memory cell, a second stack of memory cells above the substrate, the second stack including a third memory cell, a word line connected to the first, second, and third memory cells, and a controller configured to output data stored in the first memory cell and data stored in the third memory cell during a first cycle, and output data stored in the second memory cell during a second cycle that is different from the first cycle.

15 Claims, 45 Drawing Sheets

FIG. 14

| | NORMAL DATA | | | | ECC DATA | | | |
|---|---|---|---|---|---|---|---|---|
| | 1Kbit | 1Kbit | 1Kbit | 1Kbit | 128bit | 128bit | 128bit | 128bit |
| page | Zone0 | Zone1 | Zone2 | Zone3 | 0TH ECC | 1ST ECC | 2ND ECC | 3RD ECC |
| CORRESPONDING CSL | CSL(4n+0) | CSL(4n+1) | CSL(4n+2) | CSL(4n+3) | CSL(4n+0) | CSL(4n+1) | CSL(4n+2) | CSL(4n+3) |
| CORRESPONDING SR | SR0 or SR1 1ST LAYER | SR2 or SR3 2ND LAYER | SR4 or SR5 3RD LAYER | SR6 or SR7 4TH LAYER | SR0 or SR1 | SR2 or SR3 | SR4 or SR5 | SR6 or SR7 |

FIG. 16

| DATA OUTPUT ORDER | Zone | CSL | SAU ||||||||
|---|---|---|---|---|---|---|---|---|---|---|
| | | | IO(0) | IO(1) | IO(2) | IO(3) | IO(4) | IO(5) | IO(6) | IO(7) |
| 1 | 0 | 0 | 0 | 4 | 8 | 12 | 16 | 20 | 24 | 28 |
| 2 | | 4 | 32 | 36 | 40 | 44 | 48 | 52 | 56 | 60 |
| ⋮ | | ⋮ | ⋮ | ⋮ | ⋮ | ⋮ | ⋮ | ⋮ | ⋮ | ⋮ |
| n | | 4n+0 | 32n | 32n+4 | 32n+8 | 32n+12 | 32n+16 | 32n+20 | 32n+24 | 32n+28 |
| n+1 | 1 | 1 | 1 | 5 | 9 | 13 | 17 | 21 | 25 | 29 |
| n+2 | | 5 | 33 | 37 | 41 | 45 | 49 | 53 | 57 | 61 |
| ⋮ | | ⋮ | ⋮ | ⋮ | ⋮ | ⋮ | ⋮ | ⋮ | ⋮ | ⋮ |
| 2n | | 4n+1 | 32n+1 | 32n+5 | 32n+9 | 32n+13 | 32n+17 | 32n+21 | 32n+25 | 32n+29 |
| 2n+1 | 2 | 2 | 2 | 6 | 10 | 14 | 18 | 22 | 26 | 30 |
| 2n+2 | | 6 | 34 | 38 | 42 | 46 | 50 | 54 | 58 | 62 |
| ⋮ | | ⋮ | ⋮ | ⋮ | ⋮ | ⋮ | ⋮ | ⋮ | ⋮ | ⋮ |
| 3n | | 4n+2 | 32n+2 | 32n+6 | 32n+10 | 32n+14 | 32n+18 | 32n+22 | 32n+26 | 32n+30 |
| 3n+1 | 3 | 3 | 3 | 7 | 11 | 15 | 19 | 23 | 27 | 31 |
| 3n+2 | | 7 | 35 | 39 | 43 | 47 | 51 | 55 | 59 | 63 |
| ⋮ | | ⋮ | ⋮ | ⋮ | ⋮ | ⋮ | ⋮ | ⋮ | ⋮ | ⋮ |
| 4n | | 4n+3 | 32n+3 | 32n+7 | 32n+11 | 32n+15 | 32n+19 | 32n+23 | 32n+27 | 32n+31 |

FIG. 18
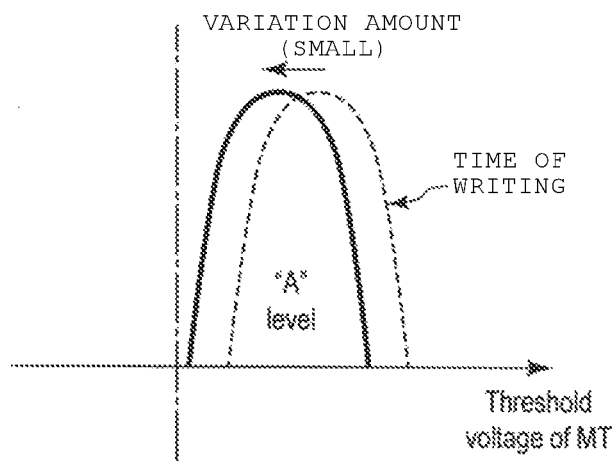
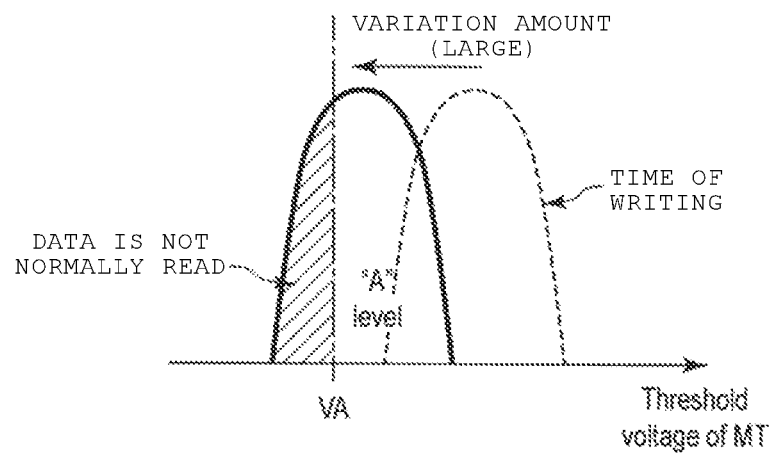

CASE IN WHICH ZONES AND LAYERS DO NOT CORRESPOND

| Zone | 0 | | | | | | | | | | | | | | | | 1 | 2 | 3 |
|---|---|---|---|---|---|---|---|---|---|---|---|---|---|---|---|---|---|---|---|
| I/O | 0 | 1 | 2 | 3 | 4 | 5 | 6 | 7 | 0 | 1 | 2 | 3 | 4 | 5 | 6 | 7 | ... | ... | ... |
| SAU | 0 | 1 | 2 | 3 | 4 | 5 | 6 | 7 | 8 | 9 | 10 | 11 | 12 | 13 | 14 | 15 | ... | ... | ... |
| LAYERS | 1 | 2 | 3 | 4 | 1 | 2 | 3 | 4 | 1 | 2 | 3 | 4 | 1 | 2 | 3 | 4 | ... | ... | ... |
| DETERMINATION | × | ○ | ○ | ○ | × | ○ | ○ | ○ | × | ○ | ○ | ○ | × | ○ | ○ | ○ | ... | ... | ... |

FAILURE BITS OCCUR PERIODICALLY IN I/O[0] AND I/O[4]
CORRESPONDING TO 1ST LAYER IN ALL ZONES (b)

CASE IN WHICH ZONES AND LAYERS CORRESPOND

| Zone | 0 | 1 | 2 | 3 | 0 | 1 | 2 | 3 | 0 | 1 | 2 | 3 | 0 | 1 | 2 | 3 | 0 | 1 | 2 | ... |
|---|---|---|---|---|---|---|---|---|---|---|---|---|---|---|---|---|---|---|---|---|
| I/O | 0 | 0 | 0 | 0 | 1 | 1 | 1 | 1 | 2 | 2 | 2 | 2 | 3 | 3 | 3 | 3 | 4 | 4 | 4 | ... |
| SAU | 0 | 1 | 2 | 3 | 4 | 5 | 6 | 7 | 8 | 9 | 10 | 11 | 12 | 13 | 14 | 15 | 16 | 17 | 18 | ... |
| LAYERS | 1 | 2 | 3 | 4 | 1 | 2 | 3 | 4 | 1 | 2 | 3 | 4 | 1 | 2 | 3 | 4 | 1 | 2 | 3 | ... |
| DETERMINATION | × | ○ | ○ | ○ | × | ○ | ○ | ○ | × | ○ | ○ | ○ | × | ○ | ○ | ○ | × | ○ | ○ | ... |

FAILURE BITS ARE CONCENTRATED IN ZONE 0
CORRESPONDING TO 1ST LAYER

FIG. 20

| NUMBER OF RETRIES | "A" level | | "B" level | | "C" level | |
|---|---|---|---|---|---|---|
| | BLe | BLo | BLe | BLo | BLe | BLo |
| 1 | Vs_AE_1 | Vs_AO_1 | Vs_BE_1 | Vs_BO_1 | Vs_CE_1 | Vs_CO_1 |
| 2 | Vs_AE_2 | Vs_AO_2 | Vs_BE_2 | Vs_BO_2 | Vs_CE_2 | Vs_CO_2 |
| 3 | Vs_AE_3 | Vs_AO_3 | Vs_BE_3 | Vs_BO_3 | Vs_CE_3 | Vs_CO_3 |
| 4 | Vs_AE_4 | Vs_AO_4 | Vs_BE_4 | Vs_BO_4 | Vs_CE_4 | Vs_CO_4 |
| ⋮ | ⋮ | ⋮ | ⋮ | ⋮ | ⋮ | ⋮ |
| L | Vs_AE_L | Vs_AO_L | Vs_BE_L | Vs_BO_L | Vs_CE_L | Vs_CO_L |

FIG. 29

(a) FLOW OF ECC PROCESS AT TIME OF NORMAL READING

| step | SYNDROME CALCULATION UNIT | ERROR LOCATION POLYNOMIAL CALCULATION UNIT | CHAIN SEARCH UNIT | ERROR DETECTION CODE DECODER | MEMORY |
|---|---|---|---|---|---|
| 1 | Zone0 | | | | |
| 2 | Zone1 | Zone0 | | | |
| 3 | Zone2 | Zone1 | Zone0 | | |
| 4 | Zone3 | Zone2 | Zone1 | Zone0 | |
| 5 | | Zone3 | Zone2 | Zone1 | Zone0 |
| 6 | | | Zone3 | Zone2 | Zone0,1 |
| 7 | | | | Zone3 | Zone0~2 |
| 8 | | | | | Zone0~3 |

(b) RESULT OF ECC PROCESS FOR EACH ZONE

| Zone | ECC |
|---|---|
| 0 | 1(Fail) |
| 1 | 1(Fail) |
| 2 | 0(Pass) |
| 3 | 0(Pass) |

FIG. 30

(a) FLOW OF ECC PROCESS AT TIME OF SHIFT READING (1ST)

| step | SYNDROME CALCULATION UNIT | ERROR LOCATION POLYNOMIAL CALCULATION UNIT | CHAIN SEARCH UNIT | ERROR DETECTION CODE DECODER | MEMORY |
|---|---|---|---|---|---|
| 1 | Zone0 | | | | Zone2,3 |
| 2 | Zone1 | Zone0 | | | Zone2,3 |
| 3 | | Zone1 | Zone0 | | Zone2,3 |
| 4 | | | Zone1 | Zone0 | Zone2,3 |
| 5 | | | | Zone1 | Zone0,2,3 |
| 6 | | | | | Zone0~3 |

RESULTS OF NORMAL READING ARE RETAINED FOR ZONE 2 AND ZONE 3

(b) RESULT OF ECC PROCESS FOR EACH ZONE

| Zone | ECC |
|---|---|
| 0 | 1(Fail) |
| 1 | 1(Pass) |
| 2 | (NON-TARGET) |
| 3 | (NON-TARGET) |

FLOW OF ECC PROCESS AT TIME OF SHIFT READING (2ND)

| step | SYNDROME CALCULATION UNIT | ERROR LOCATION POLYNOMIAL CALCULATION UNIT | CHAIN SEARCH UNIT | ERROR DETECTION CODE DECODER | MEMORY |
|---|---|---|---|---|---|
| 1 | Zone0 | | | | Zone1~3 |
| 2 | | Zone0 | | | Zone1~3 |
| 3 | | | Zone0 | | Zone1~3 |
| 4 | | | | Zone0 | Zone1~3 |
| 5 | | | | | Zone0~3 |

RESULTS UP TO PREVIOUS TIME ARE RETAINED FOR ZONE 1 TO ZONE 3

(b)

RESULT OF ECC PROCESS FOR EACH ZONE

| Zone | ECC |
|---|---|
| 0 | 1(Pass) |
| 1 | (NON-TARGET) |
| 2 | (NON-TARGET) |
| 3 | (NON-TARGET) |

FIG. 36

| 1 | Zone0 | Zone1 | Zone2 | Zone3 |
|---|---|---|---|---|
| SP | 0 | 2 | 1 | 3 |
| SPG | 1 | 2 | 2 | 1 |
| CSL | 4n | 4n+1 | 4n+2 | 4n+3 |
| IO(0) | XDL(32n) | XDL(32n+1) | XDL(32n+2) | XDL(32n+3) |
| IO(1) | XDL(32n+4) | XDL(32n+5) | XDL(32n+6) | XDL(32n+7) |
| IO(2) | XDL(32n+8) | XDL(32n+9) | XDL(32n+10) | XDL(32n+11) |
| IO(3) | XDL(32n+12) | XDL(32n+13) | XDL(32n+14) | XDL(32n+15) |
| IO(4) | XDL(32n+16) | XDL(32n+17) | XDL(32n+18) | XDL(32n+19) |
| IO(5) | XDL(32n+20) | XDL(32n+21) | XDL(32n+22) | XDL(32n+23) |
| IO(6) | XDL(32n+24) | XDL(32n+25) | XDL(32n+26) | XDL(32n+27) |
| IO(7) | XDL(32n+28) | XDL(32n+29) | XDL(32n+30) | XDL(32n+31) |

FIG. 38

| Zone | 0 | 3 | 2 | 1 | 2 | 1 | 0 | 3 | 2 | 1 | 0 | 3 | 2 | 1 | 0 | 3 | 2 | 1 | 0 | 3 | ... |
|---|---|---|---|---|---|---|---|---|---|---|---|---|---|---|---|---|---|---|---|---|---|
| I/O | 0 | 0 | 0 | 0 | 1 | 1 | 1 | 1 | 2 | 2 | 2 | 2 | 3 | 3 | 3 | 3 | 4 | 4 | 4 | 4 | ... |
| SAU | 0 | 3 | 2 | 1 | 5 | 5 | 6 | 7 | 8 | 9 | 10 | 11 | 12 | 13 | 14 | 15 | 16 | 17 | 18 | ... |
| BL | 0 | 3 | 2 | 1 | 5 | 5 | 6 | 7 | 8 | 9 | 10 | 11 | 12 | 13 | 14 | 15 | 16 | 17 | 18 | ... |
| SP | 0 | 3 | 0 | 2 | 2 | 1 | 3 | 0 | 1 | 2 | 3 | 0 | 1 | 2 | 3 | 0 | 1 | 2 | ... |
| SPG | 1 | 1 | 1 | 2 | 2 | 2 | 1 | 1 | 2 | 2 | 1 | 1 | 2 | 2 | 1 | 1 | 2 | 2 | ... |
| NORMAL READING | × | ○ | × | × | ○ | ○ | × | × | ○ | ○ | × | × | ○ | ○ | × | × | ○ | ○ | ... |

FAILURE BITS ARE CONCENTRATED ON SP0 (ZONE 0) AND SP3 (ZONE 3) AT TIME OF NORMAL READING

SEMICONDUCTOR MEMORY DEVICE AND MEMORY SYSTEM

CROSS-REFERENCE TO RELATED APPLICATION

This application is based upon and claims the benefit of priority from Japanese Patent Application No. 2015-037230, filed Feb. 26, 2015, the entire contents of which are incorporated herein by reference.

FIELD

Embodiments described herein relate generally to a semiconductor memory device and a memory system.

BACKGROUND

NAND flash memories in which memory cell transistors are arranged 3-dimensionally are known.

DESCRIPTION OF THE DRAWINGS

FIG. 14 is a schematic diagram illustrating the configuration of one page in the semiconductor memory device according to the first embodiment.

FIG. 16 is a table illustrating a relation among a transmission order of data from a NAND flash memory to a controller included in the semiconductor memory device according to the first embodiment, a column select line, a zone, and the sense amplifier units.

FIG. 18 depicts through graphs (a) and (b) a variation in the threshold voltage of the memory cell transistor.

FIG. 19 depicts through tables (a) and (b) the arrangement of zones and failure bits provided for the different zones.

FIG. 20 is a conceptual diagram of a shift table implemented in a memory system according to a second embodiment.

FIG. 29 depicts through tables (a) and (b) a processing flow of ECC at the time of normal reading in the memory system according to a third embodiment.

FIG. 30 depicts through tables (a) and (b) a processing flow of ECC at the time of first shift reading in the memory system according to the third embodiment.

FIG. 31 depicts through tables (a) and (b) a processing flow of ECC at the time of second shift reading in the memory system according to the third embodiment.

FIG. 36 is a table illustrating a latch circuit corresponding to each zone of the semiconductor memory device according to the fourth embodiment.

FIG. 38 is a table illustrating a relation between zones and failure bits.

DETAILED DESCRIPTION

Figure 1:
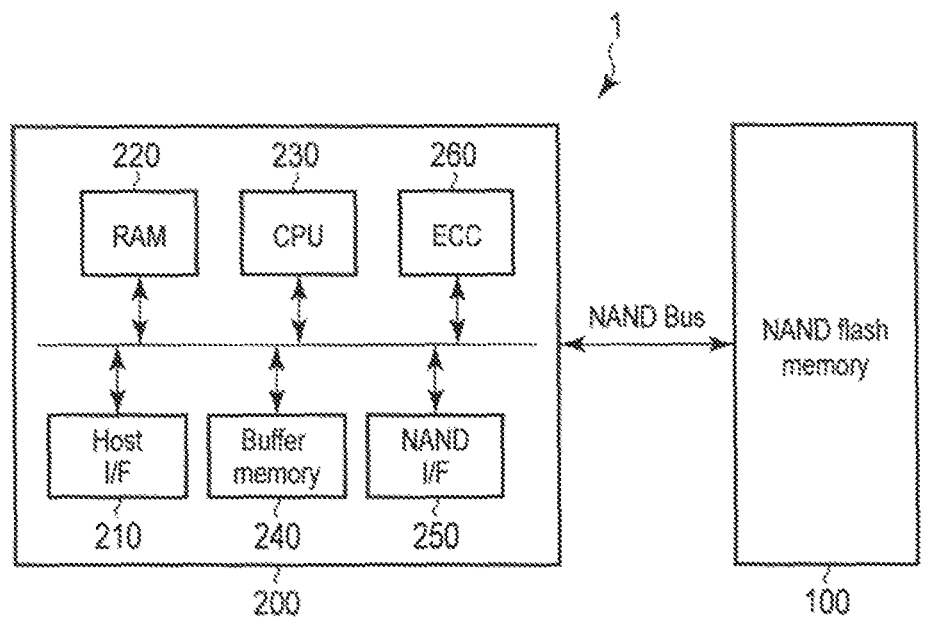
FIG. 1 is a block diagram illustrating a memory system according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, and the like may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

A semiconductor memory device and a memory system capable of improving reliability of a reading operation are provided.

According to an embodiment, a semiconductor memory device includes a first stack of memory cells above a substrate, the first stack including a first memory cell and a second memory cell above the first memory cell, a second stack of memory cells above the substrate, the second stack including a third memory cell, a word line connected to the first, second, and third memory cells, and a controller configured to output data stored in the first memory cell and data stored in the third memory cell during a first cycle, and output data stored in the second memory cell during a second cycle that is different from the first cycle.

Hereinafter, embodiments will be described with reference to the drawings. In the description, common reference numerals are given to the same structural elements throughout all the drawings.

1. First Embodiment

A semiconductor memory device and a memory system according to a first embodiment will be described. Hereinafter, a 3-dimensional stacked NAND flash memory in which memory cell transistors are stacked above a semiconductor substrate will be depicted as the semiconductor memory device.

1.1 Configuration

1.1.1 Overall Configuration of Memory System

First, an overall configuration of the memory system including the semiconductor memory device according to the embodiment will be described with reference to FIG. 1.

As illustrated in the drawing, a memory system 1 includes a NAND flash memory 100 and a controller 200 and is connected to each other by a NAND bus. The controller 200 and the NAND flash memory 100 may be combined to form, for example, a single semiconductor memory device. Examples of the semiconductor memory device include a memory card such as an SD™ card and a solid state drive (SSD).

The NAND flash memory 100 includes a plurality of memory cell transistors and store data in a non-volatile manner. The details of the configuration of the NAND flash memory 100 will be described below.

The NAND bus electrically connects the NAND flash memory 100 and the controller 200 and is used, for example, to transmit a control signal and a data signal. For example an 8-bit data signal is transmitted on the NAND bus. In the present specification, the 8-bit data signal is denoted as input/output signals I/O[0] to I/O[7].

The controller 200 commands the NAND flash memory 100 to read, write, and erase data in response to commands from an external host apparatus. The controller 200 manages a memory space of the NAND flash memory 100.

1.1.2 Configuration of Controller

Next, the details of the configuration of the controller 200 will be described with reference to FIG. 1.

As illustrated in the drawing, the controller 200 includes a host interface circuit 210, an internal memory (RAM) 220, a processor (CPU) 230, a buffer memory 240, a NAND interface circuit 250, and an ECC circuit 260. These structural elements are connected to each other via internal buses inside the controller 200.

The host interface circuit 210 is connected to the host apparatus via a controller bus (not illustrated) and performs communication with the host apparatus. The host interface circuit 210 transmits a command and data received from the host apparatus to the CPU 230 and the buffer memory 240. The host interface circuit 210 also transmits the data inside the buffer memory 240 to the host apparatus in response to a command from the CPU 230.

The NAND interface circuit 250 is connected to the NAND flash memory 100 via the NAND bus and performs communication with the NAND flash memory 100. The NAND interface circuit 250 transmits a command received from the CPU 230 to the NAND flash memory 100 and transmits write data inside the buffer memory 240 to the NAND flash memory 100 at the time of writing. Further, at the time of reading, the NAND interface circuit 250 transmits data read from the NAND flash memory 100 to the buffer memory 240.

The internal memory 220 is, for example, a semiconductor memory such as a DRAM and is used as a working memory of the CPU 230. The internal memory 220 retains firmware, various management tables, and the like for managing the NAND flash memory 100.

The CPU 230 controls all of the operations of the controller 200. For example, when the CPU 230 receives a write command from the host apparatus, the CPU 230 issues a write command based on an NAND interface in response to the write command. The same also applies at the time of reading and the time of erasing. The CPU 230 performs various processes, such as wear leveling, to manage the NAND flash memory 100. Further, the CPU 230 performs various kinds of calculation. For example, the CPU 230 performs a data encryption process, a randomization process, and the like.

The ECC circuit 260 performs an error checking and correcting (ECC) process on data.

Figure 2:
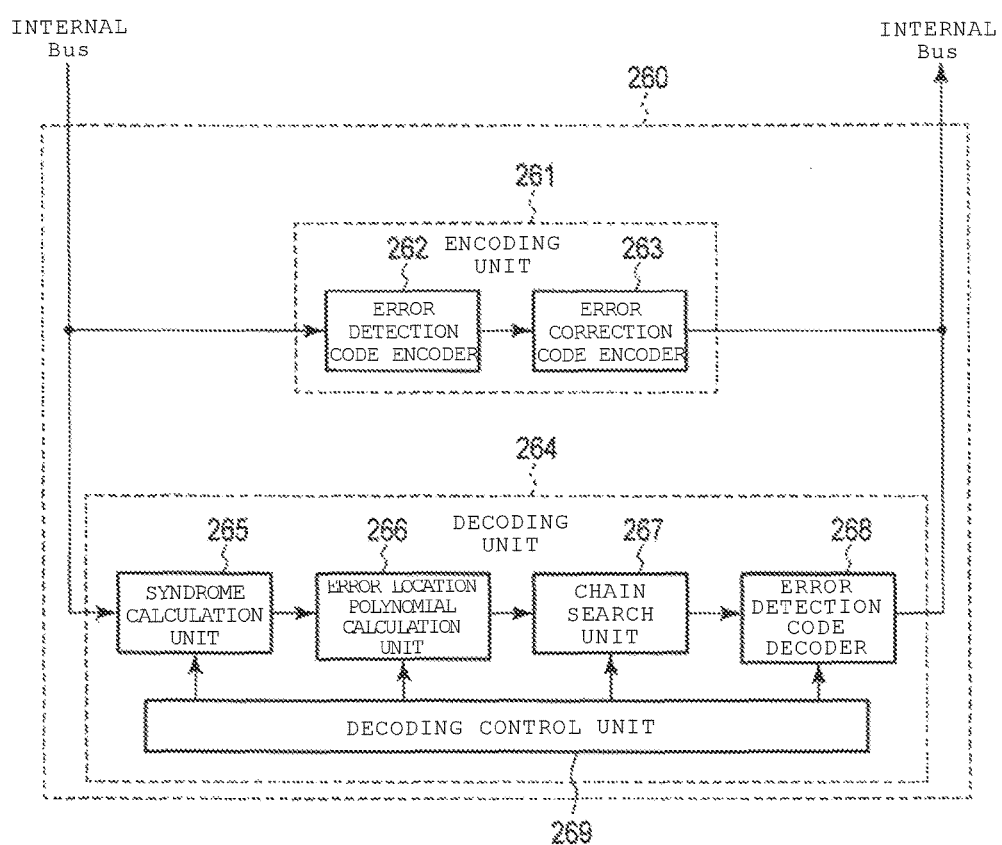
FIG. 2 is a block diagram illustrating an ECC circuit included in the memory system according to the first embodiment.

Next, the configuration of the ECC circuit 260 will be described with reference to FIG. 2. As illustrated in the drawing, the ECC circuit 260 is configured to include an encoding unit 261 used at the time of writing data and a decoding unit 264 used at the time of reading data.

The encoding unit 261 generates a code corresponding to the write data retained inside the buffer memory 240 when the data is written according to an instruction from the CPU 230. Specifically, the encoding unit 261 includes an error detection code encoder 262 and an error correction code encoder 263. First, the error detection code encoder 262 generates an error detection code based on the write data. Next, the error correction code encoder 263 generates an error correction code based on the write data and the error detection code. The generated error detection code and error correction code are transmitted to the NAND interface circuit 250 via an internal bus of the controller 200. The NAND interface circuit 250 transmits these generated codes to the NAND flash memory 100 along with the write command from the CPU 230 and the write data retained inside the buffer memory 240.

The decoding unit 264 performs a data correction process based on the data, the error detection code, and the error correction code read from the NAND flash memory 100 at the time of reading the data according to an instruction from the CPU 230. Specifically, the decoding unit 264 includes a syndrome calculation unit 265, an error location polynomial calculation unit 266, a chain search unit 267 (more generally known as an error location calculation unit), an error detection code decoder 268, and a decoding control unit 269 controlling these units. The syndrome calculation unit 265, the error location polynomial calculation unit 266, and the chain search unit 267 function as an error correction decoder and perform a data error correction process. First, the syndrome calculation unit 265 calculates a syndrome using the data, the error detection code, and the error correction code based on a command from the decoding control unit 269. Next, the error location polynomial calculation unit 266 performs error location polynomial calculation based on the calculated syndrome. Next, the chain search unit 267 specifies an error location from a result of the error location polynomial calculation and inverts bits of the error location. Thereafter, the error detection code decoder 268 performs an error detection process using the data after error correction and the error detection code and determines whether there is an error in the data after correction. Then, the decoding control unit 269 transmits a determination result and the data after correction to the buffer memory 240 via the internal bus.

1.1.3 Configuration of Semiconductor Memory Device

Next, the details of the configuration of the NAND flash memory 100 will be described.

1.1.3.1 Overall Configuration of Semiconductor Memory Device

Figure 3:
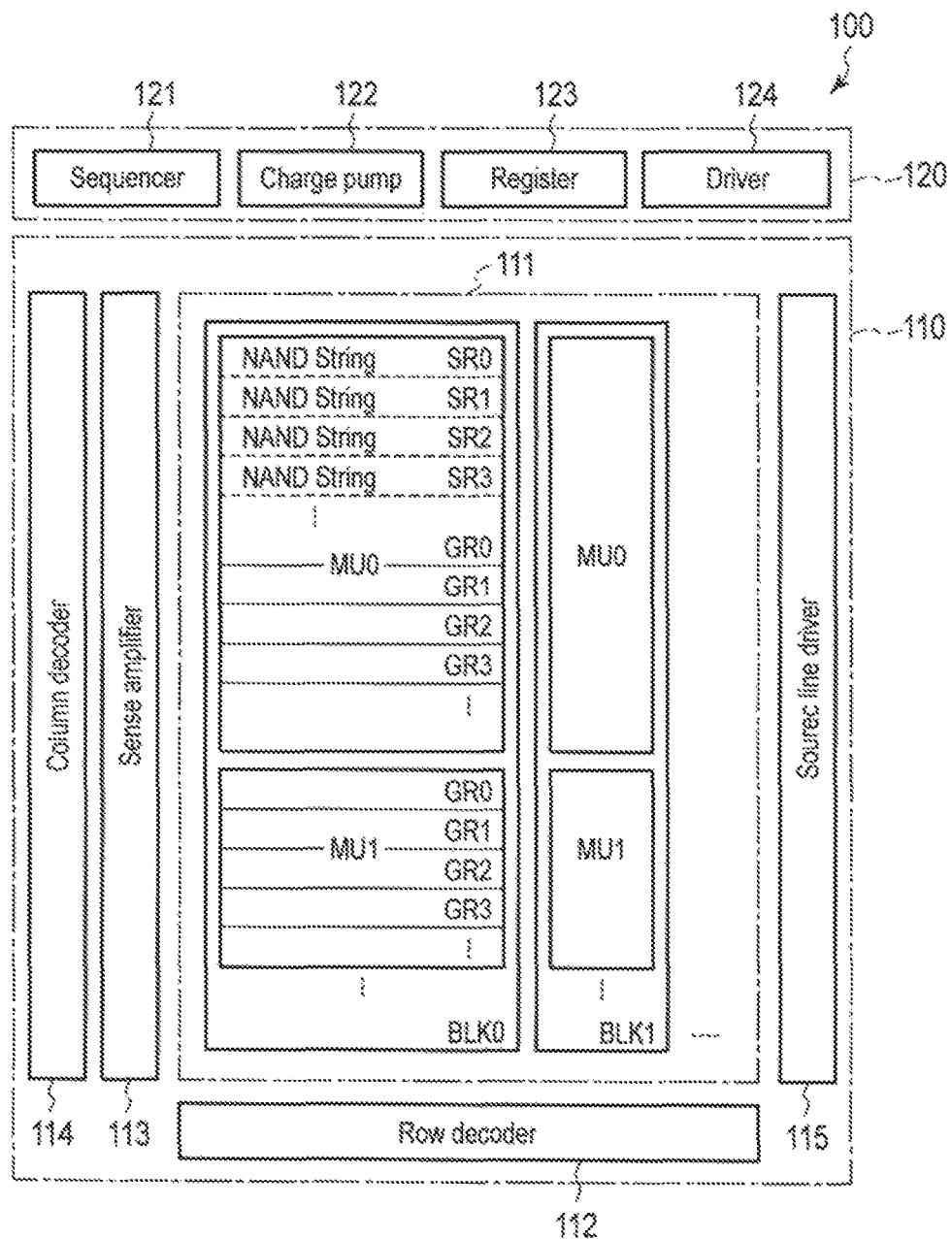
FIG. 3 is a block diagram illustrating a semiconductor memory device according to the first embodiment.

First, the overall configuration of the semiconductor memory device will be described with reference to FIG. 3. As illustrated in the drawing, the NAND flash memory 100 includes a core unit 110 and a peripheral circuit 120.

The core unit 110 includes a memory cell array 111, a row decoder 112, a sense amplifier 113, a column decoder 114, and a source line driver 115.

The memory cell array 111 includes a plurality of blocks BLK (BLK0, BLK1, and the like) each of which includes a plurality of non-volatile memory cell transistors. For example, data inside the same block BLK are erased collectively. An erasing range of the data is not limited to one block BLK, but a plurality of blocks BLK may be erased collectively or a partial region inside one block BLK may be erased collectively.

The erasing of data is disclosed in, for example, U.S. patent application Ser. No. 12/694,690, filed on 27 Jan. 2010, entitled "Non-volatile Semiconductor Memory Device." Further, the erasing of data is disclosed in, for example, U.S. patent application Ser. No. 13/235,389, filed on 18 Sep. 2011, entitled "Non-volatile Semiconductor Memory Device." The entire contents of these patent applications are incorporated herein by reference.

Each of the blocks BLK includes a plurality of memory units MU (MU0, MU1, and the like) each of which includes a set of memory cell transistors associated with word lines and bit lines, respectively. Each of the memory units MU includes a plurality of string groups GR (GR0, GR1, GR2, GR3, and the like) which are a set of NAND strings SR (SR0, SR1, SR2, and the like) in which memory cell transistors are connected in series. Of course, any number of blocks BLK in the memory cell array 111, any number of memory units MU inside one block BLK, any number of string groups GR inside one memory unit MU, and any number of NAND strings SR inside one string group GR may be used. The details of the memory cell array 111 will be described below.

The row decoder 112 decodes the addresses of the memory units MU or the addresses of pages, described below, and selects the word lines corresponding to target pages, for example, at the time of writing the data and the time of reading the data. The row decoder 112 applies appropriate voltages to the selected word lines and the non-selected word lines.

The sense amplifier 113 includes a plurality of sense amplifier units described below. The sense amplifier unit is provided to correspond to a bit line and senses data read from the memory cell transistor to the bit line at the time of reading data. At the time of writing data, write data is transmitted to the memory cell transistor. Each sense amplifier unit includes a latch circuit to retain each piece of data.

The column decoder 114 selects the latch circuit of the corresponding sense amplifier unit when data is input and output. The details of the column decoder 114 and the sense amplifier unit are described below.

The source line driver 115 transmits an appropriate voltage to a source line at the time of reading, writing, and erasing of data.

The peripheral circuit 120 includes a sequencer 121, a charge pump 122, a register 123, and a driver 124.

The sequencer 121 controls an operation of the entire NAND flash memory 100.

The charge pump 122 generates voltages necessary for writing, reading, and erasing of the data and supplies the voltages to the driver 124.

The driver 124 supplies the voltages necessary for writing, reading, and erasing to, for example, the row decoder 112, the sense amplifier 113, and/or the source line driver 115. The voltages are applied to the memory cell transistors by, for example, the row decoder 112, the sense amplifier 113, and/or the source line driver 115.

The registers 123 retains various signals. For example, the register retains a status of a data writing or erasing operation and notifies the controller whether the operation is normally completed in accordance with the status.

Alternatively, the register 123 may also contain various tables.

1.1.3.2 Configuration of Memory Cell Array

Next, the configuration of the memory cell array 111 will be described with reference to FIG. 4.

As illustrated in the drawing, the memory unit MU includes, for example, four string groups GR (GR0 to GR3). Of course, the number of string groups GR is not limited to four, and three or less string groups GR or five or more string groups GR may be used. To distinguish the memory units MU from each other, the string groups GR of the memory unit MU0 are referred to as GR0-0 to GR3-0 and the string groups GR of the memory unit MU1 are referred to as GR0-1 to GR3-1.

Each of the string groups GR includes, for example, eight NAND strings SR (SR0 to SR7). Of course, the number of NAND strings SR is not limited to eight, and 7 or less NAND strings SR or nine or more NAND strings SR may be used. Each of the NAND strings SR includes select transistors ST1 and ST2 and four memory cell transistors MT (MT0 to MT3). The number of memory cell transistors MT is not limited to four, and five or more memory cell transistors MT or three or less memory cell transistors MT may be used. The memory cell transistor MT forms a transistor including a control gate and a charge accumulation layer and retains data in a non-volatile manner. The memory cell transistors MT are connected in series between the source of the select transistor ST1 and the drain of the select transistor ST2. The memory cell transistor MT may be of an MONOS type in which an insulation film is used in a charge accumulation layer or may be an FG type in which a conductive film is used in a charge accumulation layer. In the case of the MONOS type, charge accumulation layers may be provided continuously between adjacent memory cell transistors. However, in the case of the FG type, the charge accumulation layers are separated for each memory cell transistor. Hereinafter, a case in which the memory cell transistor MT is of the MONOS type will be described as an example.

In the string group GR, the eight NAND strings SR0 to SR7 are sequentially stacked above a semiconductor substrate. The NAND string SR0 is formed in the bottom layer and the NAND string SR7 is formed in the top layer. The gates of the select transistors ST1 and ST2 included in the same string group GR are connected to the same select gate lines GSL1 and GSL2, respectively, the control gates of the memory cell transistors MT in the same string group GR that are located in the same row (e.g., all of MTn's, where n=0, 1, 2, or 3) are connected to the same word line WL. Further, the drains of the eight select transistors ST1 in a certain string group GR are connected to different bit lines BL via column select transistors CSG and the sources of the select transistors ST2 are connected to the same source lines SL.

Specifically, the drains of the select transistors ST1 of the even string groups GR0 and GR2 are connected to the sources of the column select transistors CSG0 and CSG2, respectively, and the sources of the select transistors ST2 of the even string groups GR0 and GR2 are connected commonly to a source line SL0. On the other hand, the drains of the select transistors ST1 of the odd string groups GR1 and GR3 are connected to the sources of the column select transistors CSG1 and CSG3, respectively, and the sources of the select transistors ST2 of the odd string groups GR1 and GR3 are connected commonly to a source line SL1.

The gates of the select transistors ST1 of the string groups GR0 and GR2 and the gates of the select transistors ST2 of the string groups GR1 and GR3 are connected commonly to the same select gate line GSL1. Further, the gates of the select transistors ST2 of the string groups GR0 and GR2 and the gates of the select transistors ST1 of the string groups GR1 and GR3 are connected commonly to the same select gate line GSL2.

In the string groups GR0 and GR2, the control gates of the memory cell transistors MT0, MT1, MT2, and MT3 are connected to word lines WL0, WL1, WL2, and WL3, respectively. On the other hand, in the string groups GR1 and GR3, the control gates of the memory cell transistors MT3, MT2, MT1, and MT0 are connected to the word lines WL0, WL1, WL2, and WL3, respectively.

The NAND strings SR0 to SR7 of the four string groups GR0 to GR3 included in a certain memory unit MU are connected to the same bit line BL, and the different memory units MU employ different bit lines BL. More specifically, in the memory unit MU0, the drains of the select transistors ST1 of the NAND strings SR0 to SR7 in the string groups GR0 to GR3 are connected to bit lines BL0 to BL7 via the column select transistors CSG (CSG0 to CSG3), respectively. The column select transistor CSG has the same configuration as, for example, the memory cell transistor MT or the select transistors ST1 and ST2, and selects one string group GR in each memory unit MU. Accordingly, the gates of the column select transistors CSG0 to CSG3 corresponding to each string group GR are controlled by different control signal lines SSL0 to SSL3.

Figure 4:
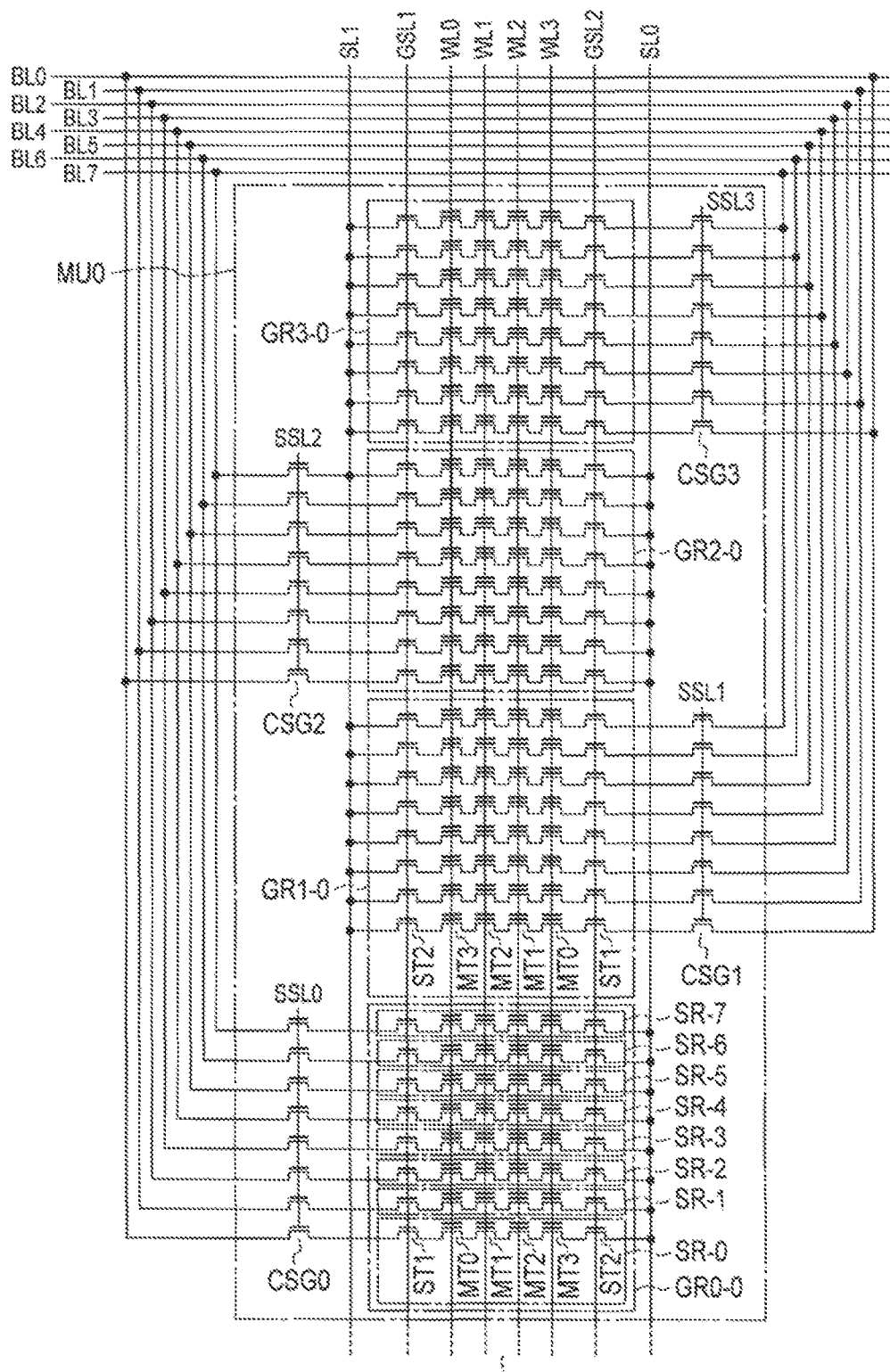
FIG. 4 is a circuit diagram illustrating a memory cell array included in the semiconductor memory device according to the first embodiment.
Figure 5:
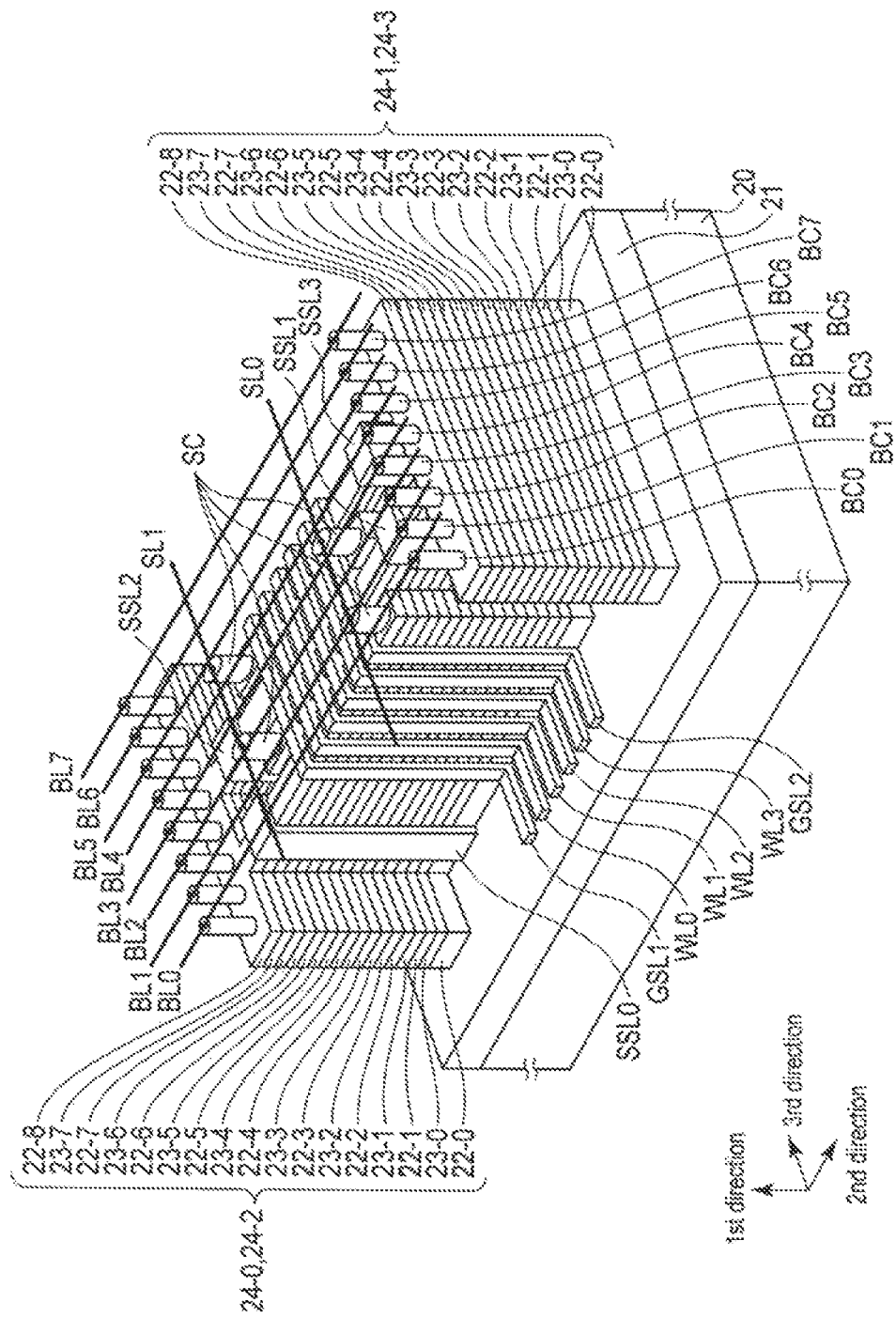
FIG. 5 is a perspective view illustrating the memory cell array included in the semiconductor memory device according to the first embodiment.
Figure 6:
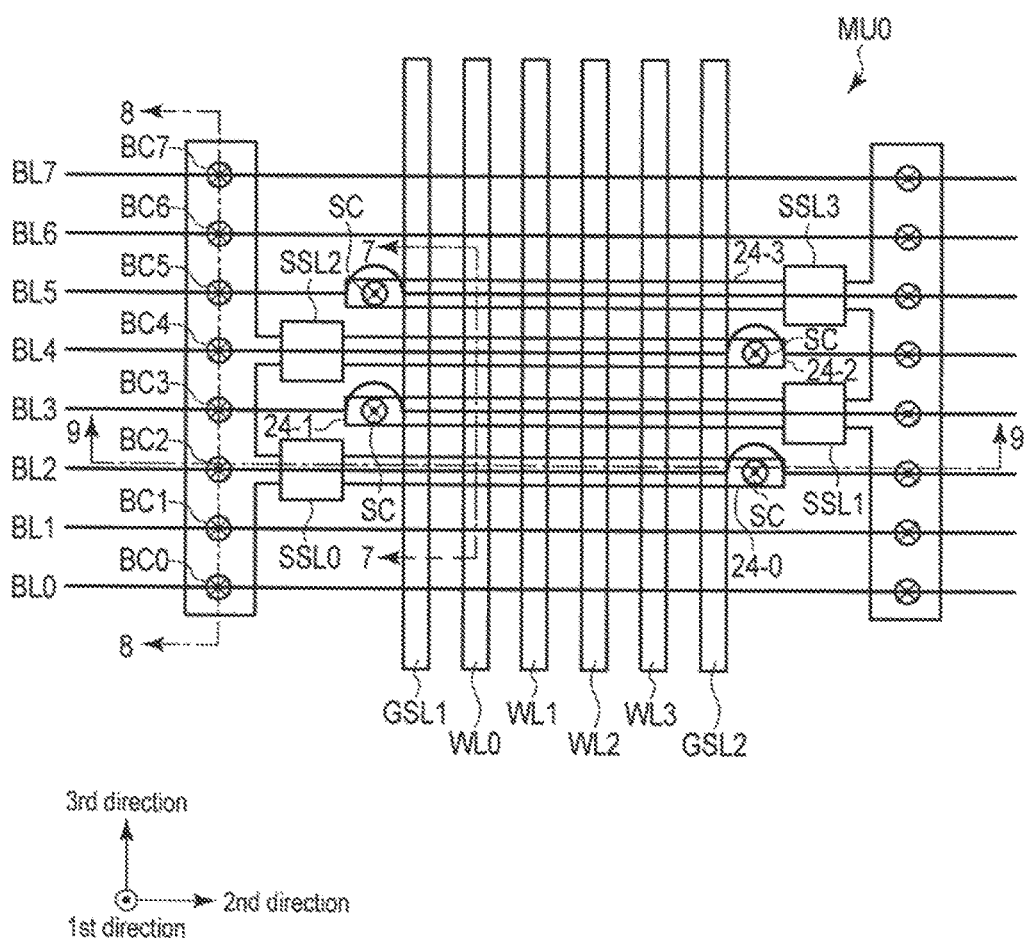
FIG. 6 is a plan view illustrating the memory cell array included in the semiconductor memory device according to the first embodiment.

The plurality of memory units MU having the above-described configuration are arrayed in the vertical direction on the sheet plane of FIG. 4. The plurality of memory units MU shares the word lines WL and the select gate lines GSL1 and GSL2 with the memory unit MU0. On the other hand, the bit lines BL are independent for each memory unit. For example, bit lines BL8 to BL15 are provided for the memory unit MU1. Similarly, bit lines BL16 to BL23 are provided for the memory unit MU2. That is, the number of bit lines BL corresponding to each memory unit MU corresponds to a total number of NAND strings SR included in one string group GR. Accordingly, when the NAND string SR are present in eight layers, the number of bit lines matching one memory unit MU is eight. The same also applies to other numbers. The control signal lines SSL0 to SSL3 are common between the memory units MU.

Next, the 3-dimensional structure, the planar structure, and the cross-sectional structure of the memory cell array 111 will be described with reference to FIGS. 5 to 9.

As illustrated in the drawing, an insulation film 21 is formed on a semiconductor substrate 20 and the memory cell array 111 is formed on the insulation film 21.

Stacks 24 in which insulation films 22 (22-0 to 22-8) and semiconductor layers 23 (23-0 to 23-7) extending in a second direction horizontal to the surface of the semiconductor substrate 20 (and orthogonal to a first direction which is the stacking direction) are alternately stacked, are arranged in a third direction (which is orthogonal to the first and second directions) in a stripe form on the insulation film 21. Each of the stacks 24 corresponds to the string group GR described with reference to FIG. 4. For example, four stacks 24 (24-0 to 24-3) are formed to form one memory unit MU. The semiconductor layers 23-0 to 23-7 correspond to current paths (regions in which channels are formed) of the NAND strings SR0 to SR7. Hereinafter, the semiconductor layers 23-0 and 23-1 are referred to as a first layer, the semiconductor layers 23-2 and 23-3 are referred to as a second layer, the semiconductor layers 23-4 and 23-5 are referred to as a third layer, and the semiconductor layers 23-6 and 23-7 are referred to as a fourth layer.

Figure 7:
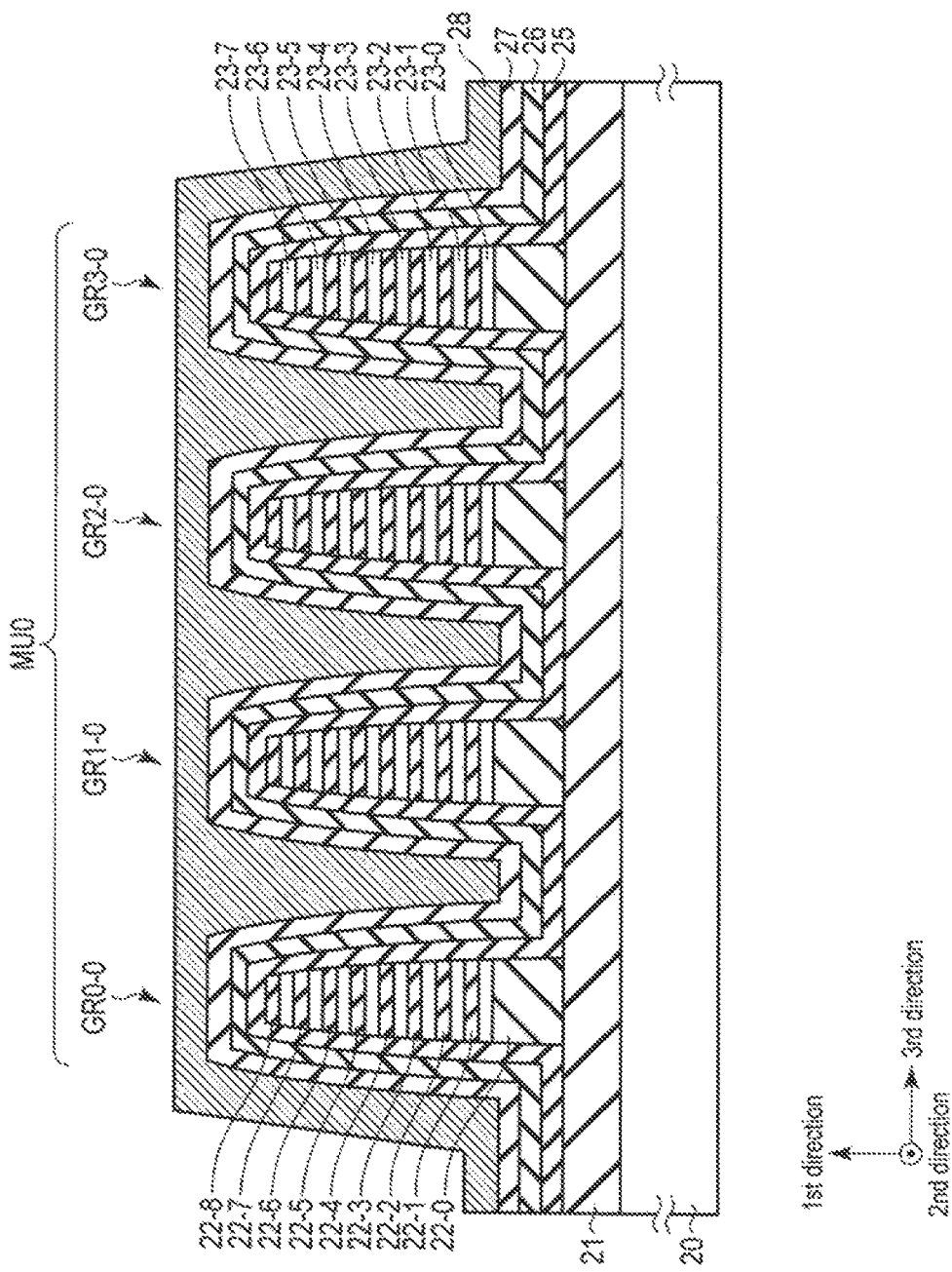
FIG. 7 is a sectional view taken along the line VII-VII of FIG. 6.
Figure 8:
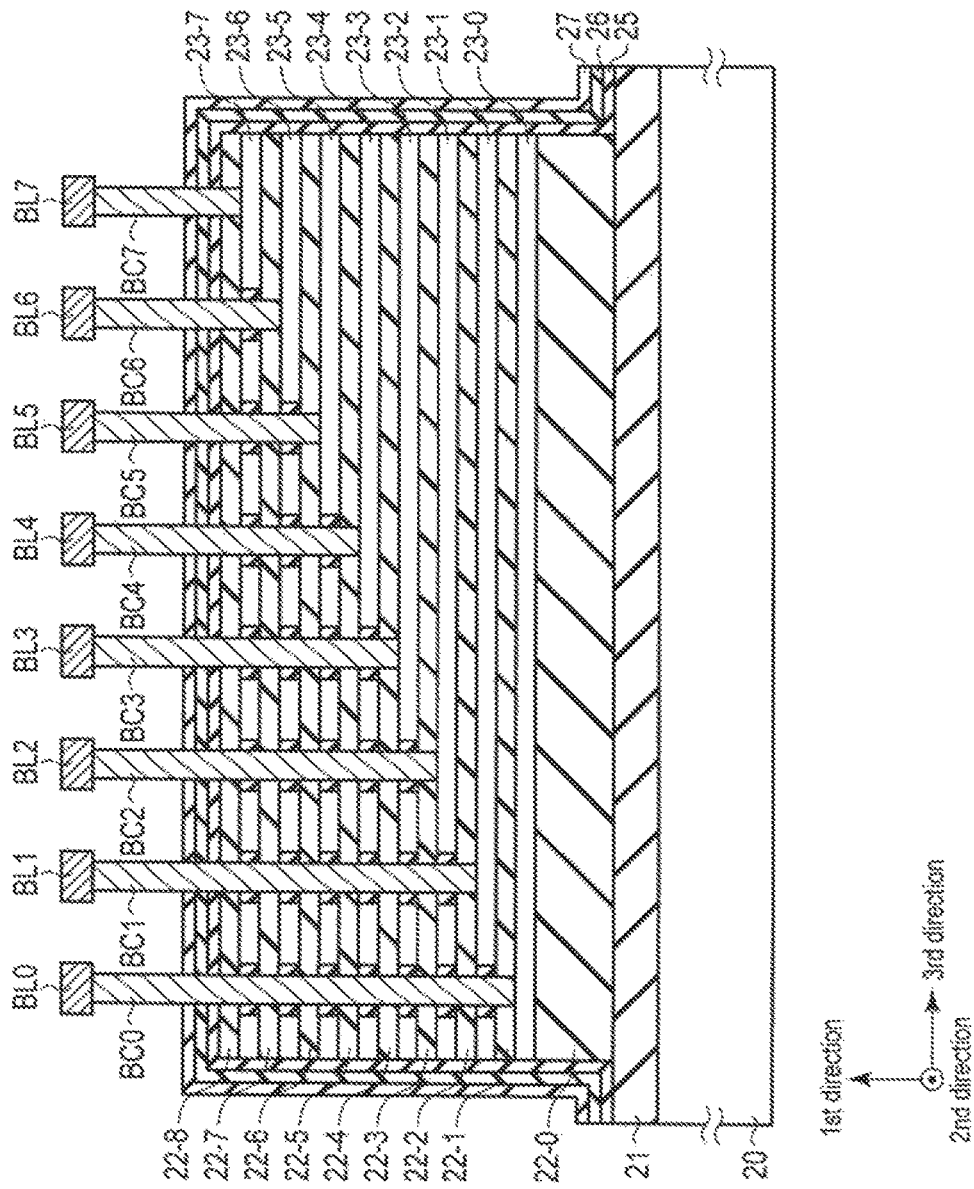
FIG. 8 is a sectional view taken along the line VIII-VIII of FIG. 6.

A tunnel insulation film 25, a charge accumulation layer 26, a block insulation film 27, and a conductive film 28 are sequentially formed on the upper surface and the side surface of the stacks 24 (see FIG. 7). The charge accumulation layer 26 is formed of, for example, an insulation film. The conductive layer 28 is formed of, for example, a polycrystalline film or a metal film and functions as the word line WL or the select gate lines GSL1 and GSL2. The word line WL and the select gate lines GSL1 and GSL2 are formed over the plurality of stacks 24 across the plurality of memory units MU. On the other hand, the control signal lines SSL0 to SSL3 are independent for each stack 24.

Ends of the stacks 24 extend to an end of the memory cell array 111 and the stacks 24 are connected to the bit lines BL in the end regions. That is, for example, referring the memory unit MU0, ends of the even stacks 24-0 and 24-2 are connected to bit lines through contact plugs BC0 to BC7 that are formed in a first end region of the memory cell array 111. The contact plug BC0 connects the semiconductor layers 23-0 of the string groups GR0 and GR2 to the bit line BL0 and is insulated from the semiconductor layers 23-1 to 23-7. The contact plug BC1 connects the semiconductor layers 23-1 of the string groups GR0 and GR2 to the bit line BL1 and is insulated from the semiconductor layers 23-0 and 23-2 to 23-7. Similarly, the contact plugs BC2 to BC7 connect the corresponding semiconductor layers 23-2 to 23-7 of the string groups GR0 to GR2 to the bit lines BL2 to BL7 and are insulated from the other semiconductor layers.

On the other hand, ends of odd stacks 24-1 to 24-3 are connected to the bit lines through contact plugs BC0 to BC7 that are formed in a second end region of the memory cell array 111 that is opposite to the first end region. The contact plug BC0 formed in the region connects the semiconductor layers 23-0 of the string groups GR1 and GR3 to the bit line BL0 and is insulated from the semiconductor layers 23-1 to 23-7. The contact plug BC1 connects the semiconductor layers 23-1 of the string groups GR1 and GR3 to the bit line BL1 and is insulated from the semiconductor layers 23-0 and 23-2 to 23-7. Similarly, the contact plugs BC2 to BC7 connect the corresponding semiconductor layers 23-2 to 23-7 of the string groups GR1 to GR3 to the bit lines BL2 to BL7 and are insulated from the other semiconductor layers.

As described above, the even stacks 24-0 to 24-2 (that is, the string groups GR0 and GR2) and the odd stacks 24-1 and 24-3 (that is, the string groups GR1 and GR3) are arranged so that the arrays of the NAND strings SR are reversed to each other. For example, in FIG. 6, the even stacks 24-0 and 24-2 are connected to the bit lines BL on the left side of the drawing and the control signal lines SSL0 to SSL2 are arranged on the left side of the drawing. Accordingly, the select transistor ST1 is located on the left side of the drawing and the select transistor ST2 is located on the right side of the drawing. The memory cell transistors MT0 to MT3 are located in the order of MT0 to MT3 from the left side of the drawing.

On the other hand, the odd stacks 24-1 and 24-3 are connected to the bit lines BL on the right side of the drawing and the control signal lines SSL1 and SSL3 are arranged on the right side of the drawing. Accordingly, the select transistor ST1 is located on the right side of the drawing and the select transistor ST2 is located on the left side of the drawing. The memory cell transistors MT0 to MT3 are located in the order of MT0 to MT3 from the right side of the drawing.

The above-described description is for the memory unit MU0. In the case of the memory unit MU1, contact plugs BC8 to BC15 are formed. The contact plugs BC8 to BC15 connect the semiconductor layers 23-0 to 23-7 to the bit lines BL8 to BL15.

Contact plugs SC are formed on the opposing ends of the stacks 24. The contact plugs SC connect the semiconductor layers 23-0 to 23-7 to source lines SL.

In the above-described configuration, the memory cell transistors MT included in the NAND strings SR0 to SR7 are mutually different in the shapes in some cases due to characteristics of dry etching or the like during the manufacturing. For example, when the alternately stacked insulation films 22 (22-0 to 22-8) and semiconductor layers 23 (23-0 to 23-7) are etched collectively, as illustrated in FIG. 7, the widths of the shapes of these films and layers are narrowed on the side of the upper layers and the side surfaces are curved after the etching in some cases.

When viewed from a plane formed in the first and third directions, the lengths of the gates of the memory cell transistors MT formed on sides of the semiconductor layers 23 vary, such that the gate length of the memory cell transistor MT formed in the semiconductor layer 23-0 is the shortest, and the gate length of the memory cell transistor MT formed in the semiconductor layer 23-7 is the longest. That is, the gate length is longer on the side of the memory cell transistor MT located on the upper layer and is shorter on the side of the memory cell transistor MT located on the lower layer. Of the widths of the semiconductor layers 23 in the third direction, the width of the semiconductor layer 23-0 is the broadest and the width of the semiconductor layer 23-7 is the narrowest. That is, the width of the semiconductor layer 23 is narrower when located on the side of the upper layer, and is broader when located on the side of the lower layer.

Figure 9:
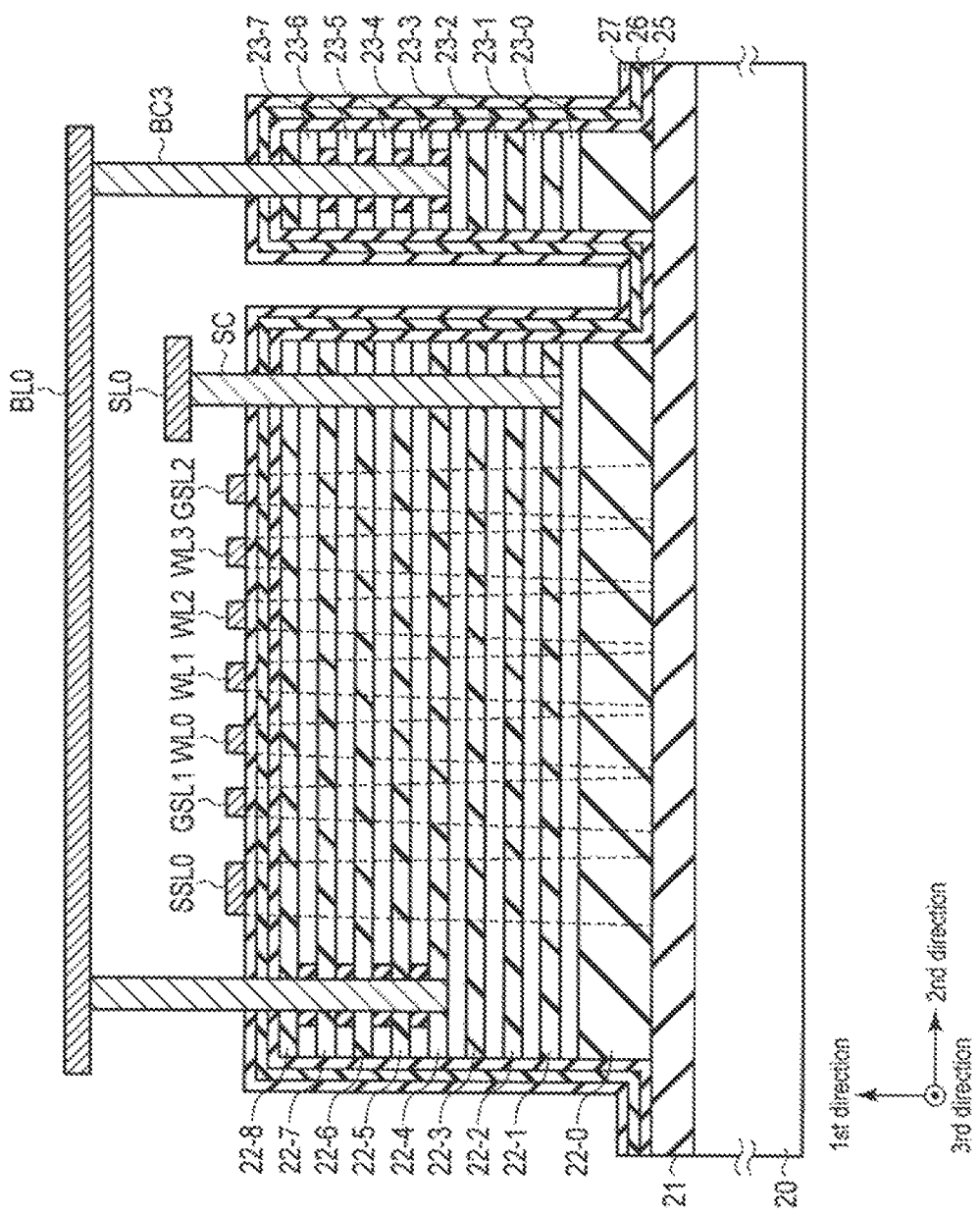
FIG. 9 is a sectional view taken along the line IV-IV of FIG. 6.

The word lines WL (the conductive film 28) are formed to be narrower on the upper side in some cases, as illustrated in FIG. 9. As illustrated in the drawing, the widths of the word lines WL in the second direction vary such that they become wider closer to the substrate 20. As a result, the gate width of the memory cell transistors MT formed in the semiconductor layer 23-0 is the broadest. Further, the gate width of the memory cell transistor MT formed in the semiconductor layer 23-7 is the narrowest. That is, the gate width is narrower when located on the upper layer, and is broader when located on the lower layer.

In this way, the memory cell transistors MT of the layers have mutually different shapes due to manufacturing variations in some cases. As a result, the writing, reading, and erasing characteristics of the memory cell transistors MT vary for each layer. Further, a threshold voltage of the memory cell transistor MT varies due to retention times, disturbance, or the like of data, but a variation amount of the threshold voltage is different for each layer.

Hereinafter, in the embodiment, a case will be described in which writing is slower on the side of the upper layer and faster on the side of the lower layer.

In the example of FIGS. 7 and 9, a case in which etched layers are thinner on the upper side will be depicted. However, in some cases, the etched layers may be thinner on the lower side or the middle etched layers may be thinner according to the characteristics of the dry etching. Accordingly, the variation in the characteristics of the memory cell transistors MT between the layers is not constant, and the embodiment is applicable to any such case.

The configuration of the memory cell array 111 is disclosed in, for example, U.S. patent application Ser. No. 12/407,403, filed on 19 Mar. 2009, entitled "Three-dimensional Stacked Non-volatile Semiconductor Memory." Further, the configuration of the memory cell array 111 is disclosed in U.S. patent application Ser. No. 12/406,524, filed on 18 Mar. 2009, entitled "Three-dimensional Stacked Non-volatile Semiconductor Memory," U.S. patent application Ser. No. 12/679,991, filed on 25 Mar. 2010, entitled "Non-volatile Semiconductor Memory and Manufacturing Method Therefor," and U.S. patent application Ser. No. 12/532,030, filed on 23 Mar. 2009, entitled "Semiconductor Memory and Manufacturing Method Therefor." The entire contents of these patent applications are incorporated herein by reference.

1.1.3.3 Configuration of Column System Circuit

Next, the sense amplifier 113 and the column decoder 114 that make up the column system circuit will be described.

1.1.3.3.1 Connection Between Sense Amplifier Unit and Column Decoder

First, connection between the sense amplifier units SAU and the column decoder 114 will be described with reference to FIG. 10.

As illustrated in the drawing, the sense amplifier 113 includes the plurality of sense amplifier units SAU. The sense amplifier units SAU sense data read from the bit lines BL at the time of a reading operation and temporarily retain the data in the latch circuits included therein. The sense amplifier units SAU temporarily retain write data provided from the outside in the latch circuit at the time of a writing operation and apply voltages according to the write data to the bit lines BL. The sense amplifier units SAU include the plurality of latch circuits, and calculation circuits that may perform various kinds of calculation in regard to the data in the latch circuits. The sense amplifier unit SAU according to the embodiment uses a voltage sense scheme according to which a variation in the voltage of the bit lines BL is sensed. One sense amplifier unit SAU is provided for every two bit lines BL, including an even bit line BLe and an odd bit line BLo. In the embodiment, eight bit lines BL correspond to one memory unit MU. The eight bit lines BL are connected to four sense amplifier units SAU.

For example, the bit lines BL0 and BL1 corresponding to a first layer (the NAND strings SR0 and SR1) in the memory unit MU0 of a block BLK0 are connected to the sense amplifier unit SAU0. The bit lines BL2 and BL3 corresponding to a second layer (the NAND strings SR2 and SR3) are connected to the sense amplifier unit SAU1. The bit lines BL4 and BL5 corresponding to a third layer (the NAND strings SR4 and SR5) are connected to the sense amplifier unit SAU2. The bit lines BL6 and BL7 corresponding to a fourth layer (the NAND strings SR6 and SR7) are connected to the sense amplifier unit SAU3. The same configuration is employed for the bit lines BL and the sense amplifier units SAU of the other memory units MU.

The four sense amplifier units SAU corresponding to one memory unit MU are connected commonly to the controller 200 and one of signals IO(0) to IO(7) through which data is input and output. The signal lines IO(0) to IO(7) correspond to 8-bit input/output signals I/O[0] to I/O[7]. Specifically, the sense amplifier units SAU0 to SAU3 corresponding to the memory unit MU0 are connected commonly to the signal line IO(0), and the sense amplifier units SAU4 to SAU7 corresponding to the memory unit MU1 are connected commonly to the signal line IO(1). In this way, the sense amplifier units SAU are connected to different signal lines IO for each memory unit. Accordingly, eight memory units MU form one group corresponding to the signal lines IO(0) to IO(7). In the example of FIG. 10, the memory units MU0 to MU7 form one group and the memory units MU8 to MU15 form another group.

The column decoder 114 selects the eight sense amplifier units SAU corresponding to the signal lines IO(0) to IO(7) in one group by selecting one column select line CSL. The column select line CSL is a signal line for controlling whether the signal lines IO and the latch circuits inside the sense amplifier units are connected. The sequencer 121 inputs and outputs the data of the eight sense amplifier units SAU selected by the column section line CSL one at a time.

In the embodiment, four sense amplifier units SAU corresponding to one memory unit MU are connected to different column select lines CSL. That is, four sense amplifier units SAU are connected to different column select line CSL for each layer. In the eight memory units MU of one group, the memory cell units SAU corresponding to the same layer are connected commonly to the same column select line CSL. Accordingly, the column decoder 114 selects the eight sense amplifier units SAU corresponding to the same layer by selecting one column select line CSL.

For example, when the column decoder 114 selects the column select line CSL0 in the memory units MU0 to MU7, the eight sense amplifier units SAU0, SAU4, SAU8, SAU12, SAU16, SAU20, SAU24, and SAU28 corresponding to the first layer of the memory units MU0 to MU7 are electrically connected to the signal lines IO(0) to IO(7), respectively. Similarly, when the column decoder 114 selects the column select line CSL1, the eight sense amplifier units SAU1, SAU5, SAU9, SAU13, SAU17, SAU21, SAU25, and SAU29 corresponding to the second layer of the memory units MU are electrically connected to the signal lines IO(0) to IO(7), respectively. When the column decoder 114 selects the column select line CSL2, the eight sense amplifier units SAU2, SAU6, SAU10, SAU14, SAU18, SAU22, SAU26, and SAU30 corresponding to the third layer of the memory units MU are electrically connected to the signal lines IO(0) to IO(7), respectively. Further, when the column decoder 114 selects the column select line CSL3, the eight sense amplifier units SAU3, SAU7, SAU11, SAU15, SAU19, SAU23, SAU27, and SAU31 corresponding to the fourth layer of the memory units MU are electrically connected to the signal lines IO(0) to IO(7), respectively.

Figure 10:
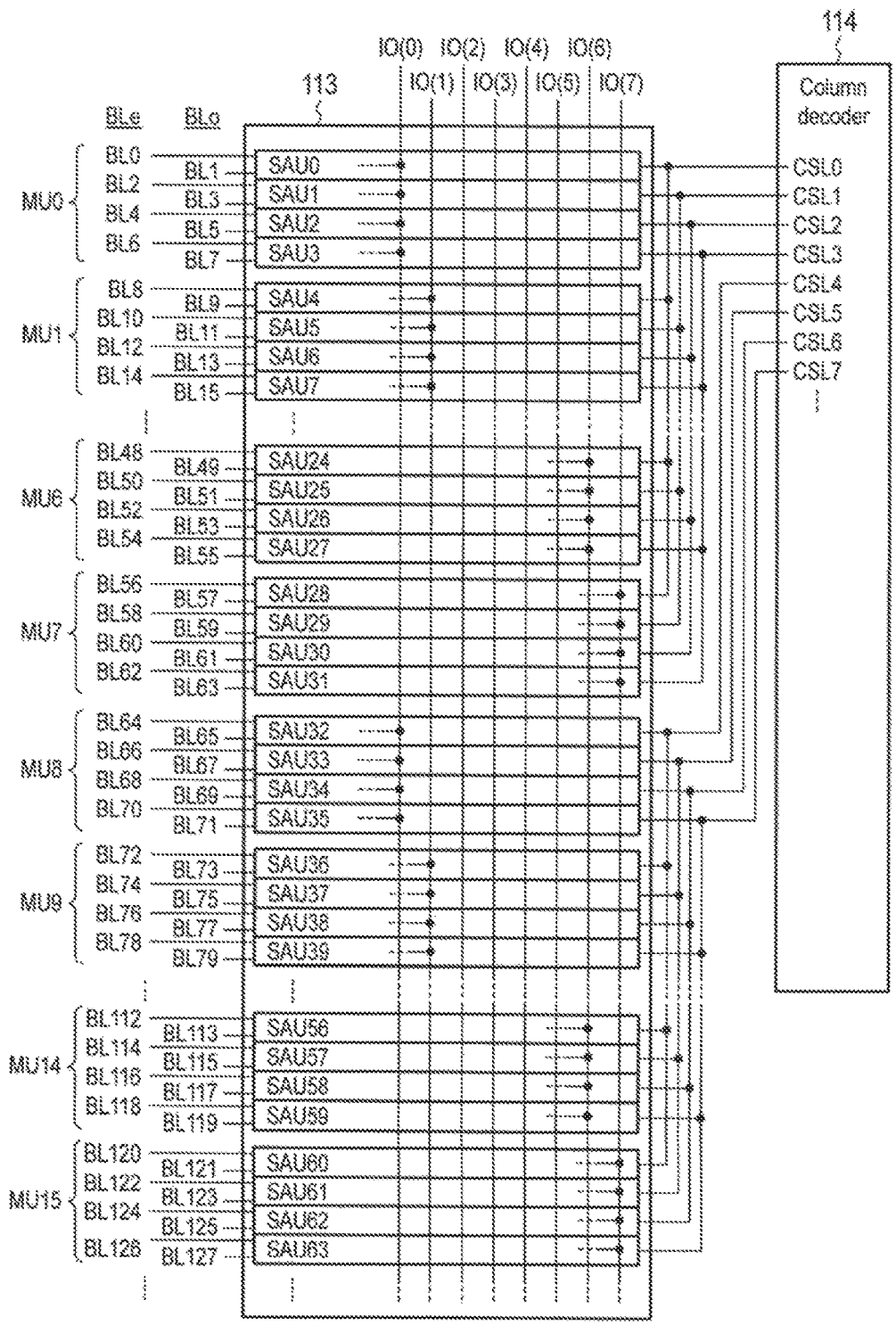
FIG. 10 is a block diagram illustrating connection between a column decoder and a sense amplifier included in the semiconductor memory device according to the first embodiment.

That is, in the example of FIG. 10, the numerals of the column select lines CSL may be denoted by CSL (An+B) (where n is any natural number equal to or greater than 0). Here, A indicates the number of sense amplifier units (in the example of FIG. 10, A=4) corresponding to one memory unit. B indicates the position of the semiconductor layer in each memory unit and the following relation is satisfied:
B=0: first layer;
B=1: second layer;
B=2: third layer; and
B=3: fourth layer.

More specifically, the column select lines CSL (4n+0), that is, the column select lines CSL0, CSL4, CSL8, and the like, select the sense amplifier SAU corresponding to the first layer. The column select lines CSL (4n+1), that is, the column select lines CSL1, CSL5, CSL9, and the like, select the sense amplifier SAU corresponding to the second layer. The column select lines CSL (4n+2), that is, the column select lines CSL2, CSL6, CSL10, and the like, select the sense amplifier SAU corresponding to the third layer. The column select lines CSL (4n+3), that is, the column select lines CSL3, CSL7, CSL11, and the like, select the sense amplifier SAU corresponding to the fourth layer.

The numerals of the eight sense amplifier units SAU corresponding to the column select lines CSL may be denoted by SAU (32n+4x+B) when the numerals of the connected signal lines IO are IO(x) (where x is a natural number of 0 to 7). For example, when n=0 and B=1, that is, in the column select line CSL1, the sense amplifier unit SAU connected to the signal line IO(1) is SAU5 and the sense amplifier unit SAU connected to the signal line IO(7) is SAU29.

1.1.3.3.2 Circuit Configuration of Sense Amplifier Unit

Next, the circuit configuration of the sense amplifier unit SAU will be described. The sense amplifier unit SAU of a voltage sense scheme according to the embodiment shields an adjacent bit line BL and performs a sense operation. That is, according to the voltage sense scheme, data is read for each even bit line BLe and each odd bit line BLo. Accordingly, in one string group GR selected commonly in each memory unit MU of a certain block BLK, data is read collectively from the memory cell transistors MT connected to the even bit line BLe or the odd bit line BLo among the plurality of memory cell transistors MT connected commonly to a certain word line WL. Hereinafter, the collectively read data serves as a unit called a "page." A data amount of one page, that is, the number of corresponding memory cell transistors MT, is different according to, for example, the configurations of the memory cell array 111 and the sense amplifier 113.

Figure 11:
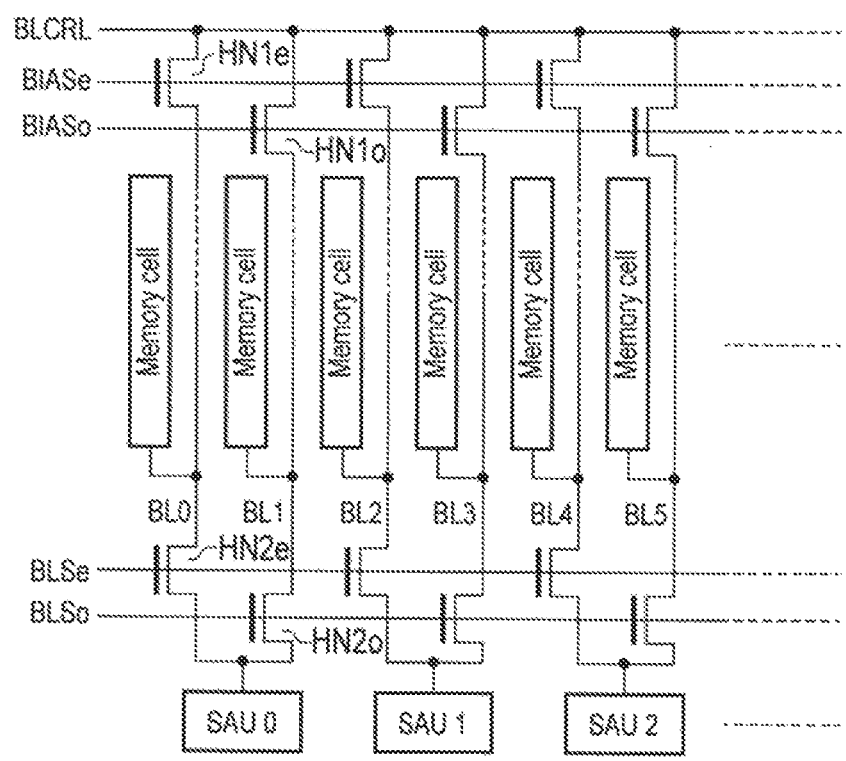
FIG. 11 is a block diagram illustrating connection between sense amplifier units and bit lines included in the semiconductor memory device according to the first embodiment.

First, the connection between the sense amplifier unit SAU, and the even bit line BLe and the odd bit line BLo will be described with reference to FIG. 11. As illustrated in the drawing, one sense amplifier unit SAU is shared by two bit lines BL (the even bit line BLe and the odd bit line BLo) adjacent to each other. The even bit lines BLe are connected to the sense amplifier units SAU via transistors HN2e, respectively, and are connected commonly to a signal line BLCRL via transistors HN1e. Similarly, the odd bit lines BLo are connected to the sense amplifier units SAU via transistors HN2o, respectively, and are connected commonly to the signal line BLCRL via transistors HN1o. The signal line BLCRL is a signal line used to supply, for example, a ground potential VSS to the bit lines BL. Further, signals BIASe, BIASo, BLSe, and BLSo are input to the gates of the transistors HN1e, HN1o, HN2e, and HN2o, respectively.

For example, when the data is read from the even bit lines BLe, the sequencer 121 sets the signal BLSe as an "H" level to turn on the transistors HN2e and connect the even bit lines BLe to the sense amplifier units SAU. Further, the sequencer 121 sets the signal BIASo as the "H" level to turn on the transistors HN1o and connect the odd bit lines BLo to the signal line BLCRL. In this state, when each sense amplifier unit SAU precharges the even bit line BLe, the potential of the odd bit line BLo is maintained to VSS. Therefore, the sense amplifier unit SAU precharges the even bit line BLe without receiving an influence from the odd bit line BLo.

On the other hand, when the data is read from the odd bit lines BLo, the sequencer 121 sets the signals BLSo and the signal BIASe as the "H" level to connect the odd bit lines BLo to the sense amplifier units SAU and the even bit lines BLe to the signal line BLCRL. In this state, the sense amplifier units SAU precharge the odd bit lines BLo.

In this way, in the voltage sense scheme according to the embodiment, the unselected bit lines BL adjacent to the selected bit lines at the time of the reading operation are set to the grounding state. Thus, the exact reading operation may be performed without receiving an influence the signals of the adjacent bit lines BL.

Figure 12:
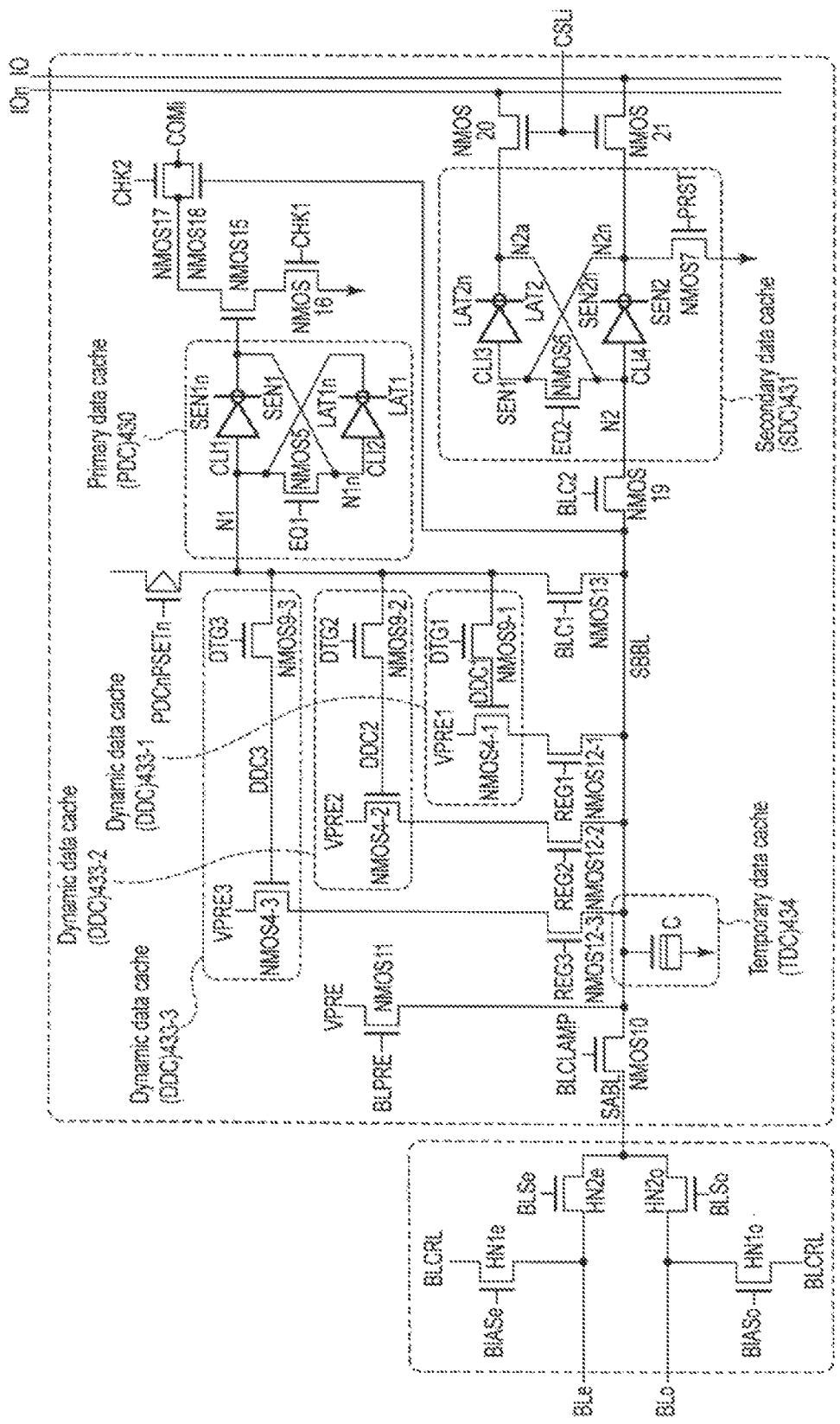
FIG. 12 is a circuit diagram illustrating the sense amplifier unit included in the semiconductor memory device according to the first embodiment.

Next, the circuit configuration of the sense amplifier unit SAU will be described with reference to FIG. 12. As illustrated in the drawing, each sense amplifier unit SAU includes a primary data cache (PDC) 430, a secondary data cache (SDC) 431, three dynamic data caches (DDC) 433 (433-1 to 433-3), and a temporary data cache (TDC) 434. The dynamic data caches 433 and the temporary data cache 434 may be provided, as necessary.

The primary data cache 430 includes clocked inverters CLI1 and CLI2 and transistors NMOS5. The secondary data cache 431 includes clocked inverters CLI3 and CLI4 and transistors NMOS6 and NMOS7. The dynamic data cache 433 includes transistors NMOS4 and NMOS9. The temporary data cache 434 includes a capacitor C.

The secondary data cache 431 is connected to signal lines IOn and IO via transistors NMOS20 and NMOS21, respectively. The signal line IO is a signal line corresponding to one of the input/output signals I/O[0] to I/O[7] and the signal line IOn is a signal line through which a signal obtained by inverting a signal output from the signal line IO is output. The gates of the transistors NMOS20 and NMOS21 are connected to the column decoder 114 via column select lines CSLi (where i=An+B). Signals corresponding to the input/output signals I/O[0] to I/O[7] may be signals output from the signal line IOn or signals using differences between the signals output from the signal line IO and the signal line IOn.

For example, when the data is read, the column decoder 114 sets the column select line CSLi as the "H" level and turns on the transistors NMOS20 and NMOS21. Then, the data retained in the secondary data cache 431 is transmitted to the signal line IO and the inverted data is transmitted to the signal line IOn.

One of the source and the drain of the transistor NMOS10 is connected to a node SABL and the other thereof is connected to a node SBBL, and a signal BLCLAMP is input to its gate. At the time of reading, the sequencer 121 performs control of a precharge voltage to be applied to the bit line BL and timing control of sensing (strobing) the voltage of the bit line BL by the signal BLCLAMP.

A voltage VPRE is applied to one of the source and the drain of the transistor NMOS11 and the other thereof is connected to the node SBBL. A signal BLPRE is input to the gate of the transistor NMOS11.

A signal BLC2 is input to the gate of the transistor NMOS19. One of the source and the drain of the transistor NMOS19 is connected to the secondary data cache 431, and the other thereof is connected to the node SBBL.

1.1.4 Threshold Voltage Distribution of Memory Cell Transistor

Figure 13:
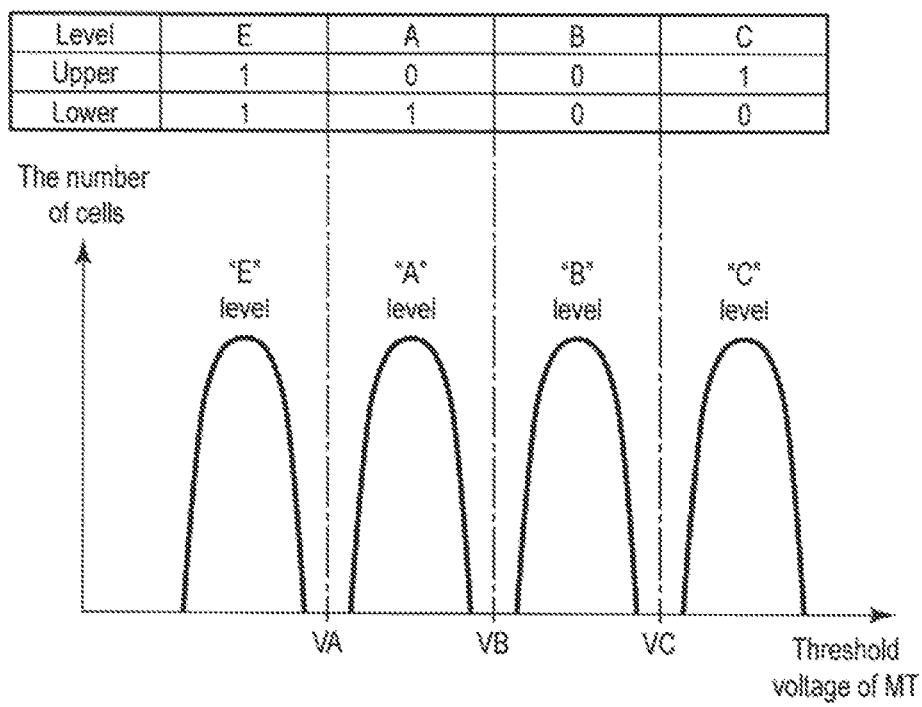
FIG. 13 is a diagram illustrating distribution of threshold voltages of memory cell transistors included in the semiconductor memory device according to the first embodiment.

Next, a threshold voltage distribution which the memory cell transistor MT may take, for example, when 2-bit data is retained will be described with reference to FIG. 13.

As illustrated in the drawing, a threshold voltage of each memory cell transistor MT may retain 2-bit data formed by an upper bit (or upper data) and a lower bit (lower data), that is, data "11," "01," "00," and "10."

The threshold voltage of data "11" is an "E" level and is a value lower than a voltage VA.

Threshold voltages of data "01," "00," and "10" are "A," "B," and "C" levels, respectively. These threshold voltages have the following relationship: the "E" level<the "A" level<the "B" level<the "C" level. The "A" level is a voltage higher than the voltage VA and lower than a voltage VB, the "B" level is a voltage higher than the voltage VB and lower than a voltage VC, and the "C" level is a voltage higher than the voltage VC.

The relationship between each piece of data and the threshold voltage level is not limited to the above-described relation, and may be appropriately changed.

Writing and reading data is performed in units of pages, and data is written or read for each lower bit or an upper bit. Accordingly, when the memory cell transistor MT retains 2-bit data, data corresponding to the upper bit and data corresponding to the lower bit are each allocated to one page. Thus, a page for which lower bits are written or read collectively is referred to as a lower page and a page for which upper bits and written or read collectively is referred to as an upper page.

1.1.5 Configuration of Page

Next, the configuration of the page according to the embodiment will be described with reference to FIG. 14.

As illustrated in the drawing, the page (the upper page or the lower page) includes a normal data region and an ECC data region. The normal data region is a region in which write data (data including no error correction code and no error detection code) received from the controller 200 is retained and includes, for example, four zones. In the embodiment, an ECC process is performed separately for each zone. The normal data region illustrated in FIG. 14 has a data size of, for example, 4 K bits (where 1028 bits are described as 1 K bits). Accordingly, the four zones (zone 0 to zone 3) each have a data size of 1 K bits. The number of zones is not limited to four, and three or more zones or five or more zones may be used and may be appropriately set according to the size of the normal data region and units of ECC processes.

In the ECC data region, data necessary for the ECC process for each zone, for example, the error correction code and the error detection code, are retained. Accordingly, the ECC data region includes four regions, like the number of zones of the normal data region. Hereinafter, the data of the regions are referred to as 0th ECC data to 3rd ECC data. The 0th ECC data corresponds to normal data of zone 0, the 1st ECC data corresponds to normal data of zone 1, the 2nd ECC data corresponds to normal data of zone 2, and the 3rd ECC data corresponds to normal data of zone 3. In the embodiment, the size of the ECC data corresponding to one zone is assumed to be 128 bits. However, the size of the ECC data is not limited as long as a size necessary to retain the error correction code and the error detection code is ensured. In the embodiment, the case in which the normal data region includes the four zones is described. However, the entire page may include four zones and each zone may include the normal data and the ECC data. Specifically, for example, zone 0 may include the 0th normal data and the 0th ECC data corresponding to the 0th normal data. The same applies to zone 1 to zone 3. The write data (including the error correction code and the error detection code) received from the controller 200 may be retained for each zone.

In the embodiment, data in one layer is allocated to a specific zone. Specifically, for example, the data of the memory cell transistor MT in the first layer is allocated to zone 0. Similarly, the data of the memory cell transistor MT in the second layer is allocated to zone 1, the data of the memory cell transistor MT in the third layer is allocated to zone 2, and the data of the memory cell transistor MT in the fourth layer is allocated to zone 3.

Accordingly, during the reading of data, for example, the column decoder 114 first selects the column select line CSL (4n+0) and outputs the 0th ECC data and the data of zone 0 to the controller 200. Next, the column decoder 114 selects the column select line CSL (4n+1) and outputs the 1st ECC data and the data of zone 1 to the controller 200. Next, the column decoder 114 selects the column select line CSL (4n+2) and outputs the 2nd ECC data and the data of zone 2 to the controller 200. Finally, the column decoder 114 selects the column select line CSL (4n+3) and outputs the 3rd ECC data and the data of zone 3 to the controller 200.

In the embodiment, the column decoder 114 selects the column select lines in the order of CSL (4n+0), CSL (4n+1), CSL (4n+2), and CSL (4n+3), but the order is not limited thereto. The order may be appropriately changed or the data may be output for each layer. Further, in the embodiment, the four zones and the four layers (the first to fourth layers) have a one-to-one correspondence relation, but the one-to-one correspondence relation may not be necessary. For example, when the number of zones is eight, zone 0 and zone 1 may correspond to the first layer, zone 2 and zone 3 may correspond to the second layer, zone 4 and zone 5 may correspond to the third layer, and zone 6 and zone 7 may correspond to the fourth layer. When the number of zones is two, zone 0 may correspond to the first and second layers and zone 1 may correspond to the third and fourth layers, or the zones may be appropriately set in a different manner.

1.2 Data Reading Operation

Next, a data reading operation according to the embodiment will be described.

1.2.1 Overall Flow of Reading Operation

Figure 15:
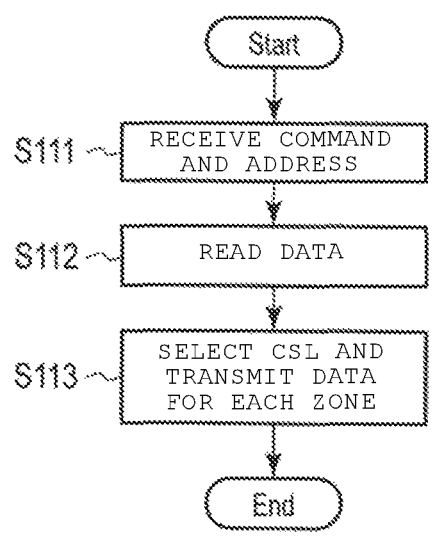
FIG. 15 is a flowchart illustrating an operation of a NAND flash memory at the time of reading of data in the semiconductor memory device according to the first embodiment.

First, the overall flow of the data reading operation in the NAND flash memory 100 will be described with reference to FIG. 15.

As illustrated in the drawing, the sequencer 121 first receives a reading command and a reading target page address from the controller 200 (step S111).

Then, the sequencer 121 selects the string group GR, the word line WL, and the even bit line BLe or the odd bit line BLo, which are a target, and reads the data of the memory cell transistor MT corresponding to the reading target page address (step S112).

Next, the sequencer 121 transmits the read data from the sense amplifier 113 to the NAND interface circuit 250 of the controller 200 (step S113). The read data is transmitted for each zone, as described with reference to FIG. 14.

Next, a data transmission order, the zone corresponding to the data transmission order, the column select line CSL, and the numeral of the sense amplifier unit SAU will be described with reference to FIG. 16. As illustrated in the drawing, the sequencer 121 first transmits the 0th ECC data and the data of zone 0 in units of 8 bits n separate times. The numerals of the column select lines CSL and the numerals of the sense amplifier units SAU corresponding to the signal lines IO(0) to IO(7) are illustrated in FIG. 16. For example, at an 1st to an n-th time, the sequencer 121 selects the column select line CSL (4n+0) and transmits the data retained in the sense amplifier unit SAU (32n) from the signal line IO(0). Similarly, the sequencer 121 transmits the 1st ECC data and the data of zone 1 at an (n+1)-th time to a 2n-th time, transmits the 2nd ECC data and the data of zone 2 at a (2n+1)-th time to a 3n-th time, and transmits the 3rd ECC data and the data of zone 3 at a (3n+1)-th time to a 4n-th time. Thus, the reading operation ends. The order of the zones for transmitting the data is not limited, but may be appropriately changed.

1.2.2 Voltage at the Time of Reading

Figure 17:
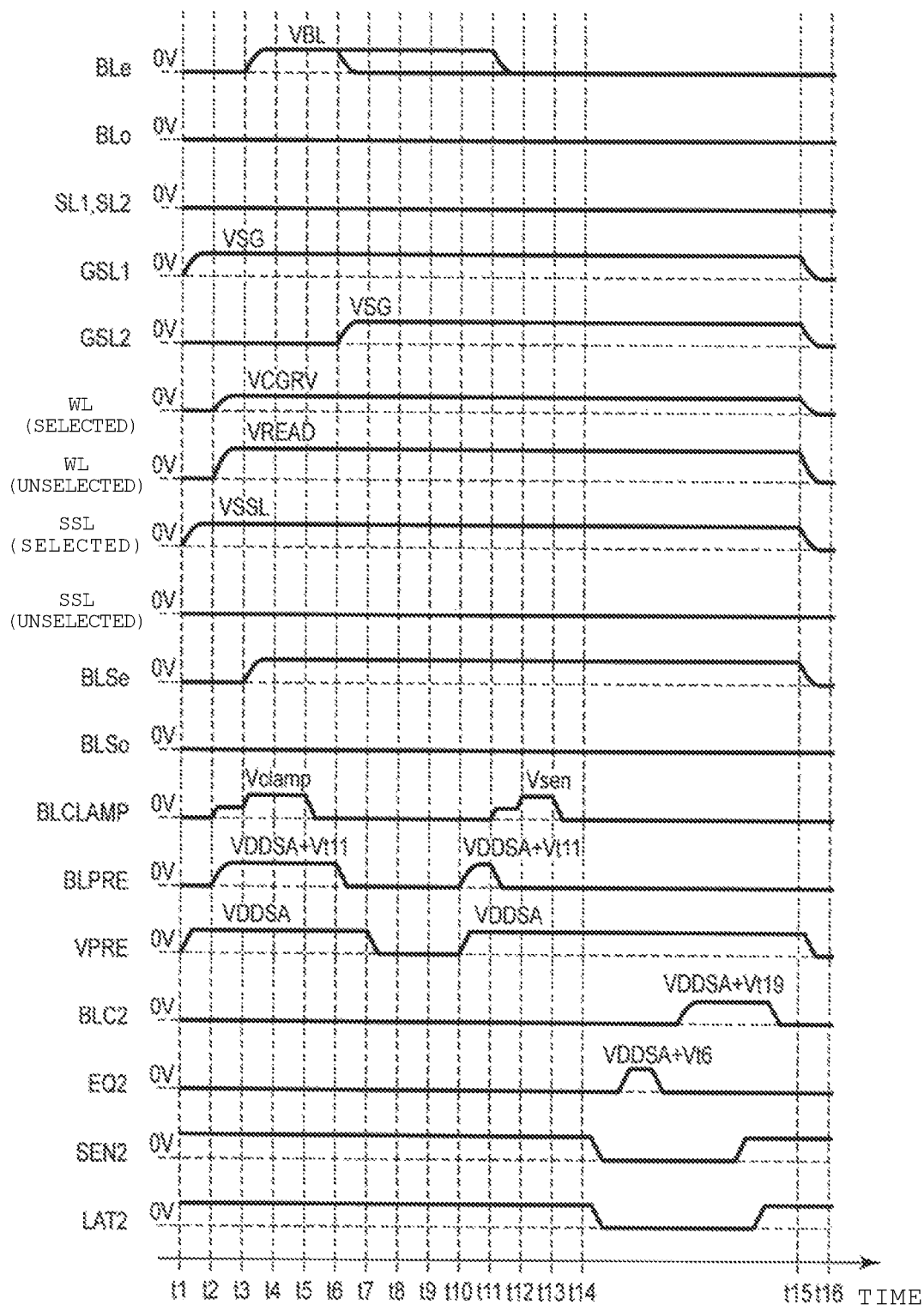
FIG. 17 is a timing diagram illustrating potentials of wirings at the time of reading of data in the semiconductor memory device according to the first embodiment.

Next, a voltage relationship of each wiring at the time of reading data will be described with reference to FIG. 17. FIG. 17 illustrates an example when the even bit line BLe of the string group GR0 is selected.

As illustrated in the drawing, at time t1, the row decoder 112 applies a voltage VSG (for example, 5 V) to the select gate line GSL1 to turn on the select transistor ST1 of the string group GR0. VSG is a voltage used to turn on the select transistors ST1 and ST2. The sequencer 121 applies a voltage VSSL to the control signal line SSL0 corresponding to the selected string group GR. VSSL is a voltage used to turn on the column select transistor CSG. In the sense amplifier unit SAU, a power source potential VPRE is set to, for example, VDDSA. VDDSA is a power source voltage that is supplied from a power source to the sense amplifier unit SAU.

Next, at time t2, the row decoder 112 applies a voltage VCGRV to the selected word line WL and applies a voltage VREAD (for example, 7 V) to the non-selected word line WL. The voltage VCGRV is a voltage according to reading target data. The voltage VREAD is a voltage used to turn on the memory cell transistor MT irrespective of the retained data, such that "VREAD>VCGRV" is satisfied. In the sense amplifier unit SAU, the sequencer 121 sets the voltage of the signal BLCLAMP as a voltage lower than Vclamp described below. The sequencer 121 sets the voltage of the signal BLPRE to "VDDSA+Vt11" (where Vt11 is a threshold voltage of the transistor NMOS11), returns on the transistor NMOS11, and precharges the temporary data cache (TDC) 434 to, for example, VDDSA.

Next, at time t3 and time t4, the sequencer 121 sets the select signal BLSe of an even bit line as the "H" level and selects the even bit line BLe. The sequencer 121 sets the voltage of the signal BLCLAMP as Vclamp. The voltage Vclamp is a clamp voltage for bit line precharge and is a voltage lower than the voltage VDDSA of the power source potential VPRE. Thus, the even bit line BLe is precharged with the voltage VBL. Vclamp and VBL have a relation of "Vclamp=VBL+Vt10." Vt10 is a threshold voltage of the transistor NMOS10.

Next, at time t5, the sequencer 121 sets the voltage of the signal BLCLAMP as 0 V and turns off the transistor NMOS10 of the sense amplifier unit SAU. Thus, the application of the voltage from the sense amplifier 113 to the even bit line BLe is stopped.

Next, at time t6, the sequencer 121 sets the signal BLPRE as the "L" level and stops the application of the voltage to the temporary data cache (TDC) 434. Then, the sequencer 121 applies VSG to the select gate line GSL2 to turn on the select transistor ST2 of the selected string group GR0. Thus, when the threshold voltage of the memory cell transistor MT is higher than VCGRV, no current flows from the even bit line BLe to the source line SL. Therefore, the potential of the even bit line BLe is not lowered. Thus, when the threshold voltage of the memory cell transistor MT is lower than VCGRV, a current flows from the bit line BL to the source line SL and the potential of the even bit line BLe is lowered.

Next, at time t10 and time t11, when the power source potential VPRE is set as VDDSA, the sequencer 121 sets the voltage of the signal BLPRE as VDDSA+Vt11 and precharges the temporary data cache (TDC) 434 to VDDSA.

Subsequently, at time t12 and time t13, the sequencer 121 sets the voltage of the signal BLCLAMP as a sense voltage Vsen. At this time, the potential of the select bit line BLe is higher than "Vsen−Vt10" (where Vt10 is a threshold voltage of the transistor NMOS10), the transistor NMOS10 is cut off and VDDSA is retained in the temporary data cache (TDC) 434 in the cutoff state. Conversely, when the select bit line BLe is lower than "Vsen−Vt10," the temporary data cache (TDC) 434 is discharged to turn on the transistor NMOS10 so that the potential of the temporary data cache is substantially the same as the potential of the bit line BLe.

Next, at time t14 and time t15, the sensed data is received by the secondary data cache (SDC) 431. Specifically, once signals SEN2 and LAT2 are considered to be turned off and the potential of a signal EQ2 is considered to be VDDSA+Vt6 (where Vt6 is a threshold voltage of the transistor NMOS6), the potentials of nodes SEN1 and N2 are considered to be the same. Thereafter, the potential of a signal BLC2 is considered to be VDDSA+Vt19 (where Vt19 is a threshold voltage of the transistor NMOS19) and the data of the temporary data cache (TDC) 434 is transmitted to the secondary data cache (SDC) 431. As a result, when the temporary data cache (TDC) 434 is in the "H" level, the data of the secondary data cache (SDC) 431 becomes "1." When the temporary data cache (TDC) 434 is in the "L" level, the data of the secondary data cache (SDC) 431 becomes "0."

In this way, the data is read from the even bit line BLe. Thereafter, at time t15 and time t16, a recovery operation is performed to reset each node and signal line.

Reading the odd bit line BLo is performed in a similar manner. In this case, the signal BLSo is considered to be in the "H" level and the signal BLSe is considered to be in the "L" level.

In FIG. 18, a voltage waveform at the time of one-time reading of the data is illustrated. When a multi-value data is read, the reading of the data is performed a plurality of times. In this case, by setting VCGRV to be different from other voltage values, it is possible to read data with a different threshold.

1.3 Advantages of Embodiment

In the case of the configuration according to the embodiment, the reliability of the reading operation may be improved. The advantages will be described below.

In a 3-dimensional stacked memory, the gate sizes of the memory cell transistors MT are different in the formed layers in some cases. For example, when the stack 24 has the shape illustrated in FIG. 7, the gate length is longer (the gate size is increased) on the side of the memory cell transistor MT located in the upper layer. As a result, for example, the data becomes more difficult to write in some cases (a writing speed is delayed). Thus, when the gate sizes are different, the variation in the threshold voltage of the memory cell transistors MT is different as a result of lengthy retention times, disturbance, or the like of the data. Thus, for example, the variation amount of the threshold voltage is larger when the memory cell transistor MT is located on the lower layer. Then, a reading failure may occur more easily occurs in a certain specific layer.

As a specific example, a relation between the threshold voltage variation amount and the gate size when the data of an "A" level is read will be described with reference to graphs (a) and (b) of FIG. 18. In graphs (a) and (b) of FIG. 18, a dotted line indicates a threshold voltage distribution of the memory cell transistors MT immediately after the data is written, and a solid line indicates a threshold voltage distribution after a long time has passed after the writing.

As illustrated in the drawing, for example, the variation amount of the threshold voltage is small in the memory cell transistors MT of the fourth layer in which the gate size is large. Therefore, even after the threshold voltage varies, the data may be read normally at a read level VA. Conversely, the variation amount of the threshold voltage is large in the memory cell transistors MT of the first layer in which the gate size is small. Therefore, the threshold voltage of some of the memory cell transistors MT may be equal to or less than the read level VA, and thus the data may not be read normally.

In order to read the data correctly from the memory cell transistors MT of which the threshold voltage is equal to or less than VA, the read level has to be lowered. However, in this method, the data may not be read normally from the memory cell transistors MT of the fourth layer. Thus, when the variation amount of the threshold voltage is different because of the different gate sizes, the optimum read level is different according to the layer. Therefore, failure bits are often generated as a result of read failures in a specific layer (the gate size).

The variation in the gate size occurs periodically since the variation is caused due to the structure of the memory cell array 111. That is, the failure bits are substantially uniformly distributed in a bit string that forms data of one page. Accordingly, when the failure bits are generated due to this reason, the number of failure bits is much greater than when the failure bits are generated as a result of sudden read failures. Further, the number of failure bits exceed the number of bits for which an error may be corrected through an ECC process, that is, data may not be read at all in some cases.

Accordingly, in the configuration according to the embodiment, the processing units (the zones) of ECC processes and the layers (the gate sizes) are matched to each other. Specifically, the data read from the memory cell transistors MT of a certain specific layer belongs to a specific zone. Accordingly, the variation in the gate size of the memory cell transistors MT in the zone is decreased. Thus, it is possible to reduce the variation in the reading characteristics of the memory cell transistors MT in the zone.

In other words, the data (bits) read from the layer in which the failure may easily occur belong to the same zone. Accordingly, the number of failure bits occurring in the other zones may be reduced, and thus the data may be correctly read. Accordingly, it is possible to improve the reliability of the reading of the data. Of course, in the zone corresponding to the layer in which the failure easily occurs, there is a possibility that the number of failure bits generated as a result of the failure can be rarely remedied through ECC. However, such data may be read correctly according to a method of a second embodiment. The details of this method will be described in the second embodiment.

The specific examples of the above-described advantages will be described with reference to tables (a) and (b) of FIG. 19. In tables (a) and (b) of FIG. 19, a case in which the failure occurs easily in the memory cell transistor of the first layer will be depicted.

Table (a) of FIG. 19 shows, for example, a case in which the zones and the layers do not correspond, that is, a case in which the data of all the layers is included in each zone. Specifically, the layers and IO correspond, the sense amplifier units SAU corresponding to the first layer are connected to the signal IO[0] and IO[4], the sense amplifier units SAU corresponding to the second layer are connected to the signal lines IO[1] and IO[5], the sense amplifier units SAU corresponding to the third layer are connected to the signal lines IO[2] and IO[6], and the sense amplifier units SAU corresponding to the fourth layer are connected to the signal lines IO[3] and IO[7]. The bit lines BL0 to BL7 correspond to SAU0 to SAU7 and IO[0] to IO[7], respectively.

As illustrated in the drawing, when the data of the memory cell transistors MT of the first layer cannot be normally read, the failure bit is generated in the input/output signals I/O[0] and I/O[4] corresponding to the first layer in all of the zones. The failure occurs periodically in the page. When the number of failure bits exceeds a threshold number in the ECC process, the ECC circuit 260 cannot perform error correction. As a result, there is a high possibility of the data not being read throughout all of the zones, that is, the entire page.

Table (b) of FIG. 19 shows a case of the embodiment. In the case of the embodiment, the data read from the first layer belongs to zone 0. Accordingly, the failure bits are concentrated in zone 0. As a result, since the occurrence number of failure bits is reduced in zone 1 corresponding to the second layer, zone 2 corresponding to the third layer, and zone 3 corresponding to the fourth layer, the ECC process may be performed, and thus the data may be normally read.

By causing the zones and the layers to correspond to each other, it is possible to improve the reliability of the reading of the data. By shifting the read level and re-reading the data in zone 0, it is possible to normally read the data. This will be described in the second embodiment.

2. Second Embodiment

Next, a semiconductor memory device and a memory system according to the second embodiment will be described. In the embodiment, for example, as described in FIGS. 18 and 19 in the first embodiment, the voltage VCGRV to be applied to the selected word line WL is shifted and the data is re-read in the zones in which the reading operation may not be normally performed because of, for example, the variation in the threshold voltage of the memory cell transistors MT.

Hereinafter, only differences from the first embodiment will be described.

2.1 Shift Reading

A NAND flash memory 100 according to the embodiment performs a shift reading operation in addition to a normal reading operation (hereinafter referred to as "normal reading") when data is read according to a command from the controller 200. The shift reading operation refers to an operation of repeating the reading of data while shifting the reading voltage VCGRV applied to the selected word line WL at the time of reading when the ECC process fails due to the variation in the threshold voltage of the memory cell transistor MT because of a lengthy retention time, disturbance, or the like of the data, as described with reference to graphs (a) and (b) of FIG. 18. Hereinafter, a success case of the ECC process is referred to as "the ECC process passed" and a failure case of the ECC process is referred to as "the ECC process failed."

2.1.1 Shift Table

When VCGRV is shifted, a voltage shift amount is determined based on information retained in a shift table stored in, for example, the internal memory 220 of the controller 200 or, for example, the register 123 of the NAND flash memory 100. Hereinafter, the shift table according to the embodiment will be described with reference to FIG. 20 depicting a case in which the shift table is stored in the internal memory 220.

As illustrated in the drawing, the shift table retains the shift amount of VCGRV according to the number of time the data is re-read (hereinafter, the number of retries) for each even bit line BLe and odd bit line BLo when data of the "A," "B," and "C" levels is read. Specifically, when the data of the "A" level is read, a shift amount of VCGRV corresponding to the even bit line BLe is assumed to be Vs_AE_g according to the number of retries g (where g is a natural number of 1 to L and L is a natural number equal to or greater than 1) and a shift amount of VCGRV corresponding to the odd bit line BLo is assumed to be Vs_AO_g. Similarly, when the data of the "B" level is read, a shift amount corresponding to the even bit line BLe is assumed to be Vs_BE_g and a shift amount corresponding to the odd bit line BLo is assumed to be Vs_BO_g. When the data of the "C" level is read, a shift amount corresponding to the even bit line BLe is assumed to be Vs_CE_g and a shift amount corresponding to the odd bit line BLo is assumed to be Vs_CO_g.

For example, when the data of the "A" level is read, the shift amount of VCGRV is Vs_AE_1 at the first shift reading in the even bit line BLe. Similarly, a shift amount of VCGRV is Vs_AO_1 at the first shift reading in the odd bit line BLo. The same applies to the "B" level and the "C" level.

Figure 21:
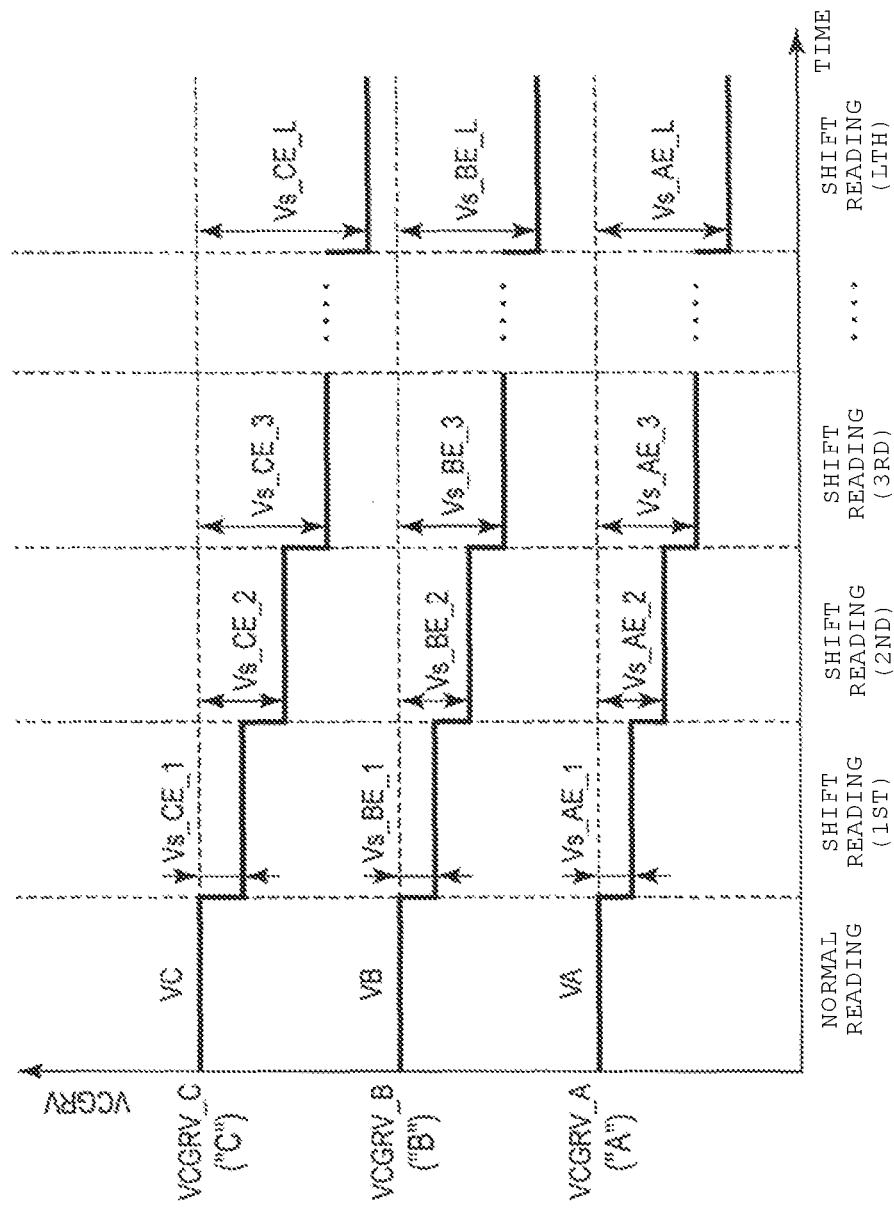
FIG. 21 is a timing diagram illustrating a change in the potential of the selected word lines during shift reading in a semiconductor memory device according to the second embodiment.

Next, an example of the shift of VCGRV applied to the selected word line WL will be described with reference to FIG. 21. In the example of FIG. 21, a case will be described in which the threshold voltage of the memory cell transistor MT is shifted to the minus side in the even bit line BLe, a shift amount |Vs_AE_g| corresponding to the "A" level at which the threshold voltage is low, is the smallest, and a shift amount |Vs_CE_g| corresponding to the "C" level at which the threshold voltage is high, is the largest. That is, the shift amounts Vs_AE_g, Vs_BE_g, and Vs_CE_g satisfies a relation of "0V>Vs_AE_g>Vs_BE_g>Vs_CE_g". Accordingly, VCGRV corresponding to the reading of the data at each level is stepped down when the shift reading is repeated.

For example, the voltages VCGRV at the time of reading the data at the "A," "B," and "C" levels are assumed to be VCGRV_A, VCGRV_B, and VCGRV_C, respectively. The voltages of VCGRV at the time of normal reading are assumed to be VCGRV_A=VA, VCGRV_B=VB, and VCGRV_C=VC, respectively. Then, as illustrated in the drawing, VCGRV_A is shifted from VA by Vs_AE_1 to become VA+Vs_AE_1 at the first shift reading in the even bit line BLe. Similarly, VCGRV_B becomes VB+Vs_BE_1 and VCGRV_C becomes VC+Vs_CE_1. Similarly, VCGRV_A to VCGRV_C at an Lth shift reading become VCGRV_A=VA+Vs_AE_L, VCGRV_B=VB+Vs_BE_L, and VCGRV_C=VC+Vs_CE_L.

Similarly, in the case of the odd bit line BLo, VCGRV_A to VCGRV_C at the Lth shift reading become VCGRV_A=VA+Vs_AO_L, VCGRV_B=VB+Vs_BO_L, and VCGRV_C=VC+Vs_CO_L.

The shift amount may be the same value in the even bit line BLe and the odd bit line BL0.

In the following description, the shift amount is denoted simply by Vshift when the shift amounts are not distinguished from each other.

2.1.2 Change in Voltage of Selected Word Line at Time of Shift Reading

Figure 22:
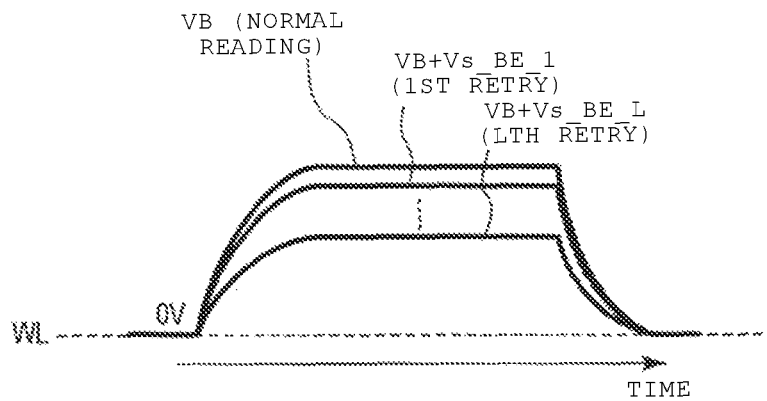
FIG. 22 is a timing diagram illustrating voltages applied to the selected word line at the time of reading data of low bits in the semiconductor memory device according to the second embodiment.
Figure 23:
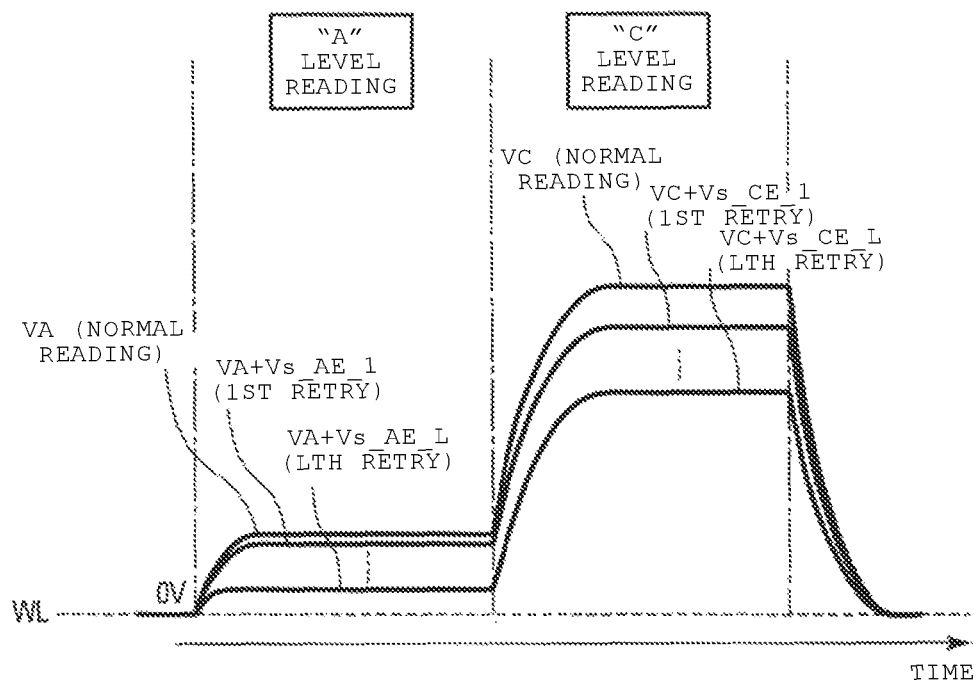
FIG. 23 is a timing diagram illustrating voltages applied to the selected word line at the time of reading data of high bits in the semiconductor memory device according to the second embodiment.

Next, a case in which the data is read from the memory cell transistors MT corresponding to the even bit lines BLe in regard to VCGRV applied to the selected word lines WL when pages of lower bits and upper bits is read will be exemplified with reference to FIGS. 22 and 23.

First, the case in which the page of the lower bits is read will be described. As illustrated in FIG. 22, when the voltage VCGRV corresponding to the "B" level is applied to the selected word line WL, the sense amplifier 113 determines whether the memory cell transistor MT retains the data of the "E" or "A" level. Otherwise, the sense amplifier 113 determines whether the memory cell transistor MT retains the data of the "B" or "C" level. Accordingly, in the timing diagram described in FIG. 17, the row decoder 112 applies VB to the selected word line WL at the time of normal reading, applies VB+Vs_BE_1 to the selected word line WL at the time of first shift reading, and applies VB+Vs_BE_L to the selected word line WL at the time of Lth shift reading.

Next, a case in which the page of the upper bits is read will be described. As illustrated in FIG. 23, when the voltage VCGRV corresponding to the "A" level is applied to the selected word line WL in the reading of the upper bits, the sense amplifier 113 determines whether the memory cell transistor retains the data of the "E" level. When the voltage VCGRV corresponding to the "C" level is applied to the selected word line WL in the reading of the upper bits, the sense amplifier 113 determines whether the memory cell transistor retains the data of the "C" level. Accordingly, the timing diagram described in FIG. 17 is repeated twice. The order of the reading corresponding to the "A" level and the reading corresponding to the "C" level is not particularly limited.

When the data of the "A" level is read at the time of normal reading, the row decoder 112 applies VA to the selected word line WL. When the data of the "C" level is read, the row decoder 112 applies VC to the selected word line WL. When the data of the "A" level is read at the time of the first shift reading, the row decoder 112 applies VA+Vs_AE_1 to the selected word line WL. When the data of the "C" level is read, the row decoder 112 applies VC+Vs_CE_1 to the selected word line WL. Similarly, when the data of the "A" level is read at the time of Lth shift reading, the row decoder 112 applies VA+Vs_AE_L to the selected word line WL. When the data of the "C" level is read, the row decoder 112 applies VC+Vs_CE_L to the selected word line WL.

2.2 Overall Operation of Memory System

Figure 24:
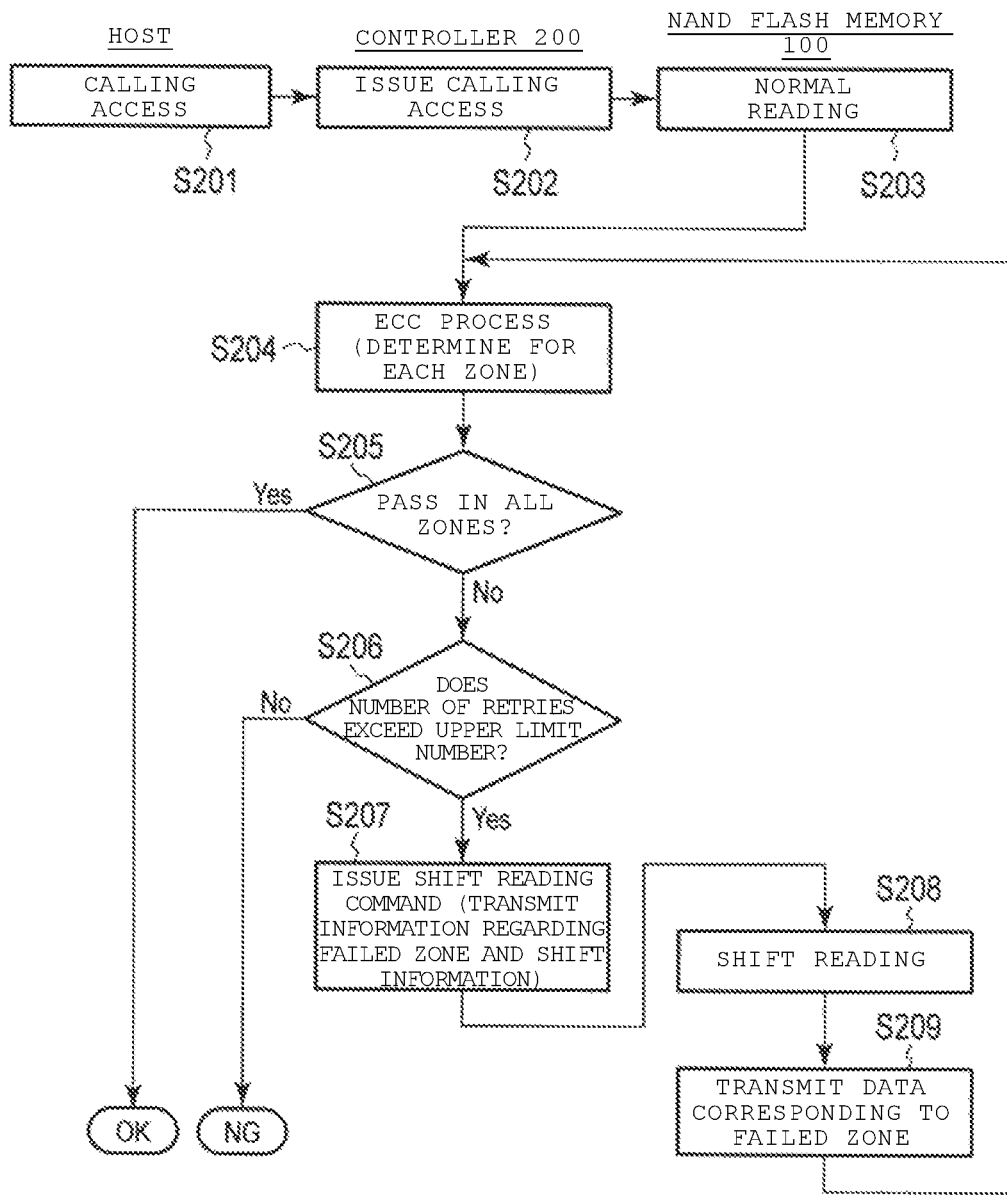
FIG. 24 is a flowchart illustrating an operation of a controller at the time of reading data in the memory system according to the second embodiment.

Next, an overall operation of the memory system 1 according to the embodiment will be described with reference to FIG. 24.

First, when the CPU 230 of the controller 200 receives a reading access from a host apparatus (step S201), the CPU 230 issues a reading command along with address information and the NAND interface circuit 250 transmits the reading command the address information to the NAND flash memory 100 (step S202).

The sequencer 121 of the NAND flash memory 100 performs the normal reading in response to the reading command (step S203). That is, the sequencer 121 reads corresponding data (including the error correction code and the error detection code).

Next, the data read in step S203 is retained in, for example, the buffer memory 240 of the controller 200 via the NAND interface circuit 250. Then, the ECC circuit 260 performs the ECC process and determines pass/fail of the ECC process for each zone (step S204).

Next, when the ECC process passes in all of the zones (Yes in step S205), the ECC process of this page ends. Then, the CPU 230 transmits the data subjected to the correction process from the host interface circuit 210 to the host apparatus and completes the reading operation.

Conversely, when the ECC process fails in any zone (No in step S205), that is, the number of failure bits in a certain zone is greater than the maximum number and the correction may not be performed, the CPU 230 confirms whether the number of retries g exceeds a preset upper limit number (1 to (L−1)) (step S206). When the number of retries g exceeds the upper limit number (No in step S206), the CPU 230 determines that the data reading operation from the page fail.

When the number of retries g does not exceeds the upper limit number (Yes in step S206), the CPU 230 refers to the shift table. Then, the CPU 230 issues the address information, information regarding the failed zone, information regarding the voltage shift amount Vshift, and a shift reading command (step S207). The NAND interface circuit 250 transmits the address information, the information regarding the failed zone, the information regarding the voltage shift amount Vshift, and the shift reading command to the NAND flash memory 100.

The NAND flash memory 100 performs the shift reading in response to the received command (step S208). At this time, the row decoder 112 changes VCGRV according to the received information regarding the voltage shift amount Vshift.

Next, the sequencer 121 of the NAND flash memory 100 transmits data (including the error correction code and the error detection code) corresponding to the failed zone to the NAND interface circuit 250 based on the information regarding the failed zone received from the controller 200 (step S209). The CPU 230 retains the received data in, for example, the buffer memory 240. Then, the process returns to step S204 and the ECC circuit 260 performs the ECC process on the received data. The CPU 230 repeatedly performs the shift reading until the ECC process is completed in all of the zones or the number of retries exceeds the set upper limit number.

2.3 Command Sequence of Reading Operation

Figure 25:
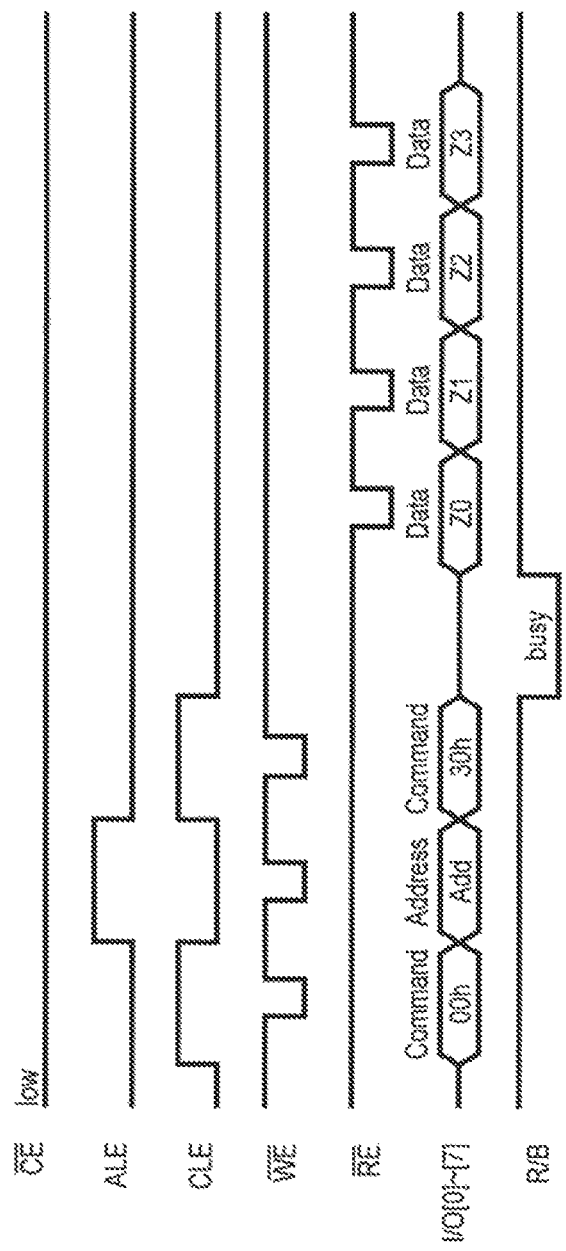
FIG. 25 is a timing diagram illustrating various signals at the time of normal reading in the memory system according to the second embodiment.
Figure 26:
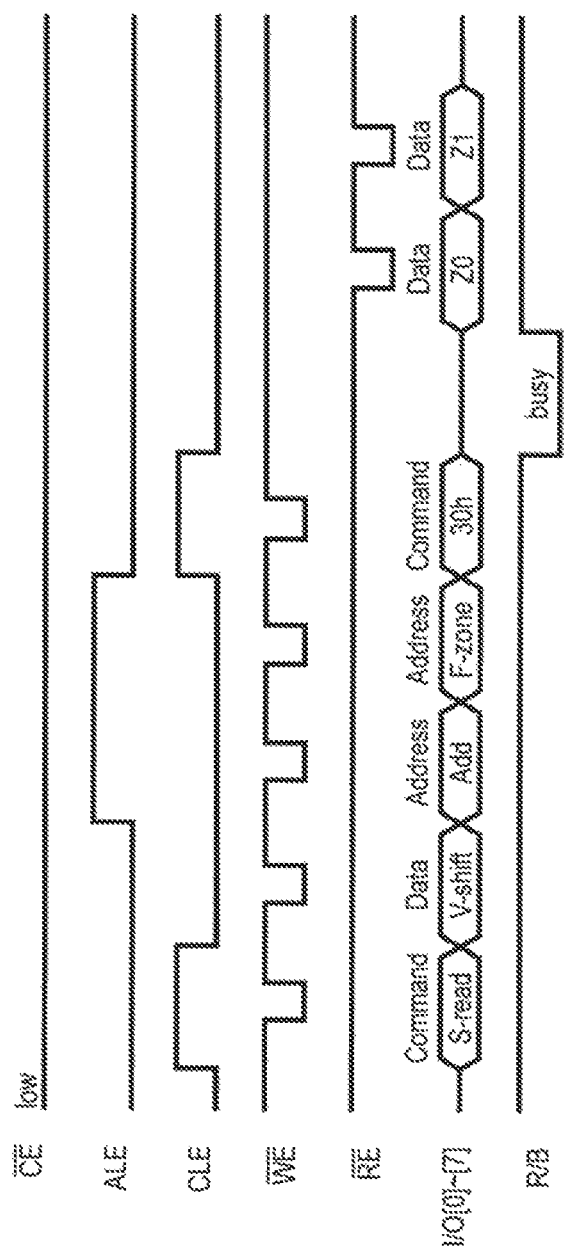
FIG. 26 is a timing diagram illustrating various signals at the time of shift reading in the memory system according to the second embodiment.

Next, a sequence of signals transmitted and received between the controller 200 and the NAND flash memory 100 at the time of reading the data will be described with reference to FIGS. 25 and 26.

The CPU 230 of the controller 200 transmits a chip enable signal /CE, an address latch enable signal ALE, a command latch enable signal CLE, a write enable signal /WE, a read enable signal /RE from the NAND interface circuit 250 to the NAND flash memory 100. The NAND flash memory 100 transmits a read/busy signal R/B to the NAND interface circuit 250. The input/output signals I/O[0] to I/O[7] are, for example, 8-bit data transmitted and received between the NAND interface circuit 250 of the controller 200 and the NAND flash memory 100.

The chip enable signal /CE enables the NAND flash memory 100 and is asserted at a low level. The address latch enable signal ALE indicates that the input/output signals I/O[0] to I/O[7] are addresses and is asserted at a high level. The command latch enable signal CLE indicates that the input/output signals I/O[0] to I/O[7] are signals for a command and is asserted at the high level. The write enable signal /WE writes each piece of data on the NAND flash memory 100 and asserts /WE at the low level when the CPU 230 issues, for example, a command, an address, and data. Accordingly, when /WE is toggled, the signal is received by the NAND flash memory 100. The read enable signal /RE reads each piece of data from the NAND flash memory 100 by the CPU 230 and is asserted at the low level. The read/busy signal R/B indicates whether the NAND flash memory 100 is in a busy state (whether the NAND flash memory 100 is in a state in which a command is not receivable) and enters the low level at the time of the busy state.

First, a timing diagram at the time of normal reading will be described with reference to FIG. 25. As illustrated in the drawing, the CPU 230 of the controller 200 issues a command "00h" reporting that the reading is performed and asserts the command latch enable signal CLE (the "H" level).

Next, the CPU 230 issues address data "Add" and asserts the address latch enable signal ALE (the "H" level). In the example of FIG. 25, a case in which the CPU 230 transmits the address data at one cycle of the write enable signal /WE is illustrated, but the address data may be transmitted at a plurality of cycles.

Next, the CPU 230 issues a command "30h" to perform the reading and asserts the command latch enable signal CLE (the "H" level).

These commands and addresses are stored in, for example, the register 123 of the NAND flash memory 100.

Next, the NAND flash memory 100 starts the reading in response to the command "30h" and enters the busy state (ready/busy signal R/B="L").

Thereafter, when the NAND flash memory 100 returns to the ready state, the CPU 230 toggles the read enable signal /RE. Then, the read data (including the error correction code and the error detection code) is transmitted from the NAND flash memory 100 to the controller 200 for each zone in synchronization with the read enable signal /RE. "Z0" to "Z3" indicate data of zone 0 to zone 3, respectively. In the example of FIG. 25, the case in which the data of each zone is transmitted at one cycle of the read enable signal /RE is illustrated. However, the data of each zone may be transmitted at a plurality of cycles since the data has a size of, for example, 1 K bits.

Next, a timing diagram at the time of shift reading will be described with reference to FIG. 26. As illustrated in the drawing, the CPU 230 first issues a command "S-read" reporting that the shift reading is performed and asserts the command latch enable signal CLE.

Next, the CPU 230 issues data "V-shift" indicating the voltage shift amount Vshift with reference to the shift table.

Next, the CPU 230 issues "F-zone" indicating address information of a page on which the shift reading is performed and address information of the failed zone and asserts the address latch enable signal ALE.

Next, the CPU 230 issues a command "30h" performing the reading and asserts the command latch enable signal CLE.

The commands, the data, and the addresses are stored in, for example, the register 123 of the NAND flash memory 100.

Next, the NAND flash memory 100 starts the reading operation and enters the busy state in response to the command "30h." At this time, with reference to the command "S-read" in the register, the sequencer 121 recognizes that an operation to be performed is not the normal reading but the shift reading. Further, the sequencer 121 comprehends the shift amount Vshift of the voltage VCGRV with reference to the data "V-shift" in the register. Then, the sequencer 121 performs the shift reading on the page corresponding to the address information "Add."

Thereafter, whenever the CPU 230 toggles the read enable signal /RE, the sequencer 121 transmits the data of the zone in which the ECC process failed to the controller 200 for each zone based on "F-zone" indicating the address information regarding the failed zone. In the example of FIG. 26, since the ECC process failed in zone 0 and zone 1, the sequencer 121 transmits data "Z0" and "Z1" of zone 0 and zone 1 to the controller 200.

2.4 Specific Example of Shift Reading

Figure 27:
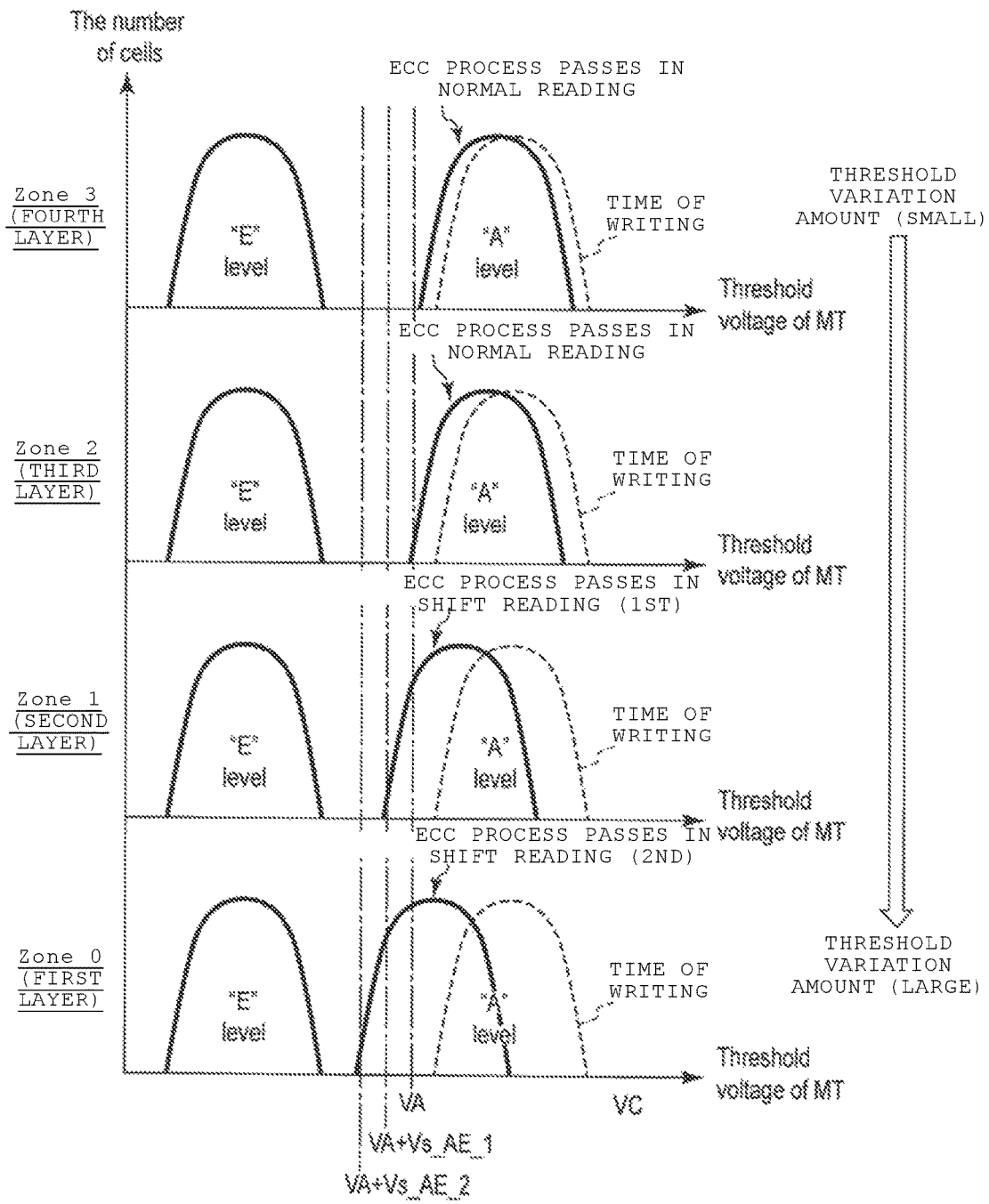
FIG. 27 is a diagram illustrating a shift in the threshold voltage distribution for each zone in the semiconductor memory device according to the second embodiment.

A case in which the data of the "A" level corresponding to the even bit line BLe is read will be described as a specific example of the shift reading described in the above-described section 2.3 with reference to FIG. 27. In this example, a case is illustrated in which the variation in the threshold voltage of the memory cell transistor MT corresponding to zone 0 is the largest and the variation in the threshold voltage of the memory cell transistor MT corresponding to zone 3 is the smallest.

As illustrated in the drawing, since a threshold voltage variation amount is small for the data of zone 2 and zone 3, the ECC process passes in the normal reading (read level VA). Specifically, since the variation in the threshold voltage is the smallest in the memory cell transistor MT corresponding to zone 3, the threshold voltage of all the memory cell transistors MT having the "A" level is equal to or greater than VA. On the other hand, the threshold voltage variation amount is larger in the memory cell transistors MT of zone 2 than in the memory cell transistors MT of zone 3. For example, the threshold voltage is equal to or less than VA in some of the memory cell transistors MT, but the number of failures may be processed in the ECC process. Therefore, in the normal reading, the ECC process passes in zone 2 and zone 3.

For the data of zone 1, since many failure bits (the memory cell transistors MT with the threshold voltage equal to or less than VA) are present at the time of normal reading, the ECC process fails and the ECC process passes in the first shift reading (the read level VA+Vs_AE_1).

For the data of zone 0, the ECC process also fails in the normal reading and the first shift reading and the ECC process passes in the second shift reading (read level VA+Vs_AE_2).

Figure 28:
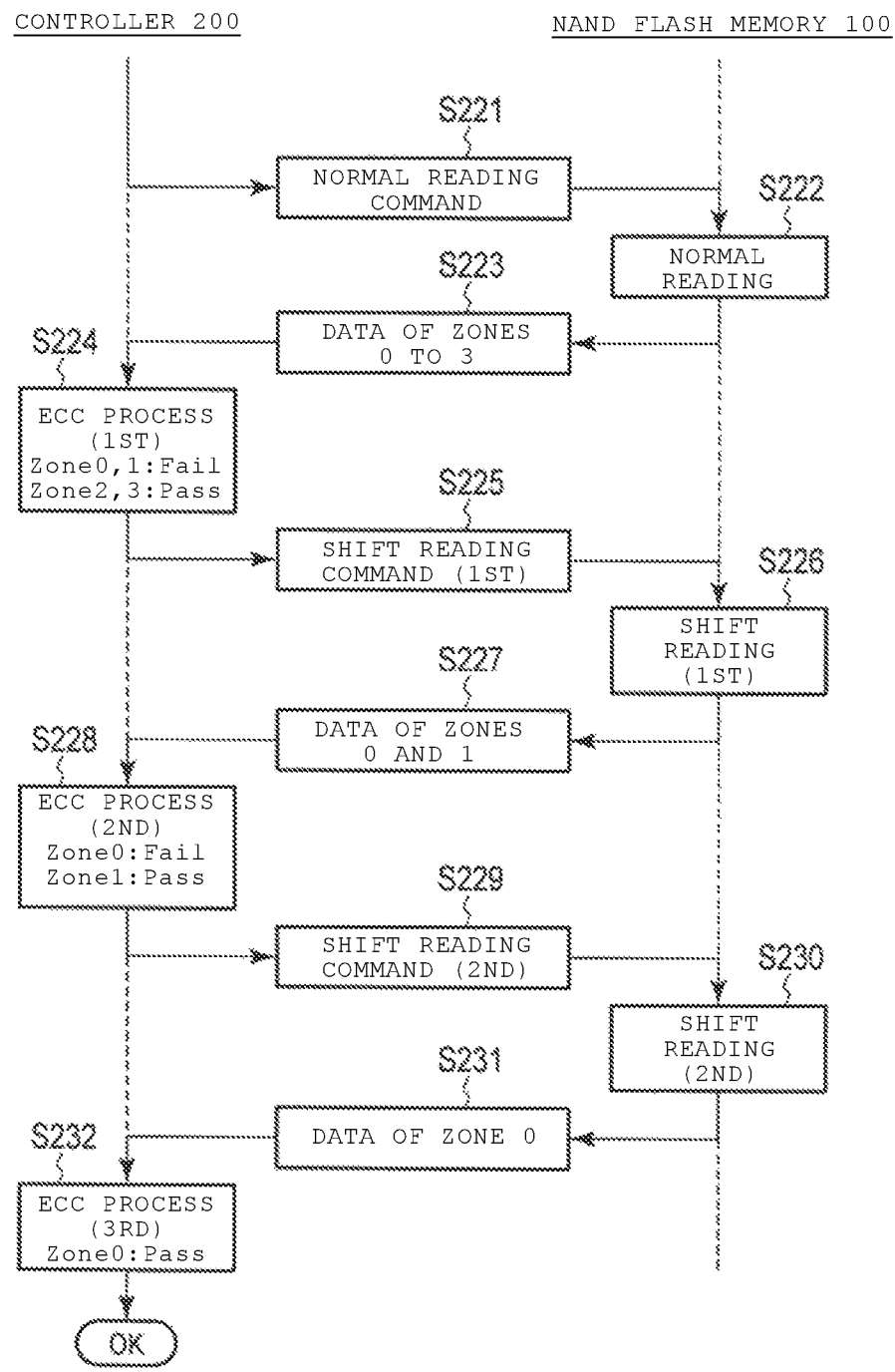
FIG. 28 is a flow diagram illustrating transmission and reception of data between a controller and a NAND flash memory at the time of reading data in the memory system according to the second embodiment.

Next, transmission and reception of the data between the controller 200 and the NAND flash memory 100 in the above-described example will be described with reference to FIG. 28.

As illustrated in the drawing, the controller 200 first transmits a normal reading command along with the address information (step S221). In response, the NAND flash memory 100 performs the normal reading (step S222) and transmits the data of all the zones to the controller 200 (step S223). The controller 200 performs the ECC process on the received data for each zone (step S224). The ECC process of step S224 fails in zone 0 and zone 1 and passes in zone 2 and zone 3.

Next, the controller 200 transmits the address information of the page, information regarding the failed zones, the information regarding the voltage shift amount Vshift, and the shift reading command in order to perform the shift reading on the failed zones (step S225). The NAND flash memory 100 performs the first shift reading in response to the command (step S226) and transmits the data of the zones (zone 0 and zone 1) in which the ECC process of the previous time fails to the controller 200 (step S227). The controller 200 performs the ECC process on the received data of zone 0 and zone 1 (step S228). The ECC process of step S228 fails in zone 0 and passes in zone 1.

Next, the controller 200 transmits the address information of the page, the information regarding the failed zones, the information regarding the voltage shift amount Vshift, and the shift reading command in order to perform the shift reading on the failed zones again (step S229). The NAND flash memory 100 performs the second shift reading in response to the command (step S230) and transmits the data of zone 0 in which the ECC process of the previous time fails to the controller 200 (step S231). The controller 200 performs the ECC process on the received data of zone 0 (step S232). The ECC process of step S232 passes in zone 0. The ECC process is completed.

2.5 Advantages of Embodiment

In the case of the configuration according to the embodiment, the same advantages as those of the first embodiment may be obtained.

In the configuration according to the embodiment, the data may be read at an optimum read level for each zone. For example, by shifting the read level and reading the data in FIGS. 18 and 19 of the first embodiment, the data of zone 0 corresponding to the first layer may be remedied. Therefore, it is possible to reduce the occurrence number of failure bits in each zone. Accordingly, it is easy to pass the ECC process, and thus it is possible to improve the reliability of the reading operation.

In the configuration according to the embodiment, at the time of shift reading, the transmission of the data from the NAND flash memory 100 to the controller 200 and the ECC process are not necessary for the zones in which the ECC process already passes. Therefore, it is possible to shorten the time for the ECC process at the time of the shift reading. Accordingly, it is possible to improve the processing speed at the time of reading.

3. Third Embodiment

Next, a semiconductor memory device and a memory system according to a third embodiment will be described. The third embodiment relates to the ECC process of the above-described first and second embodiments. Hereinafter, only differences from the first and second embodiments will be described.

3.1 Operation of ECC Process

In the third embodiment, a specific processing operation of the ECC circuit 260 in the flowchart described with reference to FIG. 28 will be described with reference to FIGS. 29 to 31.

In the third embodiment, the ECC circuit 260 performs error correction on the data through a 4-stage pipeline process performed by the syndrome calculation unit 265, the error location polynomial calculation unit 266, the chain search unit 267, and the error detection code decoder 268 of the decoding unit 264. Then, the ECC circuit 260 transmits the corrected data and a pass/fail determination result of the ECC process to, for example, the buffer memory 240.

As illustrated in tables (a) and (b) of FIG. 29 (step S224 of FIG. 28), all of the zones are targets of the ECC process at the time of normal reading. Therefore, the ECC circuit 260 sequentially processes the data of zone 0 to zone 3 and retains the results in, for example, the buffer memory 240.

Specifically, in step 1, the syndrome calculation unit 265 first calculates a syndrome using the data of zone 0.

Next, in step 2, the error location polynomial calculation unit 266 performs error location polynomial calculation based on the syndrome regarding zone 0 obtained in step 1. The syndrome calculation unit 265 calculates a syndrome using the data of zone 1 in parallel to the process of the error location polynomial calculation unit 266.

Next, in step 3, the chain search unit 267 specifies and corrects the location of an error in the data of zone 0 based on an error location polynomial calculation result regarding zone 0 obtained in step 2. The error location polynomial calculation unit 266 performs the error location polynomial calculation based on the syndrome regarding zone 1 obtained in step 2 in parallel to the process of the chain search unit 267. Further, the syndrome calculation unit 265 calculates a syndrome using the data of zone 2 in parallel.

Next, in step 4, the error detection code decoder 268 determines whether an error is present in the corrected data of zone 0 obtained in step 3. The chain search unit 267 specifies and corrects the location of the error in the data of zone 1 based on the error location polynomial calculation result regarding zone 1 obtained in step 3 in parallel to the process of the error detection code decoder 268. Further, the error location polynomial calculation unit 266 performs the error location polynomial calculation based on the syndrome regarding zone 2 obtained in step 3 in parallel. Further, the syndrome calculation unit 265 calculates a syndrome using the data of zone 3 in parallel.

In this way, the syndrome calculation unit 265, the error location polynomial calculation unit 266, the chain search unit 267, and the error detection code decoder 268 perform the data of each zone in parallel. The same applies to steps subsequent to step 5. In step 5 to step 8, the CPU 230 transmits the result of the ECC process for each zone to the buffer memory 240 to store the result. Specifically, when the ECC process passes, the CPU 230 transmits the corrected data and the determination result obtained in the error detection code decoder 268 to the buffer memory 240. When the ECC process fails, the CPU 230 transmits the determination result obtained in the error detection code decoder 268 to the buffer memory 240.

Accordingly, the buffer memory 240 retains the result of the ECC process on the data of zone 0 in step 5, retains the result of the ECC process on the data of zone 0 and zone 1 in step 6, retains the result of the ECC process on the data of zone 0 to zone 2 in step 7, and retains the result of the ECC process on the data of zone 0 to zone 3 in step 8. The order of zone 0 to zone 3 for which the ECC process is performed is not limited thereto, and may be appropriately changed. Further, the CPU 230 may transmit the corrected data for which the ECC process fails to the buffer memory 240 and may retain the data. In this case, the corrected data for which the ECC process fails is updated to new data at the time of retry reading to be described below.

Accordingly, in the case of the normal reading, the number of steps necessary until the results is stored in the memory from the start of the ECC process on the data of zone 0 to zone 3 is eight. In the example depicted in tables (a) and (b) of FIG. 29, the ECC process fails for zone 0 and zone 1 and the ECC process passes in zone 2 and zone 3. Accordingly, the CPU 230 retains the corrected data of zone 2 and zone 3 for which the ECC process passes in the buffer memory 240. The CPU 230 reads the data of zone 0 and zone 1 for which the ECC process fails from the NAND flash memory 100 again through the first shift reading. At this time, the data of zone 2 and zone 3 are not transmitted from the NAND flash memory 100 to the controller 200.

Next, as illustrated in tables (a) and (b) of FIG. 30 (step S228 of FIG. 28), the ECC circuit 260 performs the ECC process on the data of zone 0 and zone 1. In this case, the number of steps necessary to complete the ECC process is six. In the example depicted in tables (a) and (b) of FIG. 30, the ECC process fails for zone 0 and ECC process passes for zone 1 (zone 2 and zone 3 are not the target of the ECC process). As a result, the CPU 230 retains the corrected data of zone 1 in the buffer memory 240. Further, the CPU 230 reads the data of zone 0 for which the ECC process fails again from the NAND flash memory 100 through the second shift reading. Of course, the data of zone 1 to zone 3 at this time are not transmitted to the controller 200.

Next, as illustrated in tables (a) and (b) of FIG. 31 (step S232 of FIG. 28), the ECC circuit 260 performs the ECC process on the data of zone 0. In this case, the number of steps necessary for the ECC process is five. In this way, when the number of failed zones is small, the number of steps necessary for the ECC process is reduced. In the example depicted in tables (a) and (b) of FIG. 31, the ECC process passes for zone 0 (zone 1 to zone 3 are not the target of the ECC process). That is, at this time, correct data after the error correction may be obtained for all of the data of zone 0 to zone 3. When the ECC process passes for all the zones, the CPU 230 transmits the corrected data of zone 2 and zone 3 read in the normal reading, the corrected data of zone 1 read in the first shift reading, and the corrected data of zone 0 read in the second shift reading as the data of the page to the host apparatus.

3.2 Advantages of Third Embodiment

As described above, to realize the ECC process described in the first and second embodiments, for example, the ECC process according to the third embodiment may be applied.

4. Fourth Embodiment

Next, a semiconductor memory device and a memory system according to a fourth embodiment will be described. In the fourth embodiment, the configuration of the memory cell array 111 in the first to third embodiments is modified. Hereinafter, only differences from the first to third embodiments will be described.

Figure 32:
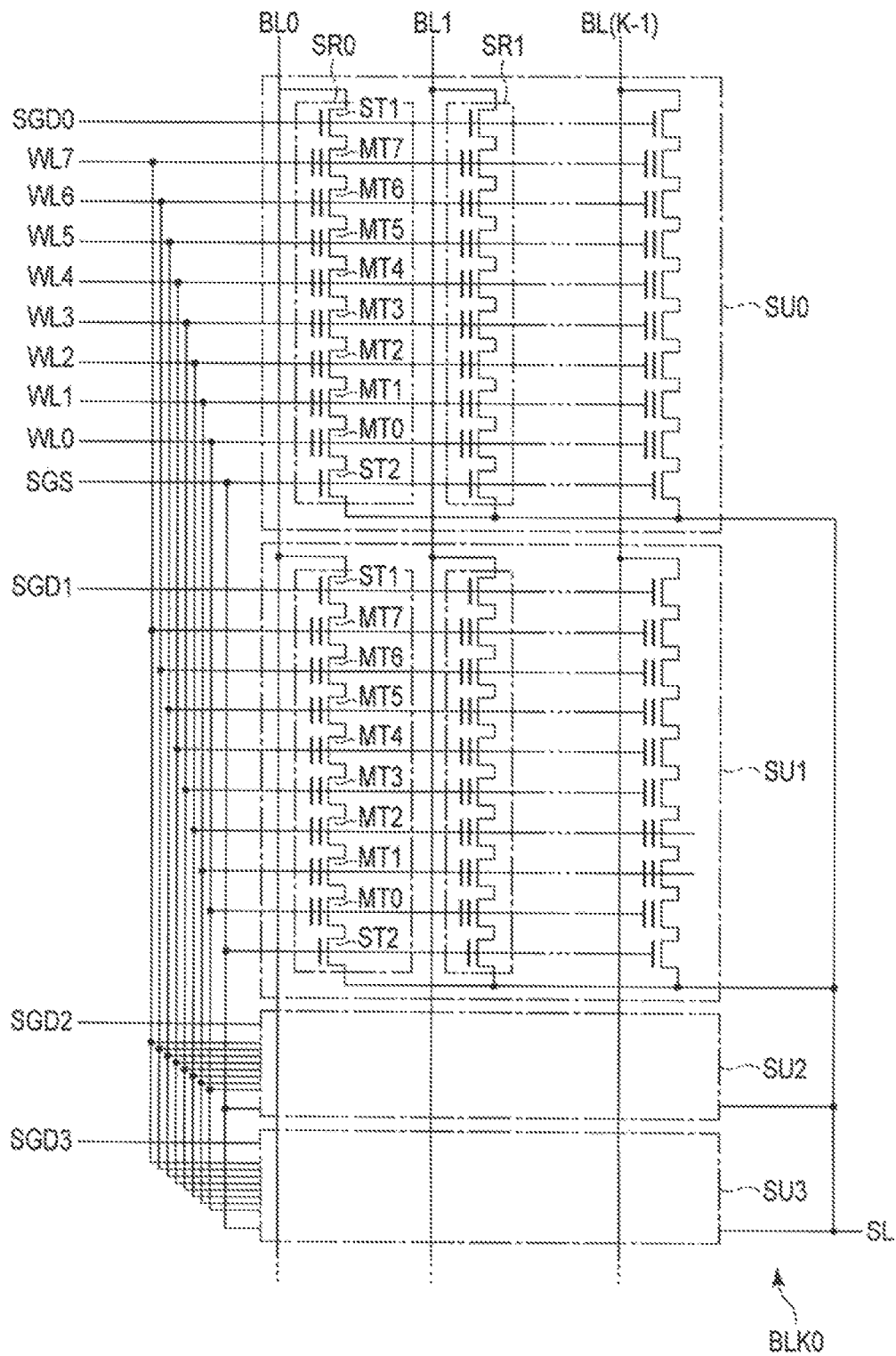
FIG. 32 is a circuit diagram illustrating a memory cell array included in a semiconductor memory device according to a fourth embodiment.

4.1 Configuration of Memory Cell Array First, the details of the configuration of the memory cell array 111 will be described with reference to FIG. 32 using the block BLK0 as an example. Further, the other blocks BLK have the same configuration.

As illustrated in the drawing, the block BLK0 includes, for example, four string units SU (SU0 to SU3). Each string unit SU includes a plurality of NAND strings SR.

Each of the NAND strings SR includes, for example, eight memory cell transistors MT (MT0 to MT7) and select transistors ST1 and ST2. The number of memory cell transistors MT is not limited to eight. However, for example, 16, 32, 64, or 128 memory cell transistors MT may be used and the number of memory cell transistors MT is not limited. The memory cell transistors MT0 to MT7 are connected in series. The memory cell transistor MT7 on one end side of the series connection is connected to the select transistor ST1 and the memory cell transistor MT0 on the other end side of the series connection is connected to the select transistor ST2.

The gates of the select transistors ST1 of the string units SU0 to SU3 are connected commonly to select gate lines SGD0 to SGD3, respectively. On the other hand, the gates of the select transistors ST2 are connected commonly to the same select gate line SGS between the plurality of string units. The control gates of the memory cell transistors MT0 to MT7 present inside the same block BLK0 are connected commonly to word lines WL0 to WL7, respectively.

That is, the word lines WL0 to WL7 and the select gate lines SGS are connected commonly between the plurality of string units SU0 to SU3 in the same block BLK, and the select gate lines SGD are independent in the every string units SU0 to SU3 even in the same block BLK.

In the NAND strings SR provided in a matrix state inside the memory cell array 111, the select transistors ST1 of the NAND strings SR at the same row are connected commonly to any of the bit lines BL (BL0 to BL (K−1) and (K−1) is a natural number equal to or greater than 1). That is, the bit lines BL commonly connect the NAND strings SR between the plurality of blocks BLK. The other end of the current path of the select transistors ST2 are connected commonly to a source line SL. For example, the source line SL commonly connects the NAND strings SR between the plurality of blocks.

Figure 33:
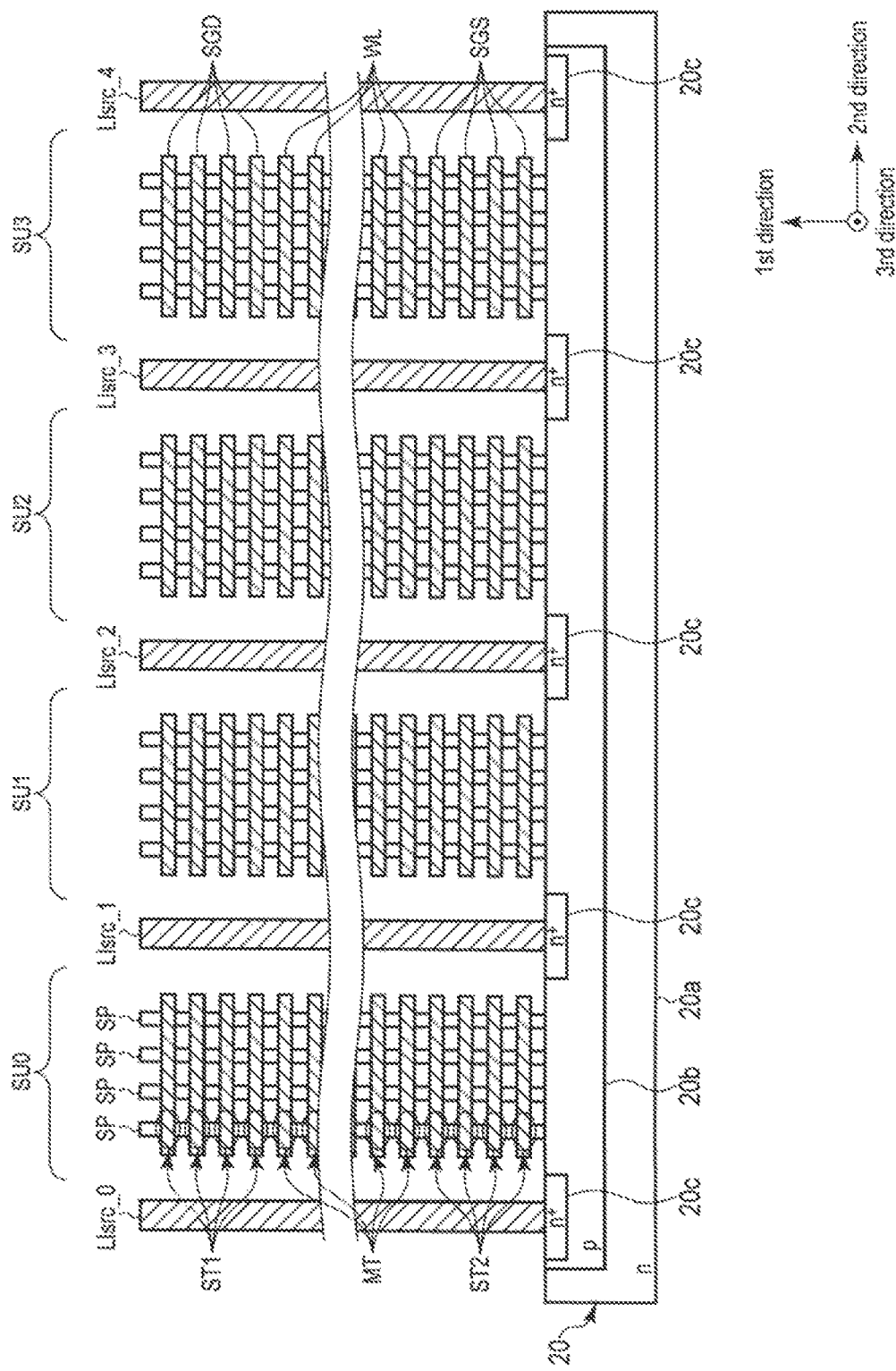
FIG. 33 is a sectional view illustrating the memory cell array included in the semiconductor memory device according to the fourth embodiment.
Figure 34:
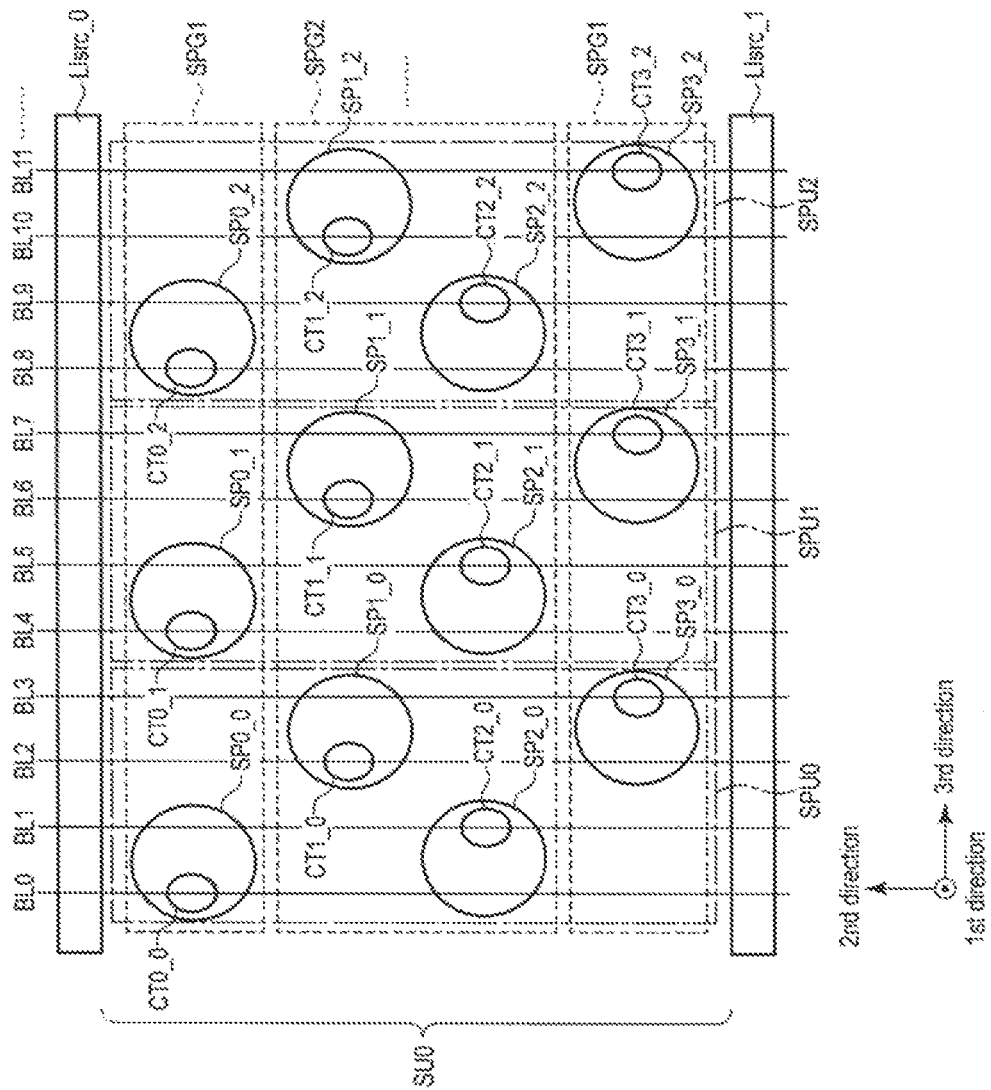
FIG. 34 is a plan view illustrating the memory cell array included in the semiconductor memory device according to the fourth embodiment.

Next, the planar structure and the cross-sectional structure of the NAND flash memory 100 according to the embodiment will be described with reference to FIGS. 33 and 34.

As illustrated in the drawings, the NAND strings SR are formed in a first direction which is a vertical direction to the surface of a semiconductor substrate 20. The NAND strings SR are connected commonly to the word lines WL and the select gate lines SGD and SGS for each string unit. More specifically, an n type well 20a is provided in the semiconductor substrate 20 and a p type well 20b is provided on the surface region of the n type well 20a. Further, n$^+$ type diffusion layers 20c are provided on the surface region of the p type well 20b. A plurality of wiring layers functioning as the select gate lines SGS, a plurality of wiring layers functioning as the word lines WL, and a plurality of wiring layers functioning as the select gate lines SGD are sequentially stacked on the semiconductor substrate 20. The plurality of wiring layers functioning as the word lines WL are stacked as, for example, eight layers and function as the word lines WL0 to WL7 described with reference to FIG. 32 from the lower layer. Further, insulation films (not illustrated) are formed between the respective wiring layers.

Further, memory holes that reach the p type well 20b are formed to penetrate through these wiring layers and insulation films. A block insulation film, a charge accumulation layer, and a tunnel insulation film (none of which are illustrated) are sequentially formed on the side surface of the memory hole and the inside of the memory hole is embedded by a semiconductor layer. The semiconductor layer is a region in which a channel is formed when the memory cell transistors MT and the select transistors ST1 and ST2 operate. Hereinafter, the semiconductor layer embedded inside the memory hole is referred to as a "semiconductor pillar SP." A contact plug (hereinafter referred to as a bit line contact CT) is formed on the upper surface of the semiconductor pillar SP, and each bit line contact CT in the string unit is connected to a different bit line BL. The memory cell transistors MT0 to MT7 are formed by the semiconductor pillars SP and the word lines WL0 to WL7. Similarly, the select transistors ST1 and ST2 are formed by the semiconductor pillars SP and the select gate lines SGD and SGS. In FIG. 32, the select gate lines SGD and SGS are provided in four layers. The select gate lines SGD and SGS are electrically connected commonly to substantially function as the gate electrodes of one select transistor ST1 and one select transistor ST2. Further, the select gate lines SGD and SGS may be provided in one or more layers and the number of layers is not limited.

On the semiconductor substrate 20, contact plugs (hereinafter referred to as source line contacts LIsrc) having a line shape in the third direction are formed when viewed from the upper surface (that is, on a plane formed in the second and third directions). The bottom surface of the source line contact LIsrc is connected to the n$^+$ type diffusion layers 20c and the upper surface of the source line contact LIsrc is connected to the source line SL. The plurality of source line contacts LIsrc are arranged periodically in the second direction, and one string unit SU is provided between two source line contacts LIsrc. In the example of FIG. 33, the string unit SU0 is provided between a source line contact LIsrc_0 and a source line contact LIsrc_1, and the string unit SU1 is provided between the source line contact LIsrc_1 and a source line contact LIsrc_2. When the source line contacts LIsrc_0, LIsrc_1, and the like are not distinguished from each other, the source line contacts LIsrc_0, LIsrc_1, and the like are simply referred to as the source line contacts LI.

The semiconductor pillars SP in each string unit SU are arranged in, for example, a staggered array of four lines. Specifically, as illustrated in FIG. 34, on the plane formed in the second and third directions, the semiconductor pillars SP0 to SP3 are arrayed in the second direction sequentially from the side of the source line contact LIsrc_0 formed in the line shape in the third direction, and the semiconductor pillar SP3 is arranged at a location closest to the source line contact LIsrc_1.

More specifically, a semiconductor pillar SP0_j (where j is a natural number equal to or greater than 0) is arranged at a location closest to the source line contact LIsrc_0 in the second direction. The semiconductor pillars SP0_0, SP0_1, SP0_2, and the like are arranged in the third direction to be mutually adjacent to the source line contact LIsrc_0.

The semiconductor pillar SP1_j is arranged to be located between the semiconductor pillars SP0_j and SP2_j in the second direction. The semiconductor pillar SP1_0 is arranged to be located between the semiconductor pillar SP0_0 and the semiconductor pillar SP0_1 in the third direction, and the semiconductor pillar SP1_1 is arranged to be located between the semiconductor pillar SP0_1 and the semiconductor pillar SP0_2 in the third direction. The same applies to the semiconductor pillar SP1_2, and the like The semiconductor pillar SP2_j is arranged to be located between the semiconductor pillar SP1_j and SP3_j in the second direction. The semiconductor pillars SP2_0, SP2_1, SP2_2, and the like are arranged at the same locations as the semiconductor pillar SP0_0, SP0_1, SP0_2, and the like in the third direction.

The semiconductor pillar SP3_j is arranged to be located between the semiconductor pillar SP2_n and the source line contact LIsrc_1 in the second direction. The semiconductor pillars SP3_0, SP3_1, SP3_2, and the like are arranged at the same locations as the semiconductor pillars SP1_0, SP1_1, SP1_2, and the like in the third direction. That is, the semiconductor pillars SP0_j to SP3_j are arranged to be located alternately in the third direction.

The bit line BL to which the semiconductor pillar SP j is connected via the bit line contact CT may be denoted by BL(4j+C) (where C=0: the semiconductor pillar SP0, C=1: the semiconductor pillar SP2, C=2: the semiconductor pillar SP1, and C=3: the semiconductor pillar SP3). Specifically, the semiconductor pillar SP0_j (where C=0) is connected to the bit line BL(4j) via the bit line contact CT0_j. The semiconductor pillar SP2_j (where C=1) is connected to the bit line BL(4j+1) via the bit line contact CT2_j. The semiconductor pillar SP1_j (where C=2) is connected to the bit line BL(4j+2) via the bit line contact CT1_j. The semiconductor pillar SP3_j (where C=3) is connected to the bit line BL(4j+3) via the bit line contact CT3_j.

In the embodiment, a set of four semiconductor pillars SP0_j, SP1_j, SP2_j, and SP3_j is defined as one semiconductor pillar unit SPUj. Specifically, a unit formed by the semiconductor pillars SP0_0 to SP3_0 is defined as a semiconductor pillar unit SPU0 and a unit formed by the semiconductor pillars SP0_1 to SP3_1 is defined as a semiconductor pillar unit SPU1. The same applies to the other semiconductor pillars SP.

The semiconductor pillars SP0 and SP3 mutually adjacent to the source line contact LIsrc are classified as a first semiconductor pillar group SPG1, and the semiconductor pillars SP1 and SP2 not mutually adjacent to the source line contact LIsrc are classified as a second semiconductor pillar group SPG2.

In the first semiconductor pillar group SPG1 and the second semiconductor pillar group SPG2, the diameters of the memory holes, that is, the gate sizes, are different in some cases because of a positional relation with the source line contacts LIsrc when the memory holes are etched. Hereinafter, in the embodiment, a case will be exemplified in which the gate sizes of the memory cell transistors MT belonging to the semiconductor pillars SP0 and SP3 of the first semiconductor pillar group SPG1 are small and the variation in the threshold voltage of the memory cell transistors MT is large due to lengthy data retention times or the like.

4.2 Configuration of Column System Circuit

Next, the configuration of the column system circuit according to the embodiment will be described. Hereinafter, the sense amplifier unit and the column decoder will be described as a specific example of the column system circuit.

4.2.1 Connection Between Sense Amplifier Units and Column Decoder

First, the connection between the sense amplifier 113 and the column decoder 114 according to the embodiment will be described with reference to FIG. 35.

The sense amplifier unit SAU according to the embodiment is a unit of a current sense scheme that senses a current flowing in the bit lines BL. As illustrated in the drawing, one sense amplifier unit SAU is provided in one bit line BL. One latch circuit XDL is connected to each sense amplifier unit SAU, and data is input and output from the latch circuit XDL to the signal line IO. The column decoder 114 controls the input and output of the data in the latch circuit XDL.

In the embodiment, four latch circuits XDL corresponding to one semiconductor pillar unit SPUj are connected commonly to any signal line IO of the signal lines IO(0) to IO(7) through which data is input and output by the controller 200. Specifically, the latch circuits XDL0 to XDL3 corresponding to the semiconductor pillar unit SPU0 are connected commonly to the signal line IO(0), and the latch circuits XDL4 to XDL7 corresponding to the semiconductor pillar unit SPU1 are connected commonly to the signal line IO(1). Accordingly, the eight semiconductor pillar units SPU form one group corresponding to the signal lines IO(0) to IO(7). In the example in FIG. 35, the semiconductor pillar units SPU0 to SPU7 form one group corresponding to the signal lines IO(0) to IO(7). Further, the semiconductor pillar units SPU8 to SPU15 form another group corresponding to the signal lines IO(0) to IO(7).

The four latch circuits XDL corresponding to one semiconductor pillar unit SPUj are connected to different column select lines CSL, respectively. That is, the four latch circuit XDL are connected to the different column select lines CSL for each semiconductor pillar SP. In the eight semiconductor pillar units SPUj belonging to one group, the eight latch circuits XDL corresponding to the same semiconductor pillar SP are connected commonly to the same column select line CSL. Accordingly, the column decoder 114 selects the eight latch circuits XDL corresponding to the same semiconductor pillar SP by selecting one column select line CSL.

For example, when the column decoder 114 selects the column select line CSL0, the eight latch circuits XDL0, XDL4, XDL8, XDL12, XDL16, XDL20, XDL24, and XDL28 corresponding to the semiconductor pillar SP0 are connected electrically to the signal lines IO(0) to IO(7), respectively, in the semiconductor pillar units SPU0 to SPU7. Further, when the column decoder 114 selects the column select line CSL1, the eight latch circuits XDL1, XDL5, XDL9, XDL13, XDL17, XDL21, XDL25, and XDL29 corresponding to the group of the semiconductor pillars SP2 are connected electrically to the signal lines IO(0) to IO(7), respectively. The same applies even when the column decoder 114 selects the column select line CSL2 or CSL3.

Next, a relation among the semiconductor pillar SP, the semiconductor pillar group SPG, the column select line CSL, and the latch circuit XDL corresponding to zone 0 to zone 3 will be described with reference to FIG. 36. In the embodiment, a normal page region of one page include four zones, as in FIG. 14 of the first embodiment.

As illustrated in the drawing, the data of the semiconductor pillar SP0 is allocated to zone 0, the data of the semiconductor pillar SP2 is allocated to zone 1, the data of the semiconductor pillar SP1 is allocated to zone 2, and the data of the semiconductor pillar SP3 is allocated to zone 3. Further, zone 0 and zone 3 correspond to the first semiconductor pillar group SPG1, and zone 1 and zone 2 correspond to the second semiconductor pillar group SPG2.

The numeral of the column select line CSL corresponding to the zone may be denoted by CSL(4n+C) (where n is a natural number equal to or greater than 0). Here, "4" is the number of sense amplifier units corresponding to one semiconductor pillar unit SPUj. The numerals of the eight latch circuits XDL corresponding to the column select line CSL (4n+C) may be denoted by XDL(32n+4x+C) when the numeral of the connected signal line IO is IO(x) (where x is a natural number of 0 to 7). C denotes the numeral of the semiconductor pillar SP, that is, the numeral of the corresponding zone and has the following relation:

C=0: the semiconductor pillar SP0 (zone 0);
C=1: the semiconductor pillar SP2 (zone 1);
C=2: the semiconductor pillar SP1 (zone 2); and
C=3: the semiconductor pillar SP3 (zone 3).

For example, the column select line CSL corresponding to zone 0 (where C=0) is CSL(4n). Further, the latch circuit XDL corresponding to the column select line CSL(4n) and corresponding to the signal line IO(0) (where x=0) is XDL (32n). For example, the column select line corresponding to zone 1 (where C=1) is CSL (4n+1) and the latch circuit XDL corresponding to the signal line IO(1) (where x=1) is XDL (32n+5).

4.2.2 Configuration of Sense Amplifier Circuit

Figure 37:
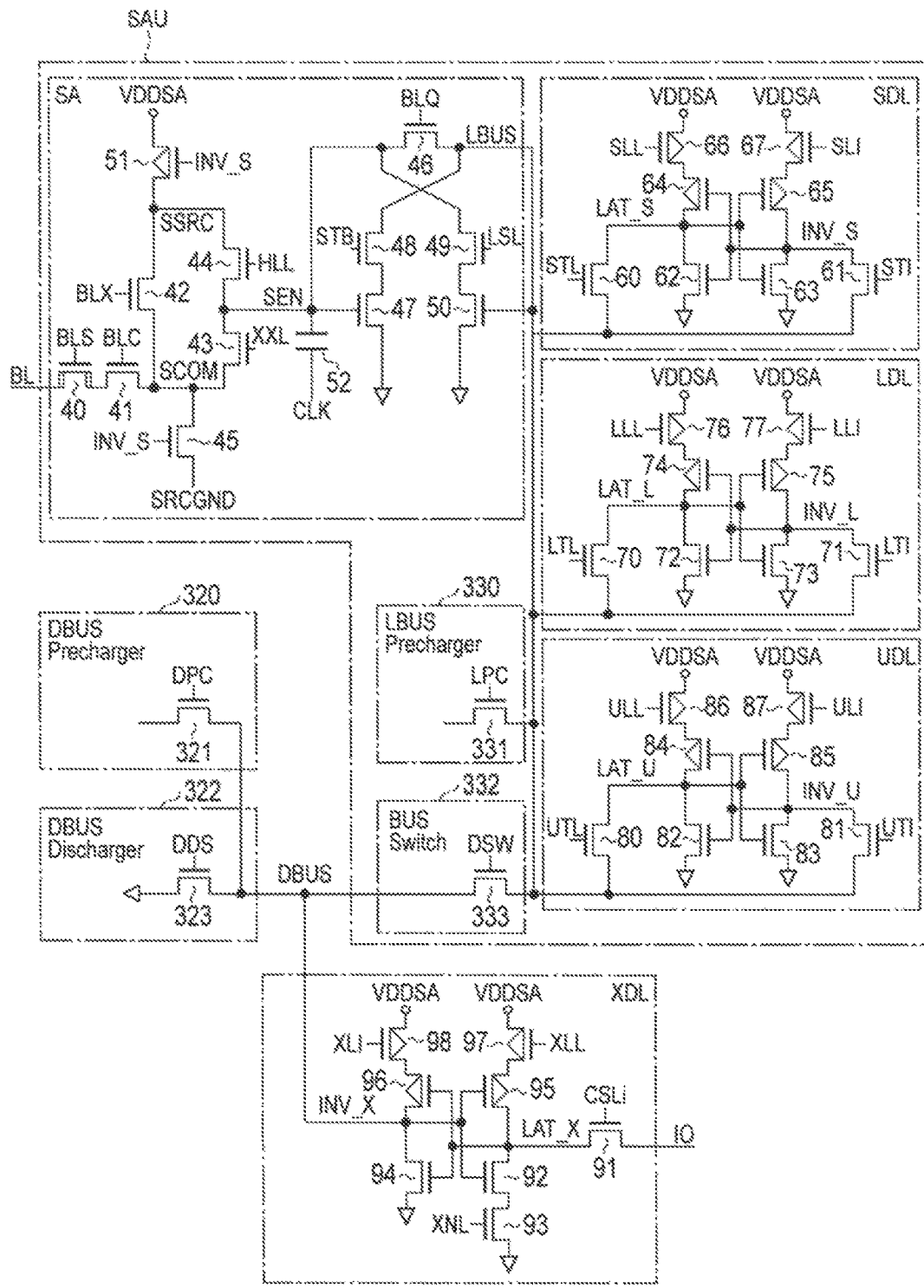
FIG. 37 is a circuit diagram illustrating sense amplifier units and the latch circuits included in the semiconductor memory device according to the fourth embodiment.

Next, the configuration of the sense amplifier 113 will be described with reference to FIG. 37. In the embodiment, the sense amplifier 113 of a current sense scheme that senses a current flowing in the bit line BL will be exemplified. In the current sense scheme, data of all the bit lines BL may be read collectively. Accordingly, the plurality of memory cell transistors MT connected commonly to one word line WL in one string unit SU of one block BLK are units referred to as a "page."

As illustrated in the drawing, the sense amplifier unit SAU includes a sense amplifier unit SA and three latch circuits SDL, LDL, and UDL. One sense amplifier unit SAU includes one latch circuit XDL. The sense amplifier unit SAU further includes a precharge circuit 330 and a bus switch 332.

The precharge circuit 330 precharges a bus LBUS. The precharge circuit 330 includes, for example, a low-pressure-resistant N-channel MOS transistor 331. One of the source and the drain of the transistor 331 is connected to the bus LBUS, and a signal LPC is input to the gate of the transistor 331. The precharge circuit 330 precharges the bus LBUS to a power source voltage VDDSA used in the sense amplifier unit SAU.

The bus switch 332 connects a bus DBUS to the bus LBUS. That is, the bus switch 332 includes, for example, a low pressure-resistant N-channel MOS transistor 333. One of the source and the drain of the transistor 333 is connected to the bus DBUS, the other of the source and the drain is connected to the bus LBUS, and a signal DSW is input to the gate of the transistor 333.

Next, the configurations of the sense amplifier unit SA and the latch circuits SDL, LDL, and UDL will be described.

The sense amplifier unit SA includes a high pressure-resistant N-channel MOS transistor 40, low pressure-resistant N-channel MOS transistors 41 to 50, a low pressure-resistant P-channel MOS transistor 51, and a capacitor element 52.

A signal BLS is input to the gate of the transistor 40, and one of the source and the drain of the transistor 40 is connected to the corresponding bit line BL. One of the source and the drain of the transistor 41 is connected to the transistor 40, the other of the source and the drain is connected to a node SCOM, and a signal BLC is input to the gate of the transistor 41. The transistor 41 clamps the corresponding bit line BL to a potential according to the signal BLC.

One of the source and the drain of the transistor 45 is connected to the node SCOM, the other of the source and the drain is connected to a node SRCGND (for example, 0 V), and the gate of the transistor 45 is connected to a node INV_S. One of the source and the drain of the transistor 42 is connected to the node SCOM, the other of the source and the drain is connected to a node SSRC, and a signal BLX is input to the gate of the transistor 42. One of the source and the drain of the transistor 51 is connected to the node SSRC, the other of the source and the drain is connected to a power source, and a voltage VDDSA is supplied from the power source. The node INV_S is connected to the gate of the transistor 51. One of the source and the drain of the transistor 43 is connected to the node SCOM, the other of the source and the drain is connected between nodes SEN, and a signal XXL is input to the gate of the transistor 43. One of the source and the drain of the transistor 44 is connected to the node SSRC, the other of the source and the drain is connected to the nodes SEN, and a signal HLL is input to the gate of the transistor 44. One electrode of the capacitor element 52 is connected to the node SEN and a clock signal CLK is input to the other electrode of the capacitor element 52. The node SEN is connected to the gate of the transistor 47 and one of the source and the drain of the transistor 47 is grounded. One of the source and the drain of the transistor 48 is connected to the transistor 47, the other of the source and the drain is connected to the bus LBUS, a signal STB is input to the gate of the transistor 48.

One of the source and the drain of the transistor 46 is connected to the node SEN, the other of the source and the drain is connected to the bus LBUS, a signal BLQ is input to the gate of the transistor 46. One of the source and the drain of the transistor 50 is grounded and the gate of the transistor 50 is connected to the bus LBUS. One of the source and the drain of the transistor 49 is connected to the transistor 50, the other of the source and the drain is connected to the node SEN, and a signal LSL is input to the gate of the transistor 49.

Next, the latch circuit SDL will be described. The latch circuit SDL includes low pressure-resistant N-channel MOS transistors 60 to 63 and low pressure-resistant P-channel MOS transistors 64 to 67.

One of the source and the drain of the transistor 60 is connected to the bus LBUS, the other of the source and the drain is connected to a node LAT_S, and a signal STL is input to the gate of the transistor 60. One of the source and the drain of the transistor 61 is connected to the bus LBUS, the other of the source and the drain is connected to the node INV_S, and a signal STI is input to the gate of the transistor 61. One of the source and the drain of the transistor 62 is connected to the node LAT_S, the other of the source and the drain is connected to the ground, and the gate of the transistor 62 is connected to the node INV_S. One of the source and the drain of the transistor 63 is connected to the node INV_S, the other of the source and the drain is connected to the ground, and the gate of the transistor 63 is connected to the node LAT_S. One of the source and the drain of the transistor 64 is connected to the node LAT_S and the gate of the transistor 64 is connected to the node INV_S. One of the source and the drain of the transistor 65 is connected to the node INV_S and the gate of the transistor 65 is connected to the node LAT_S. One of the source and the drain of the transistor 66 is connected to the transistor 64, the other of the source and the drain is connected to the power source, and the voltage VDDSA is applied from the power source. A signal SLL is input to the gate of the transistor 66. One of the source and the drain of the transistor 67 is connected to the transistor 65, the other of the source and the drain is connected to the power source, and the voltage VDDSA is applied from the power source. The signal SLI is input to the gate of the transistor 67.

In the latch circuit SDL, the transistors 62 and 64 form a first inverter, and the transistors 63 and 65 form a second inverter. An output of the first inverter and an input (the node LAT_S) of the second inverter are connected to the bus LBUS via the transistor 60 for data transmission, and an input of the first inverter and an output (the node INV_S) of the second inverter are connected to the bus LBUS via the transistor 61 for data transmission. The latch circuit SDL retains the data in the node LAT_S and retains the inverted data in the node INV_S.

Since the latch circuits LDL and UDL have the same configuration as the latch circuit SDL, the description thereof will be omitted. Reference numerals and control signal names of the transistors which are distinguished from those of the latch circuit SDL, as illustrated in FIG. 37, will be described below.

Next, the latch circuit XDL will be described. The latch circuit XDL includes low pressure-resistant N-channel MOS transistors 91 to 94 and pressure-resistant P-channel MOS transistors 95 to 98.

One of the source and the drain of the transistor 91 is connected to the signal line IO corresponding to any of the input/output signals I/O [0] to I/O [7], the other of the source and the drain is connected to the node LAT_X, and the column select line CSLi is connected to the gate of the transistor 91. One of the source and the drain of the transistor 92 is connected to the node LAT_X and the gate of the transistor 92 is connected to the node INV_X. One of the source and the drain of the transistor 93 is connected to the transistor 92, the other of the source and the drain is connected to the ground, and a signal XNL is input to the gate of the transistor 93. One of the source and the drain of the transistor 95 is connected to the node LAT_X and the node INV_X is connected to the gate of the transistor 95. One of the source and the drain of the transistor 96 is connected to the node INV_X and the node LAT_X is connected to the gate of the transistor 96. One of the source and the drain of the transistor 97 is connected to the power source, the other of the source and the drain is connected to the transistor 95, and the voltage VDDSA is supplied from the power source. A signal XLL is input to the gate of the transistor 97. One of the source and the drain of the transistor 98 is connected to the power source, the other of the source and the drain is connected to the transistor 96, and the voltage VDDSA is supplied from the power source. The signal XLI is input to the gate of the transistor 98.

For example, when the read data is transmitted from the latch circuit XDL to the signal line IO, the column decoder 114 sets the column select line CSL as the "H" level to turn on the transistor 91. Thus, the latch circuit XDL is electrically connected to the signal line IO to transmit the data.

Next, the precharge circuit 320 and a discharge circuit 322 will be described. The precharge circuit 320 precharges the bus DBUS and the discharge circuit 322 discharges the bus DBUS. The precharge circuit 320 includes, for example, a low pressure-resistant N-channel MOS transistor 321. The discharge circuit 322 includes, for example, a low pressure-resistant N-channel MOS transistor 323. The transistors 321 and 323 are connected commonly to the bus DBUS, and signals DPC and DDS are input to the gates of the transistors 321 and 323, respectively.

Next, an operation of the sense amplifier unit SAU with the above-described configuration will be described in brief. First, the time of writing the data will be described. When the data is written on the memory cell transistor MT (when charges are inject to increase the threshold), the "H" level (data "1") is stored in the node INV_S of the latch circuit SDL. As a result, the transistor 45 is considered to be turned on, and thus the bit line BL is considered to be 0 V. Conversely, when the data is not written on the memory cell transistor MT (when charges are not injected and the threshold voltage is not changed), the "L" level (data "0") is stored in the node INV_S of the latch circuit SDL. As a result, the transistor 51 is considered to be turned on and a positive voltage (for example, a voltage by which the select transistor ST1 is turned off) is given to the bit line BL.

Next, the time of reading will be described. At the time of reading, first, the node INV_S is considered to be in the "L" level and the transistor 51 is considered to be turned on. Then, the bit lines BL are precharged via the transistors 40 to 42. The transistor 44 is also considered to be turned on and the node SEN is charged.

Thereafter, the transistor 44 is considered to be turned off, the signal XXL is considered to be in the "H" level, and the transistor 43 is considered to be turned on. Then, when the corresponding memory cell transistor is turned on, the potential of the node SEN is lowered and the transistor 47 is turned off. Conversely, when the corresponding memory cell transistor is turned off, the potential of the node SEN is maintained in the "H" level. Consequently, the transistor 47 is turned on.

Then, the signal STB is considered to be in the "H" level, the transistor 48 is considered to be turned on, and the potential according to ON/OFF of the transistor 47 is read to the bus LBUS and is retained in any of the latch circuits SDL, LDL, and UDL.

4.3 Advantages of Embodiment

In the case of the configuration according to the embodiment, the same advantages as those of the first to third embodiments may be obtained.

Hereinafter, the advantages according to the embodiment will be described with reference to a specific example in FIG. 38. In the embodiment, the zones and the semiconductor pillars SP correspond to each other. In the example in FIG. 38, zone 0 corresponds to the data of the semiconductor pillar SP0, zone 1 corresponds to the data of the semiconductor pillar SP2, zone 2 corresponds to the data of the semiconductor pillar SP1, and zone 3 correspond to the data of thee semiconductor pillar SP3.

For example, when the threshold voltage of the memory cell transistors MT varies due to the lengthy data retention times or the like, the variation in the threshold voltage of the memory cell transistors MT belonging to the first semiconductor pillar group SPG1 is greater than the memory cell transistors MT belonging to the second semiconductor pillar group SPG2, and thus the failure bits at the time of normal reading easily occur. Accordingly, at the time of normal reading, many failure bits occur in the data read from zone 0 (the semiconductor pillar SP0) and zone 3 (the semiconductor pillar SP3). As a result, for example, for the data of zone 1 (the semiconductor pillar SP2) and zone 2 (the semiconductor pillar SP1), the ECC process passes in the normal reading. For the data of zone 0 and zone 3, the ECC process fails.

Thereafter, the data of zone 0 and zone 3 are read again through the shift reading when the optimum read level is set. Thus, by causing the zones to correspond to the semiconductor pillars SP, it is possible to set the optimum read level according to the threshold voltage of the memory cell transistors MT for each zone, and thus it is possible to improve the reliability of the reading operation.

5. Fifth Embodiment

Next, a semiconductor memory device and a memory system according to a fifth embodiment will be described. In the embodiment, the first to fourth embodiments are applied to a planar NAND flash memory in which the memory cell transistors MT are arranged 2-dimensionally on a semiconductor substrate. In the embodiment, a case in which the sense amplifier of the current sense scheme described in the fourth embodiment is applied will be described. Hereinafter, only differences from the first to fourth embodiments will be described.

5.1 Configuration of Memory Cell Array

Figure 39:
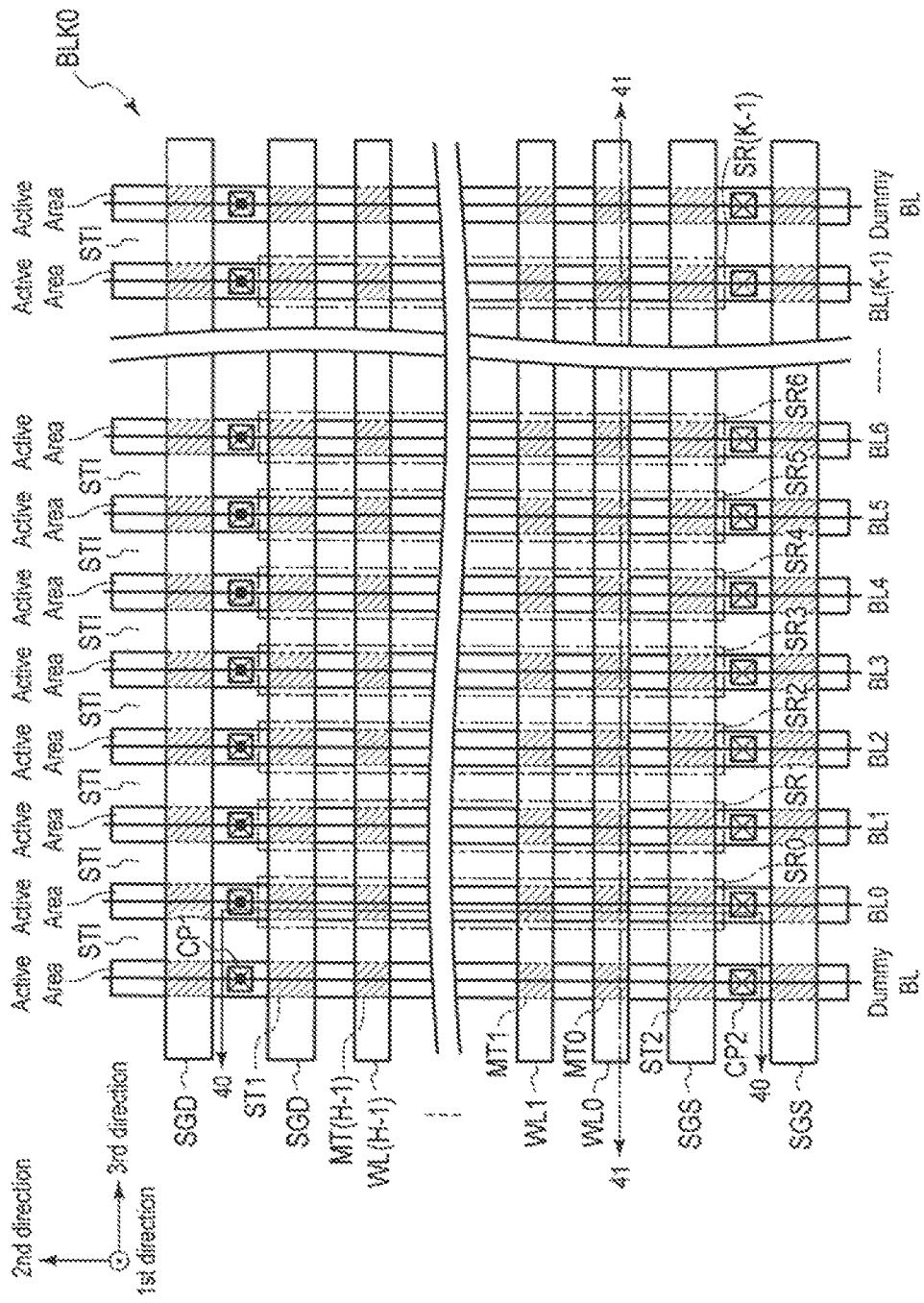
FIG. 39 is a plan view illustrating a memory cell array included in a semiconductor memory device according to a fifth embodiment.
Figure 40:
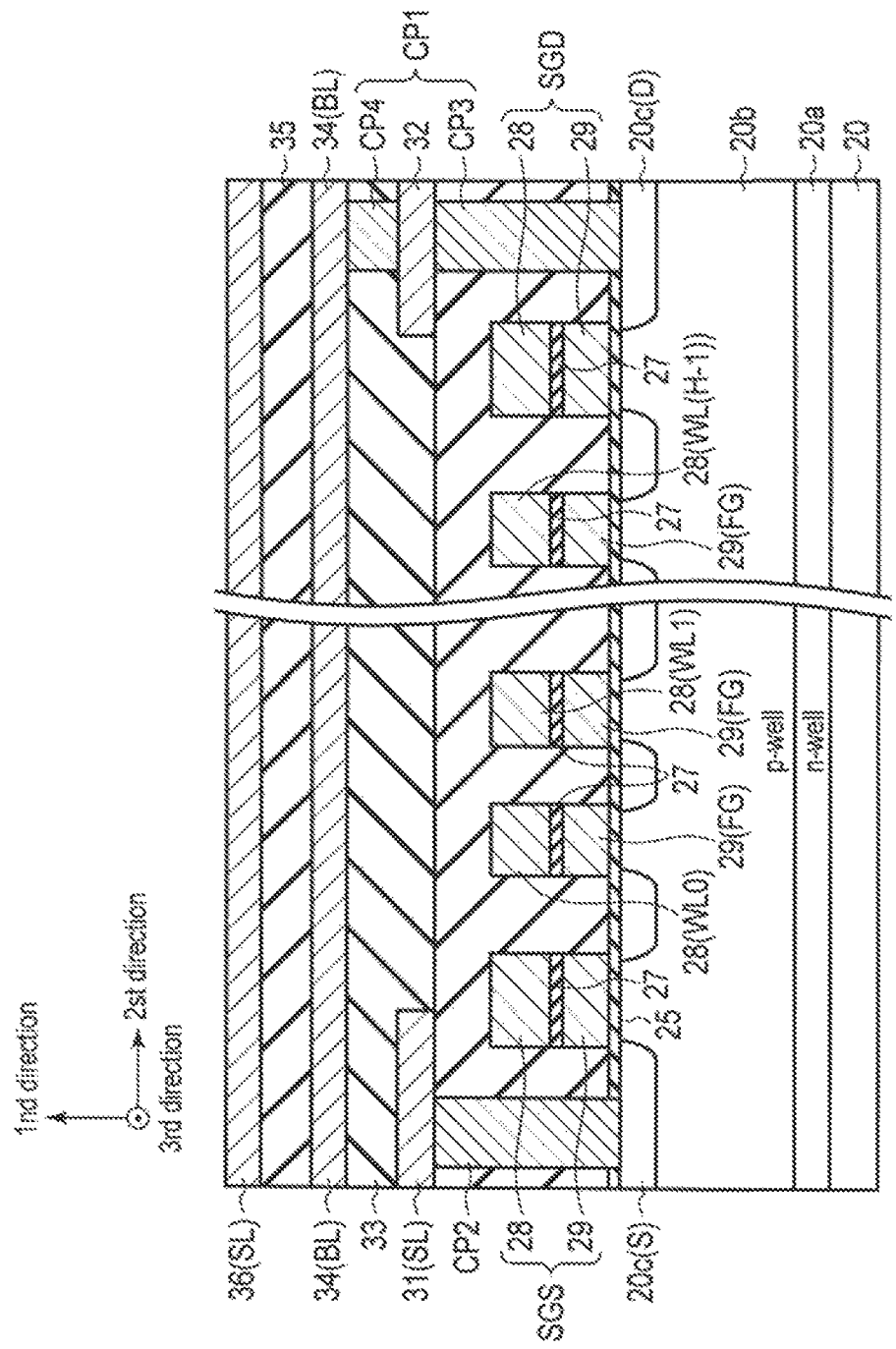
FIG. 40 is a sectional view taken along the line 40-40 of FIG. 39.

The planar configuration and the cross-sectional configuration of the memory cell array 111 according to the embodiment will be described with reference to FIGS. 39 to 41.

First, the planar configuration of the memory cell array 111 will be described with reference to FIG. 39. As illustrated in the drawing, on a plane formed in the second and third directions, a plurality of element regions (active areas) having a stripe shape in the second direction are provided in the third direction in the semiconductor substrate 20. Element isolation regions STI are formed between the mutually adjacent element regions, and thus the element regions are electrically isolated by the element isolation regions STI. On the semiconductor substrate 20, select gate lines SGD and SGS and word lines WL0 to WL (H−1) (where (H−1) is a natural number equal to or greater than 1) having a stripe shape in the third direction are formed over the plurality of element regions. The memory cell transistors MT are provided in regions in which the word lines WL and the element regions intersect each other. The select transistors ST1 and ST2 are provided in regions in which the select gate lines SGD and SGS and the element regions intersect each other, respectively. Impurity diffusion layers which are source regions or drain regions of the select transistors ST1 and ST2 and the memory cell transistors MT are formed in the element regions between the word lines, the select gate lines, and the word lines and select gate lines adjacent in the second direction.

The impurity diffusion layers formed in the element regions between the select gate lines SGD adjacent in the second direction function as the drain regions of the select transistors ST1. Further, contact plugs CP1 are formed in the drain regions. The contact plugs CP1 are connected to dummy bit lines and bit lines BL0 to BL (K−1) which are provided in the second direction and have a stripe shape. The impurity diffusion layers formed in the element regions between the select gate lines SGS adjacent in the second direction function as the source regions of the select transistors ST2. Further, contact plugs CP2 are formed in the source regions. The contact plugs CP2 are connected commonly to a source line SL (not illustrated). One element region corresponds to one NAND string SR, and the NAND strings corresponding to the bit lines BL0 to BL (K−1) are denoted by SR0 to SR (K−1). In the example of FIG. 39, the memory cell transistors MT or the like formed on the element regions at the ends of one block BLK in the third direction (the element regions on the right end and the left end of the drawing) have a dummy pattern, and the bit lines BL formed on the upper side of the memory cell transistors MT are configured as dummy wirings. However, the dummy pattern and the dummy wirings may not be provided.

Next, the cross-sectional configuration of the NAND string SR will be described. As illustrated in FIG. 40, an n type well 20a is formed in the surface region of the semiconductor substrate 20 and a p type well 20b is formed in the surface region of the n type well 20a. A gate insulation film 25 is formed on the p type well 20b, and the gate electrodes of the select transistors ST1 and ST2 and the memory cell transistors MT are formed on the gate insulation film 25. The gate electrodes of the select transistors ST1 and ST2 and the memory cell transistors MT include a polycrystalline silicon layer 29 formed on the gate insulation film 25, an inter-gate insulation film 27 formed on the polycrystalline silicon layer 29, and a polycrystalline silicon layer 28 formed on the inter-gate insulation film 27.

In the memory cell transistor MT, the polycrystalline silicon layer 29 functions as a charge accumulation layer (floating gate (FG)). The polycrystalline silicon layer 28 functions as the word line WL. In the select transistors ST1 and ST2, the polycrystalline silicon layers 29 and 28 adjacent to the word line direction are connected commonly. The polycrystalline silicon layers 29 and 28 function as the select gate lines SGS and SGD. Only the polycrystalline silicon layer 29 may function as the select gate line. In this case, the potential of the polycrystalline silicon layer 28 of the select transistors ST1 and ST2 is considered to have a constant potential or a floating state. An $n^+$ type diffusion layer $20c$ is formed in the surface of the semiconductor substrate 20 located between the gate electrodes. The $n^+$ type diffusion layer $20c$ is shared by the adjacent transistors and functions as a source (S) or a drain (D). A region between the adjacent source and drain functions as a channel region which is an electron movement region. The gate electrodes, the $n^+$ type diffusion layers $20c$, and the channel regions form the MOS transistors that are the select transistors ST1 and ST2 and the memory cell transistors MT.

On the semiconductor substrate 20, an inter-layer insulation film 30 is formed to cover the select transistors ST1 and ST2 and the memory cell transistors MT. The contact plug CP2 reaching the $n^+$ type diffusion layer (source) $20c$ of the select transistor ST2 on the source side is formed in the inter-layer insulation film 30. A metal wiring layer 31 connected to the contact plug CP2 is formed on the inter-layer insulation film 30. The metal wiring layer 31 functions as a portion of the source line SL. Further, a contact plug CP3 reaching the n⁺ type diffusion layer (drain) 20c of the select transistor ST1 on the drain side is formed in the inter-layer insulation film 30. A metal wiring layer 32 connected to the contact plug CP3 is formed on the inter-layer insulation film 30.

An inter-layer insulation film 33 which is formed to cover the metal wiring layers 31 and 32, is formed on the inter-layer insulation film 30. A contact plug CP4 reaching the metal wiring layer 32 is formed in the inter-layer insulation film 33. A metal wiring layer 34 connected commonly to the plurality of contact plugs CP4 is formed on the inter-layer insulation film 33. The metal wiring layer 34 functions as the bit line BL. The contact plugs CP3 and CP4 and the metal wiring layer 32 correspond to the contact plug CP1 in FIG. 39.

An inter-layer insulation film. 35 is formed to cover the metal wiring layer 34 is formed on the inter-layer insulation film 33. A metal wiring layer 36 covering the upper portion of the memory cell array 111 is formed on the inter-layer insulation film 35. The metal wiring layer 36 functions as the source line SL and is connected to the metal wiring layer 31 in a region (not illustrated).

Figure 41:
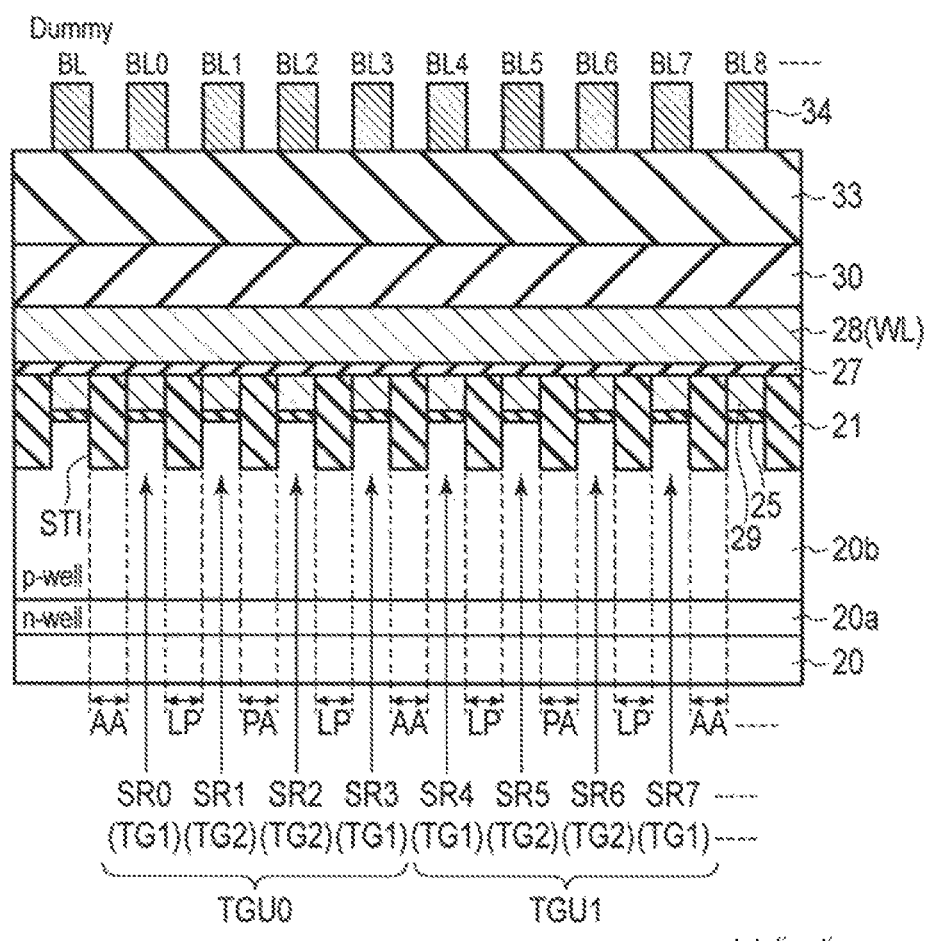
FIG. 41 is a sectional view taken along the line 41-41 of FIG. 39.

As illustrated in FIG. 41, the element isolation regions STI etched up to the semiconductor substrate are formed between the memory cell transistors MT and the peripheral regions so that the polycrystalline silicon layer 29 and the gate insulation film 25 forming the memory cell transistors MT are isolated, and thus the insulation film 21 is embedded. The inter-gate insulation film 27 is formed to conceal the insulation film 21 and the polycrystalline silicon layer 29, and the word lines WL are formed on the upper surface of the inter-gate insulation film 27 by the polycrystalline silicon layer 28. The same number of bit lines BL are formed on the upper surface of the inter-layer insulation film 33 to correspond to the NAND string SR.

In the example of FIG. 41, the element isolation regions STI with three sizes of widths AA, LP, and PA in the third direction are formed due to a variation in etching when grooves are formed in the semiconductor substrate. For example, the element isolation regions STI with the three sizes are arranged so that the widths of the element isolation regions STI in the third direction are repeated at a cycle of the order of AA, LP, PA, and LP.

The memory cell transistors MT of the NAND string SR formed on the element regions interposed between the element isolation regions STI with the widths AA and LP are classified to a transistor group TG1. The memory cell transistors MT of the NAND string SR formed on the element regions interposed between the element isolation regions STI with the widths LP and PA is classified to a transistor group TG2.

When the widths of the element isolation regions STI vary, the gate widths of the memory cell transistors MT formed in the element regions also vary. Accordingly, when W1 is assumed to be the gate width of the memory cell transistor MT belong to the transistor group TG1 and W2 is assumed to be the gate width of the memory cell transistor MT belonging to the transistor group TG2, the gate widths W1 and W2 are different. Specifically, when the widths of the element isolation regions STI have a relation of "AA>LP>PA," the gate widths of the memory cell transistors MT have a relation of "W1<W2."

The memory cell transistors MT are arranged repeatedly when the transistor groups TG1, TG2, TG2, and TG1 in the third direction are set as one unit (hereinafter referred to as a "transistor unit TGU"). Accordingly, one transistor unit TGU corresponds to four NAND strings SR (memory cell transistors MT).

For example, the memory cell transistors MT of the NAND string SR0 and SR3 belong to the transistor group TG1, and the memory cell transistors MT of the NAND string SR1 and SR2 belong to the transistor group TG2. The memory cell transistors MT of the NAND strings SR0 to SR3 belong to the transistor unit TGUO.

5.2 Configuration of Column System Circuit

The connection between the sense amplifier 113 and the column decoder 114 forming the column system circuit according to the embodiment will be described.

Figure 35:
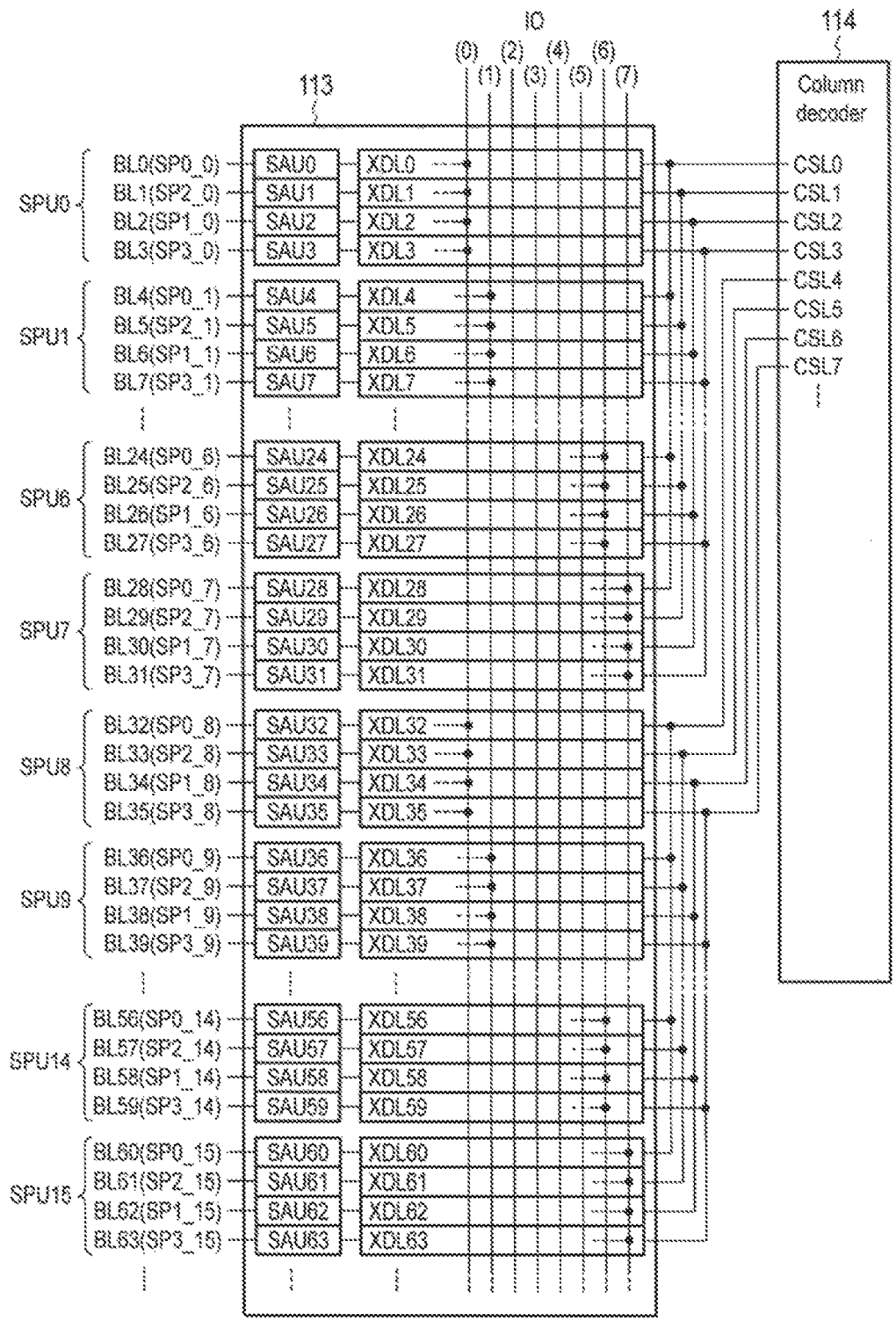
FIG. 35 is a block diagram illustrating connection between a column decoder and a sense amplifier included in the semiconductor memory device according to the fourth embodiment.

The connection between the sense amplifier 113 and the column decoder 114 according to the embodiment is the same as that of FIG. 35 since four latch circuits XDL correspond to one transistor unit TGU. However, in the embodiment, the transistor unit TGU corresponds to the semiconductor pillar unit SPU in FIG. 35. The transistor group TG1 corresponds to the semiconductor pillars SP0 and SP3 and the transistor group TG2 corresponds to the semiconductor pillars SP2 and SP1. Accordingly, the numerals of eight latch circuit XDL corresponding to the column select lines CSL may be denoted by XDL(32n+4x+D) when the numerals of the connected signal lines IO are IO(x) (where x is a natural number of 0 to 7).

D=0 or D=3: the transistor group TG0
D=1 or D=2: the transistor group TG1

5.3 Advantages of Embodiment

In the case of the configuration according to the embodiment, the same advantages as those of the first to fourth embodiments may be obtained. Hereinafter, the advantages of the embodiment will be described.

In the case of the NAND flash memory in which the memory cell transistors MT are arranged 2-dimensionally on the semiconductor substrate, the sizes of the memory cell transistors MT vary during patterning. For example, as described with reference to FIG. 41, the gate widths of the memory cell transistors MT are different periodically in some cases. When the gate widths of the memory cell transistors MT are different, the optimum read level is different during the reading of the data in some cases. That is, between the transistor groups TG1 and TG2, the variation amount of the threshold voltage at the time of writing or the variation amount of the threshold voltage at the time of the long-time data retention is different in some cases. More specifically, in the transistor unit TGUO, the optimum read level of the memory cell transistors MT of the NAND strings SR0 and SR3 belonging to the transistor group TG1 is different from the optimum read level of the memory cell transistors MT of the NAND strings SR1 and SR2 belonging to the transistor group TG2.

Accordingly, in the embodiment, the zones and the transistor groups TG match each other, as in the first to fourth embodiments. That is, by allocating the data of the transistor group TG in which a failure easily occurs to specific zones, the number of failure bits in the other zones is reduced. More specifically, for example, the data of the transistor group TG1 belongs to zone 0 and zone 3. The data of the transistor group TG2 belongs to zone 1 and zone 2. Thus, the data may be read at the optimum read level for each zone. Accordingly, it is possible to obtain the same advantages as the first to fourth embodiments.

6. Sixth Embodiment

Next, a semiconductor memory device and a memory system according to a sixth embodiment will be described.

In the sixth embodiment, a verify level and a read level different for each zone are set when data is written and read. Hereinafter, a case in which this example is applied to the first embodiment will be exemplified, but this example may be applied to the second to fifth embodiments. Hereinafter, only differences from the first to fifth embodiments will be described.

6.1 Data Writing Operation

Figure 42:
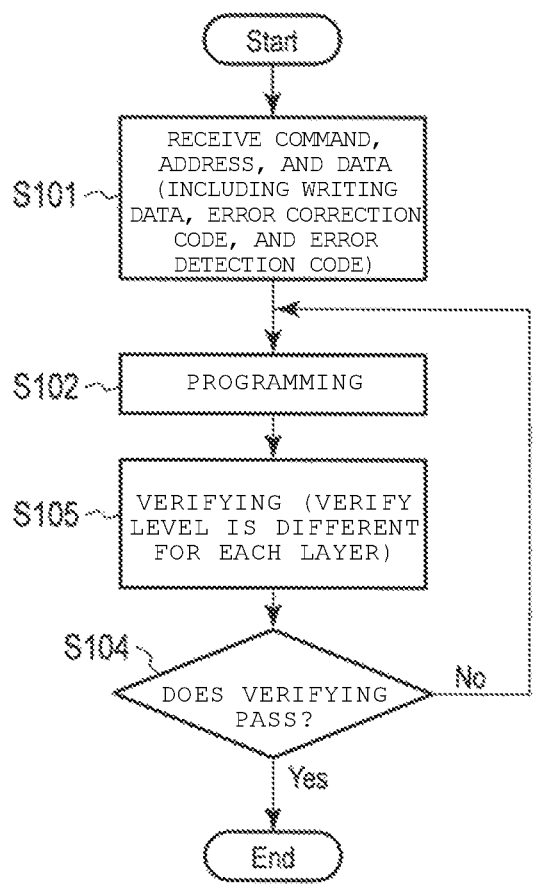
FIG. 42 is a flowchart illustrating an operation of a NAND flash memory at the time of writing data in a semiconductor memory device according to a sixth embodiment.

First, a flow of a data writing operation in the NAND flash memory 100 according to the embodiment will be described with reference to FIG. 42.

As illustrated in the drawing, for example, the sequencer 121 receives a writing command, a page address, and writing data (including an error correction code and an error detection code) from the controller 200 (step S101). The column decoder 114 selects the column select line CSL in response to an instruction from the sequencer 121 and retains the writing data in the latch circuit of each sense amplifier unit SAU of the sense amplifier 113.

Next, the sequencer 121 writes the data retained in the latch circuit of the sense amplifier unit SAU on the memory cell transistors MT corresponding to the received page address (step S102). In the following description, an operation of injecting charges to the charge accumulation layer 26 in a writing operation and changing the threshold voltage of the memory cell transistors MT is referred to as "programming."

Next, the sequencer 121 sets a different verify level for each layer and performs verifying (step S103). The verifying refers to a process of determining whether a target threshold voltage is reached by comparing the threshold voltage of the memory cell transistor MT after the programming against the verify level. Hereinafter, a series of processes including the programming and the verifying is referred to as a "programming loop." The verify level is a voltage corresponding to a target threshold voltage level. For example, when the verify level in the writing of the "A" level is AV, a relation of "AV>VA" is satisfied. The sequencer 121 repeats the processes of step S102 to step S103 until the verifying passes or the number of times the programming loop is repeated reaches a preset upper limit number.

When the verifying passes (Yes in step S104), the writing of the data ends.

Figure 43:
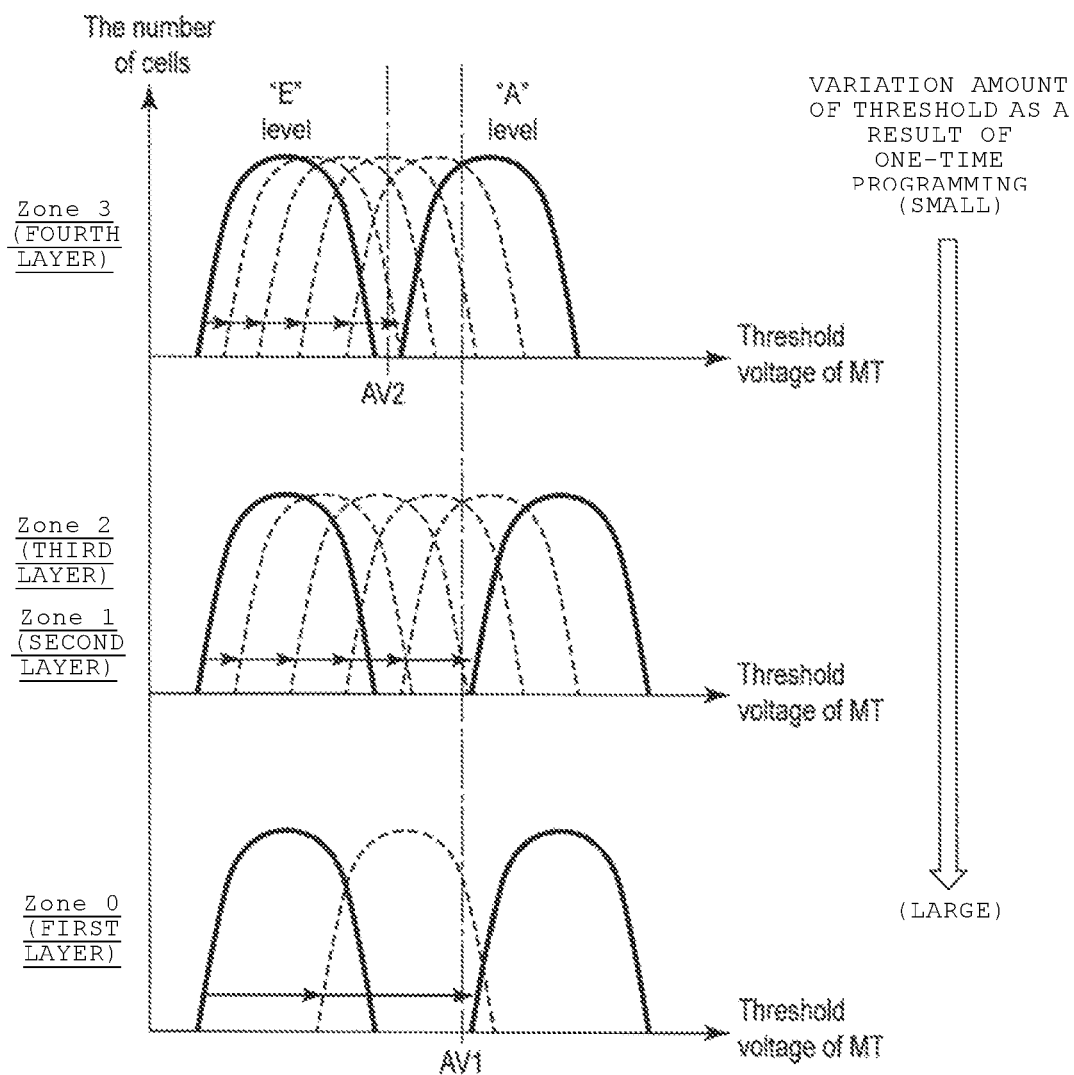
FIG. 43 is a diagram illustrating a variation in the threshold voltage distribution and a verify level for each layer at the time of writing data in the semiconductor memory device according to the sixth embodiment.

As a specific example of the embodiment, FIG. 43 shows the verify level of each layer when the data of the "A" level is written in the memory cell transistors MT. In this example, a case in which the writing in the fourth layer is the performed the slowest (the variation amount of the threshold voltage by one-time programming is small) and the writing in the first layer is performed the fastest (the variation amount of the threshold voltage by one-time programming is large) will be described as in the first embodiment. In the example of FIG. 43, the verify level of the fourth layer in which the variation amount of the threshold voltage is the smallest is assumed to be AV2 and the verify level of the first to third layers is assumed to AV1 (where AV1>AV2).

As illustrated in the drawing, the variation amount of the threshold voltage of the memory cell transistors MT by one-time programming is larger for the memory cell transistors MT of the first layer and is smaller for the memory cell transistors MT of the fourth layer. Accordingly, in the example of FIG. 43, the writing on the memory cell transistors MT of the first layer ends when the programming loop is executed three times, whereas the writing on the memory cell transistors MT of the second and third layers ends when the programming loop is executed six times.

The variation amount of the threshold voltage of the memory cell transistor MT of the fourth layer is the smallest compared to the memory cell transistors MT of the other layers. However, since the verify level AV2 is smaller than the verify level AV1, the writing on the memory cell transistors MT of the fourth layer ends when the programming loop is executed six times.

Even when the data of the "B" level and the "C" level is written, different verify levels are similarly set according to the layers.

In FIG. 43, the case is depicted in which the verify level of the memory cell transistors MT of the second and third layers is AV1 which is the same as the memory cell transistors MT of the first layer. However, the voltage value between AV1 and AV2 may be set or AV2 may be used. Further, different verify levels may be set for the second and third layers.

Figure 44:
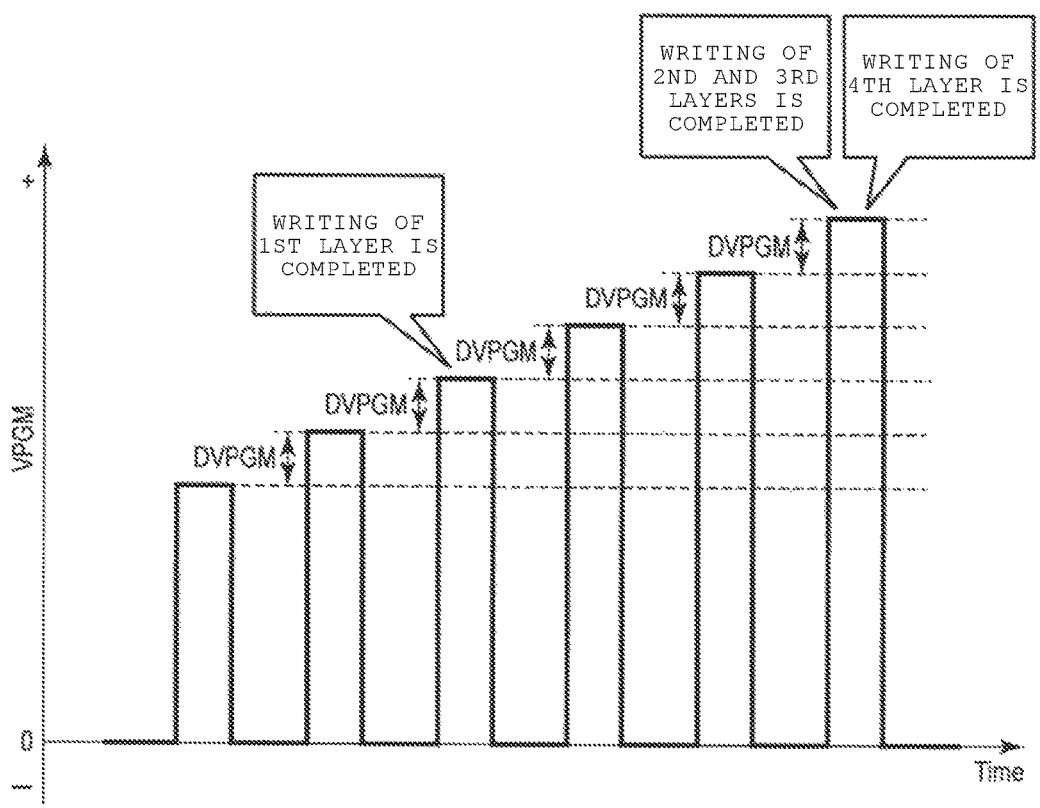
FIG. 44 is a timing diagram illustrating potentials of the selected word line at the time of writing data in the semiconductor memory device according to the sixth embodiment.

Next, a relation between VPGM and the number of programming loops described with reference to FIG. 43 will be described with reference to FIG. 44. As illustrated in the drawing, for VPGM according to the embodiment, the voltage value is stepped up by a step-up width DVPGM whenever the programming loop is repeated.

When the number of programming loops of the first layer and the second and third layers in which the same verify level AV1 is set are compared, the number of programming loops is increased since the writing of the second and third layers is slower (the variation in the threshold voltage of the memory cell transistors MT by one-time programming is small). On the other hand, since the verify level AV2 smaller than AV1 is set in the fourth layer in which the writing is the slowest, the number of writings does not increase in correspondence to the variation amount of the threshold voltage by the one-time programming and the writing is completed at six times as in the second and third layers.

6.2 Data Reading Operation

Figure 45:
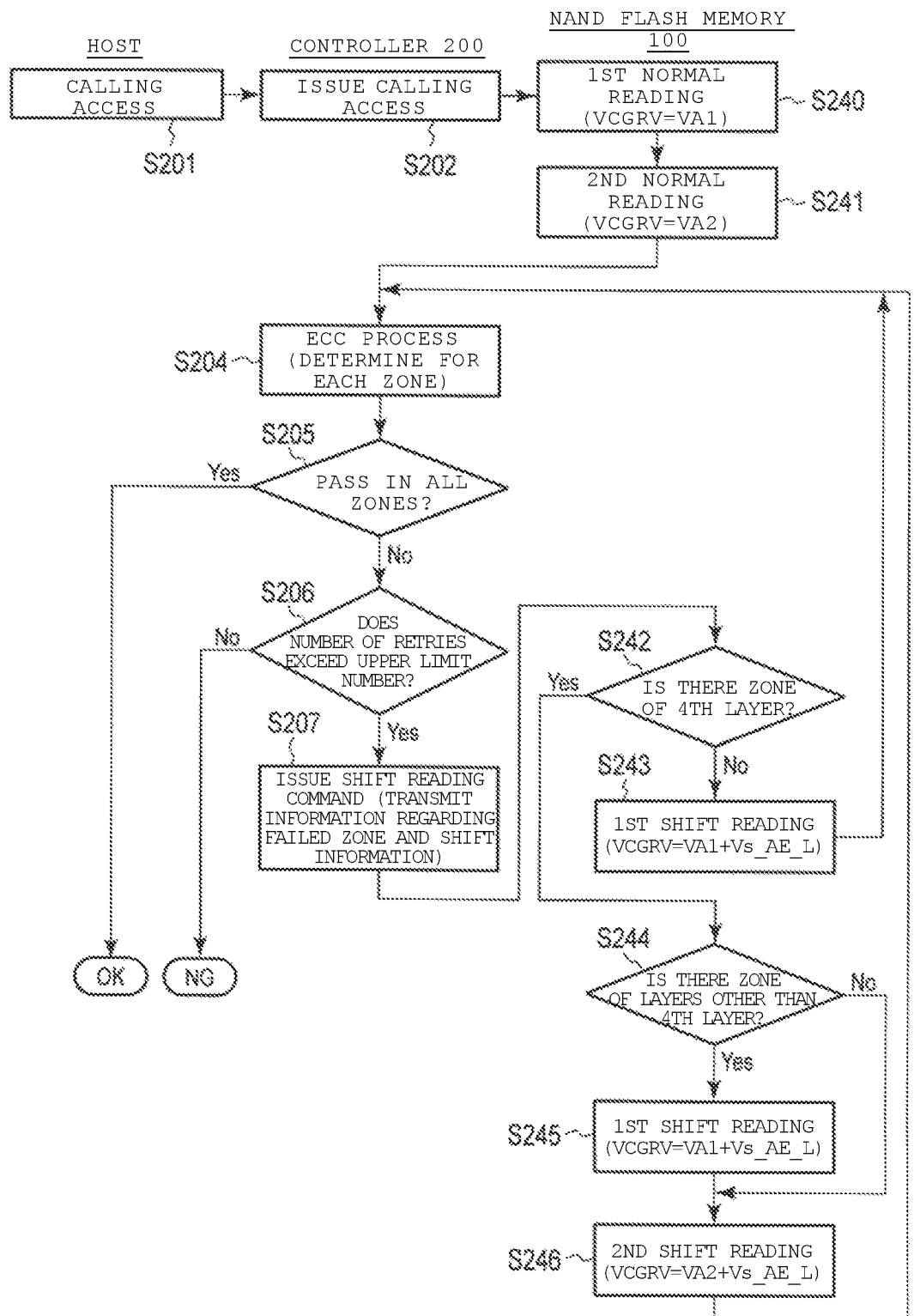
FIG. 45 is a flowchart illustrating an operation of a controller and the NAND flash memory at the time of reading data in a memory system according to the sixth embodiment.

Next, a data reading operation according to the embodiment will be described with reference to FIG. 45. In this example, a case will be described in which the read level of the fourth layer is set as VA2 and the read level of the first to third layers is set as VA1 at the time of normal reading during the reading of the data of the "A" level in the even bit line BLe. Hereinafter, the normal reading using the read level VA1 is defined as "first normal reading" and the normal reading using the read level VA2 is defined as "second normal reading." Hereinafter, only differences from FIG. 24 will be described.

As illustrated in the drawing, when the controller 200 issues a reading command in step S202, the sequencer 121 of the NAND flash memory 100 first performs the first normal reading (step S240), and then performs the second normal reading (step S241). Thereafter, the sequencer 121 transmits the data corresponding to the read level VA1, that is, the data of zone 0 (the first layer), zone 1 (the second layer), and zone 2 (the third layer), and the data corresponding to the read level VA2, that is, the data of zone 3 (the fourth layer), to the controller 200.

Subsequently, the controller 200 performs the ECC process, as described with reference to FIG. 24 (step S204). When there are the failed zones, the CPU 230 issues a shift reading command (step S207).

The sequencer 121 receiving the shift reading command performs the shift reading. At this time, the sequencer 121 performs the first shift reading of shifting the read level VA1 and reading the data and performs the second shift reading of shifting the read level VA2 and reading the data according to the failed zones.

More specifically, when the failed zones do not include zone 3 (the fourth layer) (No in step S242), that is, the zone corresponding to the read level VA2 is not included, the sequencer 121 performs the first shift reading (step S243). Thereafter, the sequencer 121 transmits the shift reading result of the zones failed in the ECC process of the previous time to the controller 200.

When the failed zones include zone 3 and other zones (Yes in step S244), that is, both of the zones corresponding to the read levels VA1 and VA2 are present, the sequencer 121 performs the first shift reading (step S245) and performs the second shift reading (step S246). Thereafter, the sequencer 121 transmits the shift reading result of the zones failed in the ECC process of the previous time to the controller 200.

When the failed zone is only zone 3 (No in step S244), that is, the zone corresponding to the read level VA1 is not included, the sequencer 121 does not perform the first shift reading and performs the second shift reading (step S246). Thereafter, the sequencer 121 transmits the re-read data of zone 3 to the controller 200.

Next, the process returns to step S204 and the ECC circuit 260 performs the ECC process on the received data. The shift reading operation is repeatedly performed until the ECC process passes in all the zones or until the number of retries reaches the set upper limit number.

In the shift table of FIG. 20, as the shift amount of the "A" level in the even bit line BLe, for example, one value (for example, Vs_AE_L in the number of retires L) is set according to the number of retries, but anther shift amount may be set for each read level. For example, a shift amount Vs_A1E_L is set for VA1 described with reference to FIG. 50 and a shift amount Vs_A2E_L is set for VA2.

Even when the data of the "B" level and the "C" level is read, another VCGRV is set similarly according to the layer.

The above-described specific example will be described with reference to FIG. 46. As illustrated in the drawing, in the first normal reading, the data read using the read level VA1 is retained in a dynamic data cache 433-1 (DDC1 of FIG. 46) of each sense amplifier unit SAU. Subsequently, in the second normal reading, the sequencer 121 retains the data read using the read level VA2 in a dynamic data cache 433-2 (DDC2 of FIG. 46).

Figure 46:
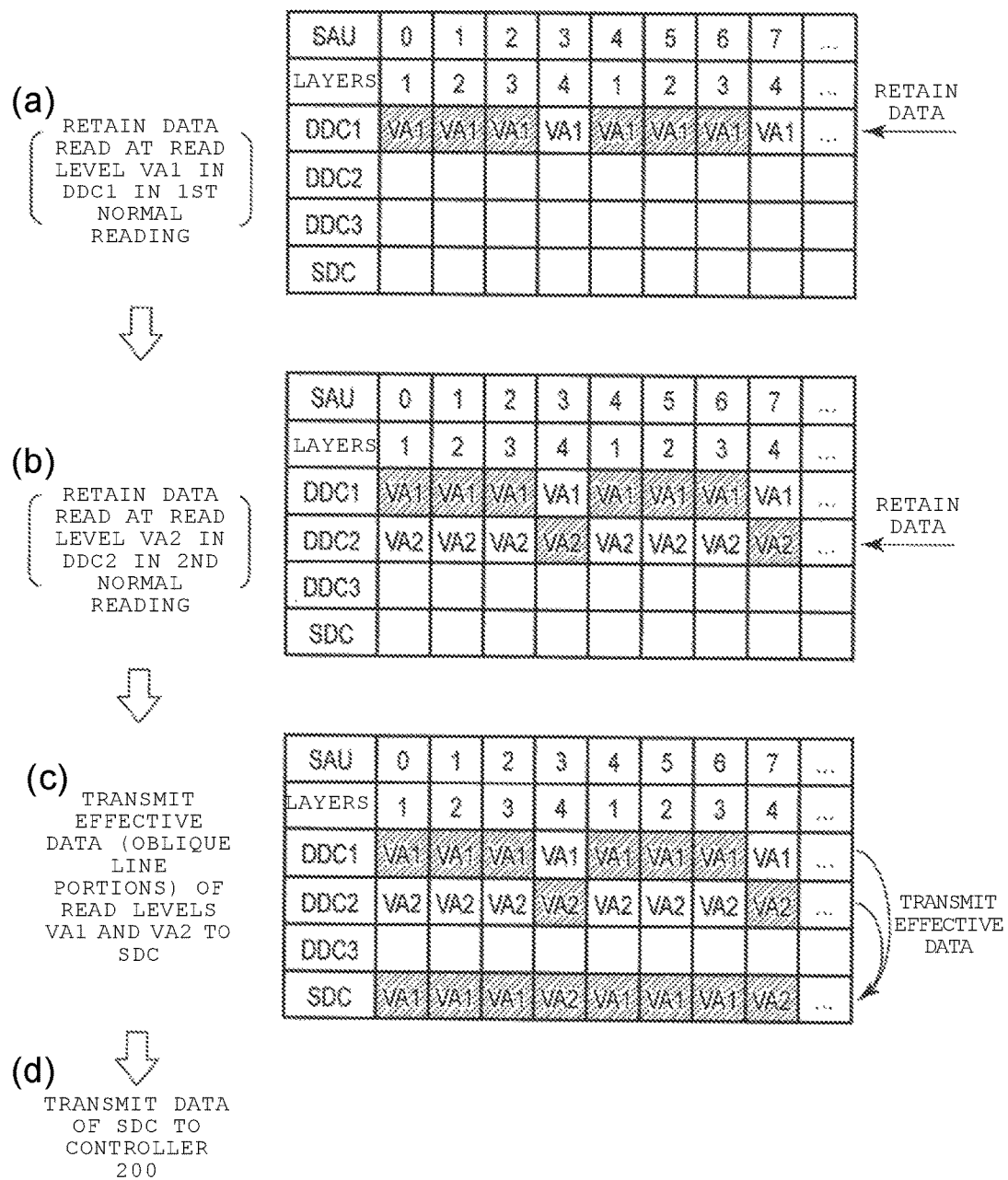
FIG. 46 is a diagram illustrating data retention in a sense amplifier unit at the time of reading data in the semiconductor memory device according to the sixth embodiment.

The sequencer 121 transmits effective data indicated by the shaded portions among the data retained in the dynamic data caches 433-1 and 433-2 to the secondary data cache 431 (SDC of FIG. 46). The effective data refers to data read at the read level appropriate according to the layer. In the example of FIG. 46, since the sense amplifier units SAU0 to SAU2 and SAU4 to SAU6 correspond to the first to third layers, the data read at the read level VA1 is the effective data in these sense amplifier units SAU. On the other hand, since the sense amplifier units SAU3 and SAU7 correspond to the fourth layer, the data read at the read level VA2 are the effective data in these sense amplifier units SAU.

Then, the sequencer 121 transmits the data retained in the secondary data cache 431 to the controller 200. In this example, the sequencer 121 ends the first normal reading and the second normal reading, and then transmits the data to the controller 200. However, after the first normal reading ends, the effective data corresponding to the read level VA1 may be transmitted. After the second normal reading ends, the effective data corresponding to the read level VA2 may also be transmitted. Further, the order of the first normal reading and the second normal reading may be changed.

6.3 Advantages of Embodiment

In the case of the configuration according to the embodiment, the same advantages as those of the above-described first to fifth embodiments may be obtained.

In the configuration according to the embodiment, a different verify level is set for each layer during the writing of the data. Thus, it is possible to reduce the number of programming loops even in the layer having the memory cell transistors MT in which the variation amount of the threshold voltage by the programming of one time is small. Accordingly, it is possible to improve the data writing speed.

During the reading of the data, a different read level is set for each layer. Thus, since the optimum read level is set for each layer and the data is read, it is possible to reduce the number of retries of the shift reading. Accordingly, it is possible to improve the data reading speed.

When the shift reading is performed, it is not necessary to read the data of the layer in which the ECC process passes, and the read level corresponding to the layer in which the ECC process fails is shifted and the data is read. Thus, it is possible to reduce the number of times the data is read in the shift reading of one time. Accordingly, it is possible to improve the processing speed of the reading operation at the time of shift reading.

When the embodiment is applied to the 3-dimensional stacked NAND flash memory described in the fourth embodiment, the semiconductor pillar SP different for each zone may correspond. For example, the verify level of the first semiconductor pillar group SPG1 in which the gate size is small may be set as AV1, the read level may be set as VA1 (where VA1<AV1), the verify level of the second semiconductor pillar group SPG2 in which the gate size is large may be set as AV2 (where AV2<AV1), and the read level may be set as VA2 (where VA2<AV2).

When the embodiment is applied to the planar NAND flash memory described in the fifth embodiment, the embodiment may be applied by causing the transistor groups TG1 and TG2 to correspond for each zone and, for example, by setting the verify level of the transistor group TG1 in which the gate size is small as AV1, setting the read level to VA1, setting the verify level of the transistor group TG2 in which the gate size is large as AV2, and setting the read level as VA2.

7. Modification Examples

The semiconductor memory device according to the above-described embodiments includes the first to third memory cell transistors MT (for example, MT0 of the NAND strings SR1 and MT0 of NAND strings SR2 in the string group GR0-0 of the memory unit MU0 in FIG. 4 and MT0 of the NAND string SR1 in the string group GR0-1 of the memory unit MU1 (not illustrated)), the first to third bit lines BL (for example, BL1, BL2, and BL9 in FIG. 10), the first word line WL (for example, WL0 in FIG. 4), the first to third sense amplifier units SAU (for example, SAU0, SAU1, and SAU4 in FIG. 10), and the first and second signals IO(for example, IO(0) and IO(1) in FIG. 10). The first and second memory cell transistors are arranged to be mutually adjacent above the semiconductor substrate. The third memory cell transistor is provided above the semiconductor substrate. The first to third memory cell transistors are connected to the first to third bit lines, respectively, and are connected commonly to the first word line. The first to third bit lines are connected to the first to third sense amplifier units, respectively. The first and second sense amplifier units are connected commonly to the first signal line through which data is input from and output to the outside. The third sense amplifier unit is connected to the second signal line through the data is input from and output to the outside. The first and second sense amplifier units perform the inputting and outputting of the data at different cycles using the first signal line. The third sense amplifier unit performs the inputting and outputting of the data at the same cycle as the first sense amplifier unit using the second signal line.

In the above-described embodiments, it is possible to provide the memory system and the semiconductor memory device improving the reliability of the reading operation.

Embodiments of the disclosure are not limited to the above-described embodiments, but may be modified in various ways. The embodiments may be appropriately combined or may be realized solely. For example, the sense amplifier of the current sense scheme illustrated in FIG. 37 may be used in, for example, the first to third and sixth embodiments. For example, the sense amplifier of the voltage sense scheme described in FIG. 12 may be used in the fourth and fifth embodiments. Further, in the third embodiment, the data of all the zones in which the ECC process is performed and the determination result of the ECC process are transmitted to the buffer memory 240. Alternatively, the data of the zones in which the ECC process passes and the determination result of the ECC process may be transmitted to the buffer memory 240. Further, in the fourth embodiment, the semiconductor pillars SP are arranged in the staggered array of four lines. However, the semiconductor pillars may be arrayed in three or less lines or five or more lines, or may not be arranged in the staggered array.

The above-described embodiments are not limited to the NAND flash memory, but may also be applied to semiconductor memory devices using other memory elements. For example, it is preferable to apply the above-described embodiments to semiconductor memories in which a failure occurs periodically. Of course, the embodiments may be applied to various memory devices without limiting to the semiconductor memories. The flowcharts described in the above-described embodiments may be changed appropriately as much as possible. For example, the order of the first normal reading and the second normal reading may be changed in FIG. 45. The "connection" in the above-described embodiments also includes states in which elements are connected indirectly via another element such as a transistor or a resistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The followings may be achieved in each embodiment of the disclosure.

1) In the reading operation, the voltage applied to the word lines selected in the reading operation of the A level is set between, for example, 0 V and 0.55 V. The disclosure is not limited thereto, but the voltage may be set between any of 0.1 V and 0.24 V, 0.21 V and 0.31 V, 0.31 V and 0.4 V, 0.4 V and 0.5 V, and 0.5 V and 0.55 V.

The voltage applied to the word lines selected in the reading operation of the B level is set between, for example, 1.5 V and 2.3 V. The disclosure is not limited thereto, but the voltage may be set between any of 1.65 V and 1.8 V, 1.8 V and 1.95 V, 1.95 V and 2.1 V, and 2.1 V and 2.3 V.

The voltage applied to the word lines selected in the reading operation of the C level is set between, for example, 3.0 V and 4.0 V. The disclosure is not limited thereto, but the voltage may be set between any of 3.0 V and 3.2 V, 3.2 V and 3.4 V, 3.4 V and 3.5 V, 3.5 V and 3.6 V, and 3.6 V and 4.0 V.

A time (tR) of the reading operation may be set between, for example, 25 µs and 38 µs, 38 µs and 70 µs, or 70 µs and 80 µs.

2) The writing operation includes the programming operation and the verification operation described above. In the writing operation, the voltage first applied to the word lines selected at the time of the programming operation is set between, for example, 13.7 V and 14.3 V. The disclosure is not limited thereto. For example, the voltage may be set between any of 13.7 V and 14.0 V and 14.0 V and 14.6 V.

The voltage first applied to the selected word lines at the time of writing on the odd word lines and the voltage first applied to the selected word lines at the time of writing on the even word lines may be changed.

When the programming operation is performed in an incremental step pulse program (ISPP) scheme, for example, about 0.5 V may be used as the step-up voltage.

The voltage applied to the non-selected word lines may be set between, for example, 6.0 V and 7.3 V. The disclosure is not limited thereto. For example, the voltage may be set between 7.3 V and 8.4 V or may be equal to or less than 6.0 V.

A pass voltage to be applied may be changed depending on whether the non-selected word lines are the odd word lines or the even word lines.

A time (tProg) of the writing operation may be set between, for example, 1,700 µs to 1,800 µs, 1,800 µs to 1,900 µs, or 1,900 µs to 2,000 µs.

3) In the erasing operation, a voltage first applied to the well which is formed above the semiconductor substrate and in which the memory cell is arranged above is set between, for example, 12 V and 13.6 V. The disclosure is not limited thereto. The voltage may be set between, for example, 13.6 V and 14.8 V, 14.8 V and 19.0 V, 19.0 V and 19.8 V, or 19.8 V and 21 V. A time (tErase) of the erasing operation may be set between, for example, 3,000 µs to 4,000 µs, 4,000 µs to 5,000 µs, or 5,000 µs to 9,000 µs.

4) The structure of the memory cell includes the charge accumulation layer arranged via the tunnel insulation film with a film thickness of 4 nm to 10 nm on the semiconductor substrate (silicon substrate). The charge accumulation layer may have a stack structure of an insulation film such as SiN or SiON with a film thickness of 2 nm to 3 nm and a polysilicon with a film thickness of 3 nm to 8 nm. Further, a metal such as Ru may be added to the polysilicon. The structure of the memory cell includes an insulation film on the charge accumulation layer. This insulation film includes, for example, a silicon oxide film with a film thickness of 4 nm to 10 nm interposed a lower-layer High-k film with a film thickness of 3 nm to 10 nm and an upper-layer High-k film with a film thickness of 3 nm to 10 nm. HfO may be exemplified as the High-k film. The film thickness of the silicon oxide film may be set to be thicker than the film thickness of the High-k film. A control electrode with a film thickness of 30 nm to 70 nm is formed on the insulation film with an adjustment material with a film thickness of 3 nm to 10 nm interposed therebetween. Here, the work function adjustment material is a metal oxide film such as TaO or a metal nitride film such as TaN. W or the like may be used for the control electrode.

An air gap may be formed between the memory cells.

What is claimed is:

1. A semiconductor memory device comprising:
   a first stack of memory cells above a substrate, the first stack including a first memory cell and a second memory cell above the first memory cell;
   a second stack of memory cells above the substrate, the second stack including a third memory cell;
   a word line connected to the first, second, and third memory cells; and
   a controller configured to output data stored in the first memory cell and data stored in the third memory cell during a first cycle, and output data stored in the second memory cell during a second cycle that is different from the first cycle.

2. The device according to claim 1, wherein the second stack further includes a fourth memory cell stacked above the third memory cell, and the controller is configured to output data stored in the fourth memory cell during the second cycle.

3. The device according to claim 2, wherein gate lengths of the first and third memory cells are substantially equal and smaller than gate lengths of the second and fourth memory cells, which are substantially equal.

4. The device according to claim 2, wherein the data stored in the first, second, and third memory cells are output in connection with a single read operation, and the first cycle is after the second cycle.

5. The device according to claim 1, wherein during the first cycle a first voltage is applied to the word line, and during the second cycle a second voltage higher than the first voltage is applied to the word line.

6. The device according to claim 1, wherein the controller is configured to execute a programming operation that includes a program verify operation, on the first, second, and third memory cells, the program verify operation employing a first verify voltage for the first and third memory cells and a second verify voltage for the second memory cell.

7. The device according to claim 6, wherein the controller repeats the programming operation with an increased programming voltage if the program verify operation fails, wherein the programming voltage is increased by a first step for the first and third memory cells and by a second step for the second memory cell, the second step being smaller than the first step.

8. The device according to claim 1, wherein the controller is configured to execute a reading operation on the first, second, and third memory cells, and the reading operation includes the first and second cycles.

9. The device according to claim 1, wherein the controller is configured to execute a reading operation on the first, second, and third memory cells and a re-reading operation on the first, second, and third memory cells, if the reading operation fails, the second cycle being part of the reading operation and the first cycle being part of the re-reading operation.

10. The device according to claim 9, wherein during the re-reading operation, a voltage applied to the word line is lowered relative to that applied during the reading operation.

11. A method of executing a read operation in a semiconductor memory device having a first stack of memory cells above a substrate, the first stack including a first memory cell and a second memory cell above the first memory cell, a second stack of memory cells above the substrate, the second stack including a third memory cell, and a word line connected to the first, second, and third memory cells, said method comprising:
    reading first data stored in the first memory cell and third data stored in the third memory cell and outputting the first data and the third data during a first cycle; and
    reading second data stored in the second memory cell and outputting the second data during a second cycle that is different from the first cycle.

12. The method according to claim 11, wherein the second stack further includes a fourth memory cell stacked above the third memory cell, and data stored in the fourth memory cell is read and output during the second cycle along with the second data.

13. The method according to claim 12, wherein gate lengths of the first and third memory cells are substantially equal and smaller than gate lengths of the second and fourth memory cells, which are substantially equal.

14. The method according to claim 11, wherein the first data and the second data are read and output in connection with a single read operation, and the first cycle is after the second cycle.

15. The method according to claim 11, wherein during the reading of the first data, a first voltage is applied to the word line, and during reading of the second data, a second voltage higher than the first voltage is applied to the word line.

* * * * *